(12) United States Patent
Makita

(10) Patent No.: US 7,612,375 B2
(45) Date of Patent: Nov. 3, 2009

(54) SEMICONDUCTOR DEVICE AND METHOD FOR FABRICATING THE SAME

(75) Inventor: Naoki Makita, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 89 days.

(21) Appl. No.: 10/421,841

(22) Filed: Apr. 24, 2003

(65) Prior Publication Data
US 2003/0201442 A1 Oct. 30, 2003

(30) Foreign Application Priority Data
Apr. 24, 2002 (JP) ............................. 2002-121757

(51) Int. Cl.
*H01L 29/04* (2006.01)
*H01L 29/76* (2006.01)

(52) U.S. Cl. .................... 257/61; 257/57; 257/59; 257/66; 257/67; 257/72

(58) Field of Classification Search ............ 257/55–61, 257/66–72, 347–354, 368, 369, 52, 75; 438/473, 438/166, 152
See application file for complete search history.

(56) References Cited

U.S. PATENT DOCUMENTS

| | | | | |
|---|---|---|---|---|
| 4,959,700 | A * | 9/1990 | Yamazaki | ................. 257/61 |
| 5,753,560 | A * | 5/1998 | Hong et al. | ................. 438/402 |
| 5,821,559 | A * | 10/1998 | Yamazaki et al. | ............. 257/57 |
| 6,156,628 | A | 12/2000 | Ohnuma et al. | |
| 6,251,712 | B1 * | 6/2001 | Tanaka et al. | ............... 438/143 |
| 6,426,276 | B1 | 7/2002 | Ohnuma et al. | |
| 6,465,288 | B1 | 10/2002 | Ohnuma | |
| 6,680,485 | B1 * | 1/2004 | Carey et al. | ................. 257/57 |
| 6,713,819 | B1 * | 3/2004 | En et al. | ..................... 257/369 |
| 7,049,183 | B2 * | 5/2006 | Makita et al. | ............... 438/149 |
| 7,148,093 | B2 * | 12/2006 | Makita | ..................... 438/166 |

| | | | | |
|---|---|---|---|---|
| 2002/0149017 | A1 * | 10/2002 | Gotoh et al. | ................. 257/65 |
| 2002/0192884 | A1 * | 12/2002 | Chang et al. | ................ 438/164 |
| 2003/0008439 | A1 | 1/2003 | Ohnuma | |
| 2003/0025158 | A1 | 2/2003 | Makita et al. | |

(Continued)

FOREIGN PATENT DOCUMENTS

EP 1 006 589 A2 6/2000

(Continued)

OTHER PUBLICATIONS

Yin Hu, D. Anderson, A. Rotondaro, S.Obrien, W.-Y. Hsu, R.Kraft, and P.Tiner, "2.5 Ohms/Square W/TiN/Poly Stack Gate Technology for High Density and Embedded DRAM Technology," Proc. Int'l Symp. on VLSI Tech. and Appl.(1999), pp. 247-250.*

*Primary Examiner*—Ori Nadav
(74) *Attorney, Agent, or Firm*—Birch, Stewart, Kolasch & Birch, LLP

(57) ABSTRACT

A semiconductor device includes at least one thin-film transistor, which includes a semiconductor layer, a gate electrode and a gate insulating film. In the semiconductor layer, a crystalline region, including a channel forming region, a source region and a drain region, is defined. The gate electrode is provided to control the conductivity of the channel forming region. The gate insulating film is provided between the gate electrode and the semiconductor layer. The semiconductor layer includes a gettering region outside of the crystalline region thereof.

30 Claims, 21 Drawing Sheets

U.S. PATENT DOCUMENTS

2003/0173566 A1    9/2003    Nakazawa et al.

FOREIGN PATENT DOCUMENTS

| | | |
|---|---|---|
| JP | 06-169085 A | 6/1994 |
| JP | 10-270363 A | 10/1998 |
| JP | 11-097352 | 4/1999 |
| JP | 2002-016256 A | 1/2002 |
| KR | 2001-0060231 | 7/2001 |

* cited by examiner

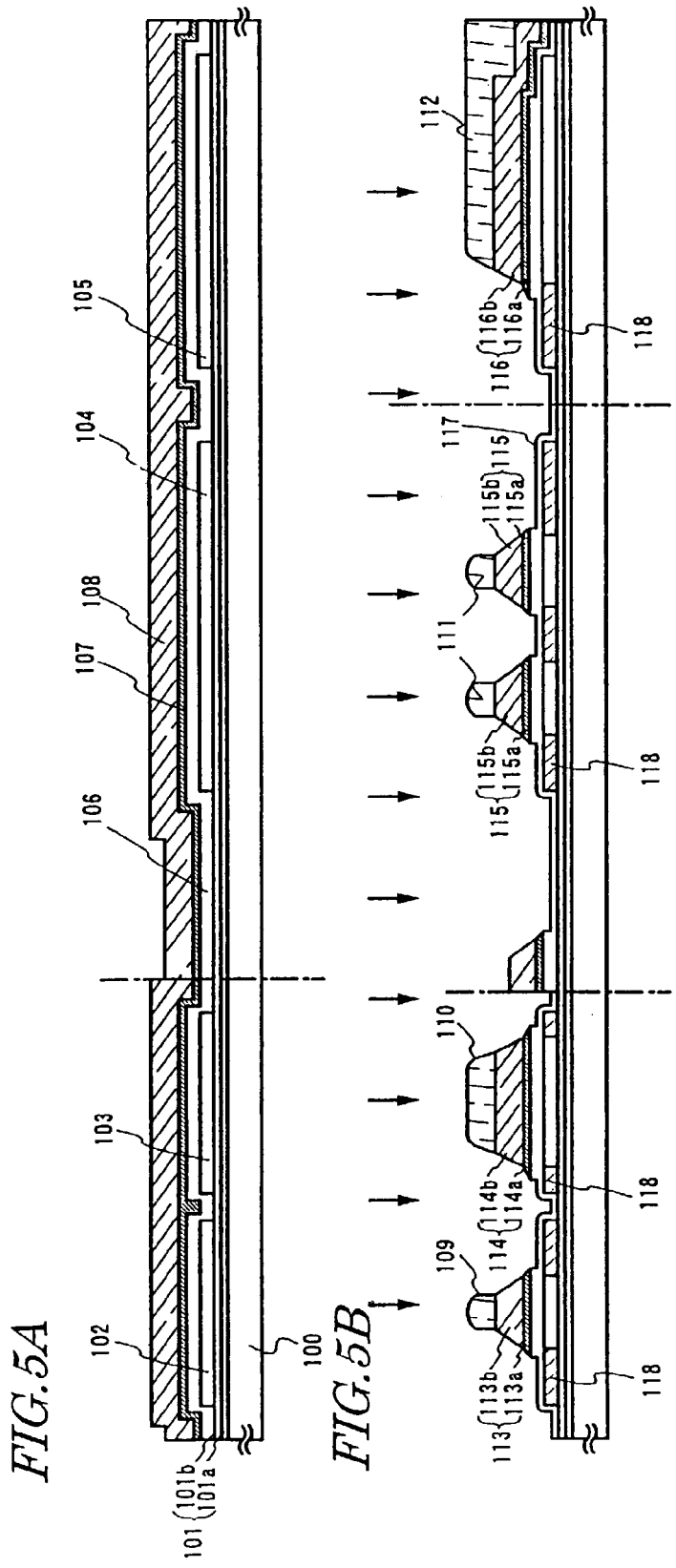

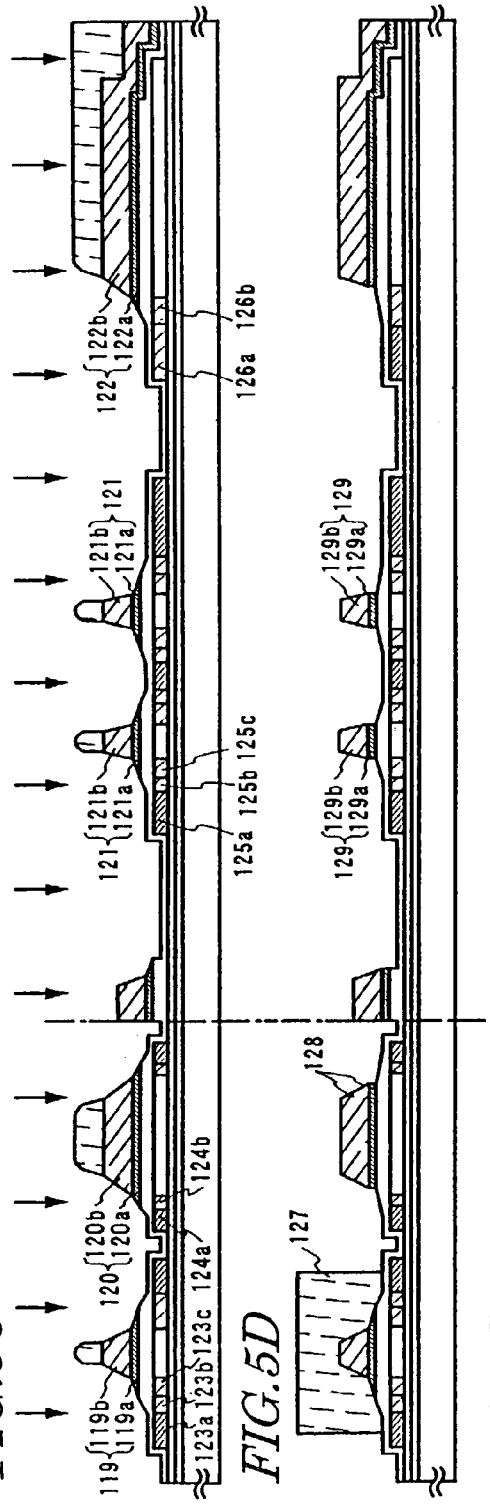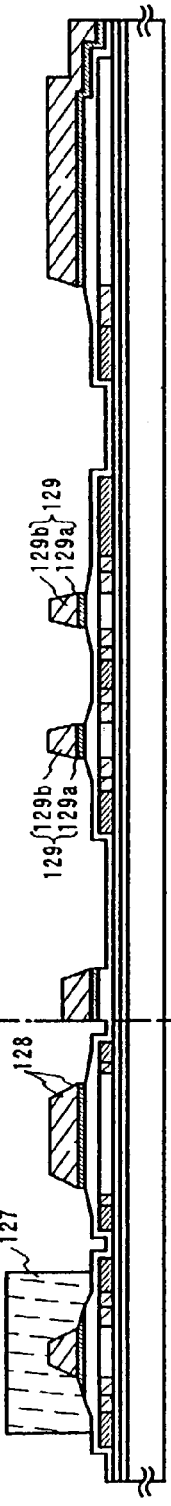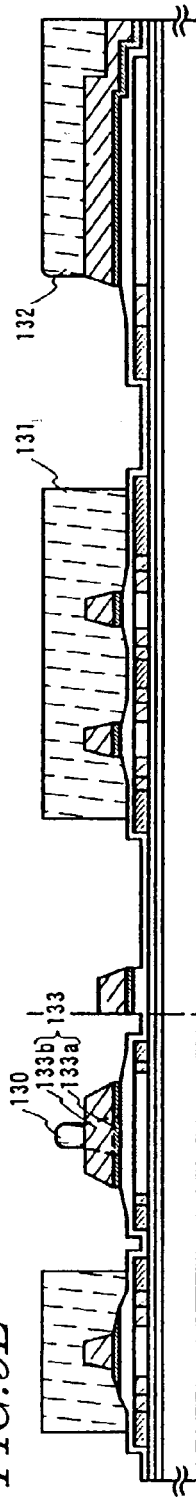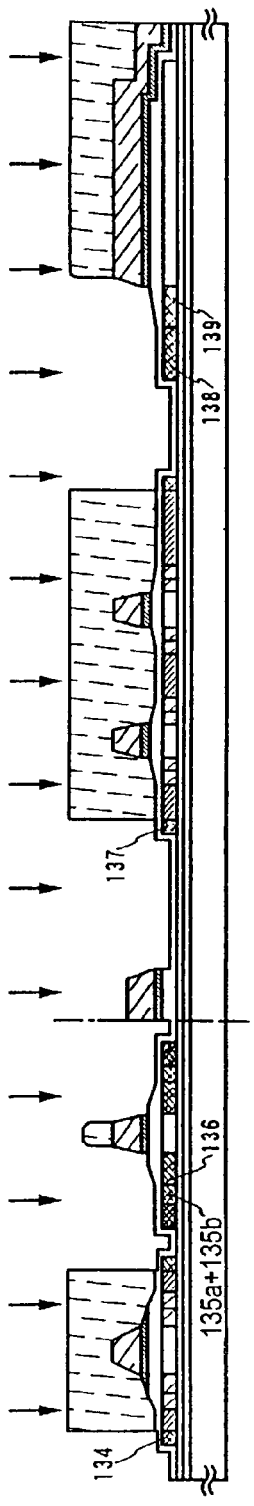

SEMICONDUCTOR DEVICE AND METHOD FOR FABRICATING THE SAME

BACKGROUND OF THE INVENTION

1. Field of the Invention

The present invention relates to a semiconductor device including a thin film transistor (TFT) and a method for fabricating such a semiconductor device. More particularly, the present invention relates to a semiconductor device including a TFT, of which the channel forming region is a crystalline region obtained by crystallizing an amorphous semiconductor film, and a method for fabricating such a semiconductor device. The present invention is particularly effectively applicable for use in active-matrix-addressed liquid crystal displays (LCDs), organic EL displays, close-contact image sensors and three-dimensional ICs.

2. Description of the Related Art

To realize large-scale and high-resolution LCDs or organic EL displays and high-speed and high-resolution close-contact image sensors or three-dimensional ICs, research and development has been carried on extensively on the technique of forming a high-performance semiconductor device on an insulating substrate of glass, for example, or on an insulating film. Among other things, LCDs, including a pixel section and a driver circuit on the same substrate, have found applications in not just monitors for personal computers (PCs) but also various other types of household electronic appliances. For example, a cathode-ray tube (CRT), which used to be found as a TV monitor in almost every household, has been gradually replaced by a liquid crystal display. Also, a front projector for use to project a movie or a game video onto a screen or for any other amusement purpose has now become a household commodity which is not so hard to find. These are just samples representing a rapid growth of huge LCD markets. Meanwhile, so-called "systems-on-panel", including a memory circuit and a logic circuit such as a clock generator on a glass substrate, is also being researched and developed intensively.

Generally speaking, to present a picture on a screen at a high resolution, the amount of information to be written onto each pixel should be increased significantly. Also, unless the enormous information is processible within a rather short time, pictures having such a huge amount of information as to achieve a high-definition display cannot be presented as moving pictures. Thus, to increase the processing rate sufficiently, a TFT for use in an LCD driver must operate at a tremendously increased speed. And to allow the TFT to operate at such a high speed, the TFT preferably includes a quality crystalline semiconductor film, of which the crystallinity is high enough to achieve sufficiently high field effect mobility.

The present inventors developed a technique of forming a quality semiconductor film with high crystallinity (i.e., of which the orientation directions of crystals are sufficiently aligned with each other) on a glass substrate by carrying out an annealing process at a lower temperature and in a shorter time than the conventional process. Specifically, the present inventors discovered that such a quality semiconductor film could be obtained by adding a metal element having the function of promoting the crystallization (which element will be referred to herein as a "catalytic element") to an amorphous semiconductor film and then subjecting the amorphous semiconductor film to an annealing process.

However, it is known that if a TFT is made by using a crystalline silicon film, obtained by adding such a catalytic element, as its semiconductor layer as it is, then the TFT may experience an abrupt increase in OFF-state leakage current. The present inventors believe that this phenomenon should be caused by an irregular precipitation of the catalytic element in the semiconductor film (around the grain boundary, in particular). That is to say, the present inventors believe that those precipitates should form current leakage paths, thus increasing the OFF-state leakage current abruptly. To avoid such an unwanted sudden increase in OFF-state leakage current, after the crystalline silicon film has been formed, the concentration of the catalytic element in the crystalline silicon film needs to be decreased by removing the catalytic element from the silicon film. This process step of removing the catalytic element will be referred to herein as a "gettering process".

Various gettering methods have been proposed. For example, Japanese Laid-Open Publication No. 10-270363 discloses a gettering technique of diffusing a catalytic element from its introduction site in a silicon film, which has been crystallized by the catalytic element added, to another site in the silicon film to which a Group Vb element such as phosphorus has been selectively introduced. This diffusion is achieved by annealing the silicon film. In this technique, an active region for a semiconductor device is defined in a portion of the silicon film to which the Group Vb element has not been introduced (i.e., the portion of which the concentration of the catalytic element has been decreased by the gettering process).

On the other hand, Japanese Laid-Open Publication No. 11-40499 discloses a technique of enhancing the catalytic element gettering effects by exposing the site, to which the Group Vb element has been selectively introduced, to an intense radiation such as a laser beam and then annealing the silicon film.

Furthermore, Japanese Laid-Open Publication No. 11-54760 discloses a technique of enhancing the catalytic element gettering effects by introducing not only the Group Vb element but also a Group IIIb element (e.g., born) into the same silicon film.

However, the conventional manufacturing process of semiconductor devices has the following drawbacks.

Firstly, the addition of the gettering process step increases the complexity and the cost of the manufacturing process. To overcome this problem, a method of selectively removing the catalytic element from the channel forming region only, not from the entire active region of the TFT, by diffusing the catalytic element to a portion of the active region to be the source or drain region was proposed.

In this method, the region to gather the catalytic element therein (which will be referred to herein as a "gettering region") is a portion to be source or drain region (that portion will also be referred to herein as "source or drain region" for the sake of simplicity). For that purpose, the source or drain region is heavily doped with an element having the function of diffusing the catalytic element and belonging to Group Vb of the periodic table (such as phosphorus and arsenic, which will be referred to herein as a "gettering element" and which is also an n-type dopant element) and then subjected to an annealing process. As a result of this annealing process, the catalytic element is diffused toward the source or drain region, and the concentration of the catalytic element in the channel forming region decreases. In this case, if the source or drain region is also heavily doped with another dopant element belonging to Group IIIb of the periodic table (such as boron and aluminum, which is also a p-type dopant element), then the gettering effects can be enhanced as disclosed in Japanese Laid-Open Publication No. 11-54760 identified above.

In an n-channel TFT, if the source or drain region is used as a gettering region, the n-type dopant element belonging to Group Vb-(such as phosphorus) may function as the gettering element by itself. In a p-channel TFT, however, the p-type dopant element belonging to Group IIIb (such as boron) cannot function as the gettering element by itself. For that reason, the n-type dopant element belonging to Group Vb (such as phosphorus) also needs to be added as the gettering element to the source or drain region of the p-channel TFT. That is to say, in the p-channel TFT, the source or drain region that has been heavily doped with the n-type dopant element for the purpose of performing the gettering process on the catalytic element needs to have its conductivity type inverted into p-type (a process performed for that purpose is called a "counter-doping process"). To invert the conductivity type of the semiconductor layer of the p-channel TFT from n-type into p-type, the p-type dopant must be added about 1.5 to about 3.0 times as heavily as the n-type dopant by that counter-doping process. Accordingly, if the n-type dopant element belonging to Group Vb (such as phosphorus) is added at an increased level to enhance the gettering effects, then the p-type dopant element belonging to Group IIb (such as born) must be added at an abnormally high level. Such an outstandingly high doping level is above the processibility of a normal doping system. Consequently, the counter-doping process is far from being a mass-producible process.

Furthermore, the gettering effects can be enhanced by adding not only the n-type dopant element belonging to Group Vb (such as phosphorus) but also the p-type dopant element belonging to Group IIIb (such as boron) as described above. Accordingly, the gettering ability of an n-channel TFT may be different from that of a p-channel TFT. In that case, the rate at which the catalytic element is diffused from inside the semiconductor film into the gettering region in the n-channel TFT may be different from the diffusion rate of the catalytic element in the p-channel TFT, thus possibly creating a variation in device performance.

Also, the gettering process is carried out on the n-channel TFT with only the n-type dopant element belonging to Group Vb (such as phosphorus). Thus, sufficient gettering effects are not achievable (i.e., the concentration of the catalytic element remaining in the channel forming region of the TFT cannot be reduced sufficiently) for the n-channel TFT. The present inventors carried out experiments and actually modeled sample TFTs by the methods disclosed in Japanese Laid-Open Publications No. 10-270363 and No. 11-40499. As a result, several percent of the TFTs turned out to be defective, i.e., allowed a huge amount of leakage current to flow during the OFF state thereof, although the failure rate slightly varied with the specific method adopted. The present inventors analyzed the defective TFTs to find how the failure occurred. As a result, the present inventors discovered and confirmed via the experiments that a silicide was produced by the catalytic element around the junction between the channel forming region and the drain region. Thus, the gettering methods disclosed in the publications identified above cannot be regarded as highly productive or reliable techniques because the catalytic element cannot be removed sufficiently and because the failure rates are non-negligible although high-performance TFTs are obtained in fairly good numbers.

On the other hand, if the Group Vb dopant element and the Group IIIb dopant element are both added to the n-channel TFT as disclosed in Japanese Laid-Open Publication No. 11-54760, then the gettering effects can be enhanced to a certain degree. In that case, however, the n-type dopant element must be added more heavily than the p-type dopant element in the n-channel TFT. In the p-channel TFT on the other hand, the p-type dopant element must be added more heavily than the n-type dopant element. Thus, the manufacturing process is complicated significantly. In addition, dopants must be added at mutually different levels to the gettering region of the semiconductor layer that has one of two different conductivity types. Consequently, the gettering efficiency of the n-channel TFT is still different from that of the p-channel TFT.

Furthermore, it is already known that the increase in the OFF-state leakage current of the TFT is caused mainly due to the precipitation of the catalytic element around the junction between the channel forming region and the drain region. Accordingly, if the source and drain regions are used as the gettering regions, it is difficult to minimize the increase in the OFF-state leakage current of the TFT due to the catalytic element because the junction between the channel forming region and the source or drain region is also the boundary between the gettering region and the non-gettering region.

SUMMARY OF THE INVENTION

In order to overcome the problems described above, preferred embodiments of the present invention provide a semiconductor device exhibiting good characteristics by making a thin-film transistor with a crystalline semiconductor region of quality.

A semiconductor device according to a preferred embodiment of the present invention includes at least one thin-film transistor. The thin-film transistor preferably includes a semiconductor layer, a gate electrode and a gate insulating film. In the semiconductor layer, a crystalline region, including a channel forming region, a source region and a drain region, is preferably defined. The gate electrode is provided to control the conductivity of the channel forming region. The gate insulating film is preferably provided between the gate electrode and the semiconductor layer. The semiconductor layer preferably includes a gettering region outside of the crystalline region thereof.

In one preferred embodiment of the present invention, the gettering region may be partially amorphous.

In an alternative preferred embodiment, the gettering region may be completely amorphous.

In another preferred embodiment, the gettering region preferably includes an amorphous phase at a greater percentage, and a crystalline phase at a smaller percentage, than the channel forming region, the source region or the drain region.

In still another preferred embodiment, the semiconductor layer may be made of Si. In that case, the gettering region preferably has a higher Pa/Pc ratio than the channel forming region, where the Pa/Pc ratio is a ratio of a TO phonon peak Pa of amorphous Si to a TO phonon peak Pc of crystalline Si in a Raman spectrum.

In this particular preferred embodiment, the gettering region preferably has a higher Pa/Pc ratio than the source region or the drain region.

In still another preferred embodiment, the gettering region is preferably not adjacent to the channel forming region.

In yet another preferred embodiment, the gettering region is preferably located outside of a portion of the semiconductor layer, in which an interconnect, connecting respective thin-film transistors together electrically, contacts with the semiconductor layer.

In yet another preferred embodiment, the gettering region may be located at an outer edge of the semiconductor layer. In that case, the contact portion between the interconnect and the semiconductor layer preferably overlaps with a portion of the gettering region and a portion of the crystalline region.

In an alternative preferred embodiment, the gettering region may be located at an outer edge of the semiconductor layer. In that case, the contact portion between the interconnect and the semiconductor layer preferably overlaps with the crystalline region only.

In yet another preferred embodiment, multiple thin-film transistors may be allocated to the single semiconductor layer and at least two of the thin-film transistors may share the source region or the drain region. In that case, the gettering region is preferably located adjacent to the source region or the drain region that is shared by the at least two thin-film transistors.

In yet another preferred embodiment, the gettering regions may be provided at the outer edges of the semiconductor layer and between the source regions, between the drain regions or between the source and drain regions. In that case, the contact portion between the interconnect and the semiconductor layer preferably overlaps with a portion of one of the gettering regions and a portion of the crystalline region.

In an alternative preferred embodiment, the gettering regions may be provided at the outer edges of the semiconductor layer and between the source regions, between the drain regions or between the source and drain regions. In that case, the contact portion between the interconnect and the semiconductor layer preferably overlaps with the crystalline region only.

A semiconductor device according to another preferred embodiment of the present invention preferably includes an n-channel thin-film transistor and a p-channel thin-film transistor. The n-channel thin-film transistor and the p-channel thin-film transistor preferably each include a semiconductor layer, a gate electrode and a gate insulating film. In the semiconductor layer, a crystalline region, including a channel forming region, a source region and a drain region, is preferably defined. The gate electrode is provided to control the conductivity of the channel forming region. The gate insulating film is preferably provided between the gate electrode and the semiconductor layer. The semiconductor layer preferably includes a gettering region outside of the crystalline region thereof.

In one preferred embodiment of the present invention, the gettering region may be partially amorphous.

In an alternative preferred embodiment, the gettering region may be completely amorphous.

In another preferred embodiment, the gettering region preferably includes an amorphous phase at a greater percentage, and a crystalline phase at a smaller percentage, than the channel forming region, the source region or the drain region.

In still another preferred embodiment, the semiconductor layer may be made of Si. In that case, the gettering region preferably has a higher Pa/Pc ratio than the channel forming region, where the Pa/Pc ratio is a ratio of a TO phonon peak Pa of amorphous Si to a TO phonon peak Pc of crystalline Si in a Raman spectrum.

In this particular preferred embodiment, the gettering region preferably has a higher Pa/Pc ratio than the source region or the drain region.

In yet another preferred embodiment, the ratio S/W of the area S of the gettering region in the n-channel thin-film transistor to the width W of the channel forming region thereof is preferably approximately equal to the ratio S/W of the area S of the gettering region in the p-channel thin-film transistor to the width W of the channel forming region thereof.

In yet another preferred embodiment, a distance L from a junction between the channel forming region and the source region or the drain region to the gettering region in the n-channel thin-film transistor is preferably approximately equal to a distance L from a junction between the channel forming region and the source region or the drain region to the gettering region in the p-channel thin-film transistor.

In yet another preferred embodiment, the gettering region preferably includes an n-type dopant element belonging to Group Vb of the periodic table and a p-type dopant element belonging to Group IIIb of the periodic table.

In this particular preferred embodiment, the gettering region includes the n-type dopant element at a concentration of about $1 \times 10^{19}/cm^3$ to about $1 \times 10^{21}/cm^3$ and the p-type dopant element at a concentration of about $1.5 \times 10^{19}/cm^3$ to about $3 \times 10^{21}/cm^3$.

In a specific preferred embodiment, in the gettering region, the concentration of the p-type dopant element is about 1.5 to about 3.0 times as high as that of the n-type dopant element.

In yet another preferred embodiment, the gettering region is preferably doped with at least one rare-gas element that is selected from the group consisting of Ar, Kr and Xe.

Specifically, the gettering region is preferably doped with the rare-gas element at a dose of about $1 \times 10^{19}/cm^3$ to about $3 \times 10^{21}/cm^3$.

In yet another preferred embodiment, at least one catalytic element that is selected from the group consisting of Ni, Co, Sn, Pb, Pd, Fe and Cu is preferably added to the gettering region.

In that case, the gettering region preferably includes the catalytic element at a dose of at least about $1 \times 10^{19}/cm^3$.

In yet another preferred embodiment, the gate electrode is preferably made of at least one material that is selected from the group consisting of W, Ta, Ti and Mo.

Another preferred embodiment of the present invention provides a method for fabricating a semiconductor device. The method preferably includes the steps of: preparing an amorphous semiconductor film, to at least part of which a catalytic element, promoting crystallization, has been added; subjecting the amorphous semiconductor film to a first annealing process, thereby crystallizing at least a portion of the amorphous semiconductor film and obtaining a semiconductor film including a crystalline region; patterning the semiconductor film into a plurality of island-shaped semiconductor layers, each including the crystalline region; selectively adding a gettering element to a portion of each said island-shaped semiconductor layer other than portions to be source and drain regions, thereby defining an amorphized gettering region; and subjecting the island-shaped semiconductor layers to a second annealing process, thereby diffusing at least part of the catalytic element toward the gettering region in each said island-shaped semiconductor layer.

In one preferred embodiment of the present invention, the method preferably further includes the step of keeping the gettering region amorphized.

In another preferred embodiment, the method preferably further includes the step of introducing an n-type dopant and/or a p-type dopant into selected portions of each said island-shaped semiconductor layer before the step of subjecting the island-shaped semiconductor layers to the second annealing process is performed.

In this particular preferred embodiment, the step of introducing the n-type dopant and/or the p-type dopant may be performed before the step of adding the gettering element is performed.

In an alternative preferred embodiment, the step of introducing the n-type dopant and/or the p-type dopant may be performed after the step of adding the gettering element has been performed.

In a specific preferred embodiment, the method preferably includes the steps of: forming a gate insulating film over each said island-shaped semiconductor layer; forming a gate electrode on the gate insulating film; and introducing the n-type dopant and/or the p-type dopant into portions of the island-shaped semiconductor layer which are not covered with the gate electrode.

In another preferred embodiment, the step of adding the gettering element preferably includes the step of adding at least one element that is selected from the group consisting of Ar, Kr and Xe.

In still another preferred embodiment, the step of adding the gettering element preferably includes the step of adding an n-type dopant element belonging to Group Vb of the periodic table and a p-type dopant element belonging to Group IIIb of the periodic table.

In yet another preferred embodiment, the step of adding the gettering element preferably includes the step of adding the gettering element to the gettering region at a controlled dose of about $1 \times 10^{19}/cm^3$ to about $3 \times 10^{21}/cm^3$.

Still another preferred embodiment of the present invention provides a method for fabricating a semiconductor device. The method preferably includes the steps of: preparing an amorphous semiconductor film, to at least part of which a catalytic element, promoting crystallization, has been added; subjecting the amorphous semiconductor film to a first annealing process, thereby crystallizing at least a portion of the amorphous semiconductor film and obtaining a semiconductor film including a crystalline region; patterning the semiconductor film into a plurality of island-shaped semiconductor layers, each including the crystalline region; forming a gate insulating film over each said island-shaped semiconductor layer; forming a gate electrode on the gate insulating film; introducing a dopant into a selected portion of the island-shaped semiconductor layer, thereby forming an amorphized gettering region in a portion of the island-shaped semiconductor layer other than portions to be source and drain regions; and subjecting the island-shaped semiconductor layers to a second annealing process, thereby diffusing at least part of the catalytic element toward the gettering region in each said island-shaped semiconductor layer.

In one preferred embodiment of the present invention, the step of introducing the dopant preferably includes the steps of: introducing an n-type dopant element into portions of a first one of the island-shaped semiconductor layers to be the source region, drain region and gettering region of an n-channel thin-film transistor and into a portion of a second one of the island-shaped semiconductor layers to be the gettering region of a p-channel thin-film transistor; and introducing a p-type dopant element into portions of the second island-shaped semiconductor layer to be the source region, drain region and gettering region of the p-channel thin-film transistor and into the portion of the first island-shaped semiconductor layer to be the gettering region of the n-channel thin-film transistor after the step of introducing the n-type dopant element has been performed.

In an alternative preferred embodiment, the step of introducing the dopant preferably includes the steps of: introducing a p-type dopant element into portions of a first one of the island-shaped semiconductor layers to be the source region, drain region and gettering region of a p-channel thin-film transistor and into a portion of a second one of the island-shaped semiconductor layers to be the gettering region of an n-channel thin-film transistor; and introducing an n-type dopant element into portions of the second island-shaped semiconductor layer to be the source region, drain region and gettering region of the n-channel thin-film transistor and into the portion of the first island-shaped semiconductor layer to be the gettering region of the p-channel thin-film transistor after the step of introducing the p-type dopant element has been performed.

Yet another preferred embodiment of the present invention provides a method for fabricating a semiconductor device. The method preferably includes the steps of: preparing an amorphous semiconductor film, to at least part of which a catalytic element, promoting crystallization, has been added; subjecting the amorphous semiconductor film to a first annealing process, thereby crystallizing at least a portion of the amorphous semiconductor film and obtaining a semiconductor film including a crystalline region; patterning the semiconductor film into a first island-shaped semiconductor layer and a second island-shaped semiconductor layer, each including the crystalline region; forming a gate insulating film over each said island-shaped semiconductor layer; forming a first gate electrode on the gate insulating film on the first island-shaped semiconductor layer, on which an n-channel thin-film transistor will be formed, and a second gate electrode on the gate insulating film on the second island-shaped semiconductor layer, on which a p-channel thin-film transistor will be formed, respectively; introducing an n-type dopant element into the first and second island-shaped semiconductor layers with the first and second gate electrodes used ask mask, thereby forming a source region, a drain region and a gettering region for the n-channel thin-film transistor and a gettering region for the p-channel thin-film transistor; forming a first mask, which exposes a portion of the first island-shaped semiconductor layer of the n-channel thin-film transistor, over the first gate electrode, and a second mask, which defines a third gate electrode for the p-channel thin-film transistor, on the second gate electrode, respectively; patterning the second gate electrode into the third gate electrode by using the second mask; introducing a p-type dopant element into portions of the first and second island-shaped semiconductor layers, which are not covered with the first mask or the third gate electrode, thereby forming an amorphized gettering region for the n-channel thin-film transistor and the source region, drain region and amorphized gettering region for the p-channel thin-film transistor, respectively; and conducting a second annealing process such that at least part of the catalytic element in the first and second island-shaped semiconductor layers is introduced into the gettering regions that have been amorphized by being doped with both the p-type dopant element and the n-type dopant element.

Yet another preferred embodiment of the present invention provides a method for fabricating a semiconductor device. The method preferably includes the steps of: preparing an amorphous semiconductor film, to at least part of which a catalytic element, promoting crystallization, has been added; subjecting the amorphous semiconductor film to a first annealing process, thereby crystallizing at least a portion of the amorphous semiconductor film and obtaining a semiconductor film including a crystalline region; patterning the semiconductor film into a first island-shaped semiconductor layer and a second island-shaped semiconductor layer, each including the crystal line region; forming a gate insulating film over each said island-shaped semiconductor layer; forming a first gate electrode on the gate insulating film on the first island-shaped semiconductor layer, on which a p-channel thin-film transistor will be formed, and a second gate electrode on the gate insulating film on the second island-shaped semiconductor layer, on which an n-channel thin-film transistor will be formed, respectively; introducing a p-type dopant element into the first and second island-shaped semiconductor layers with the first and second gate electrodes used as a mask, thereby forming a source region, a drain region and a gettering region for the p-channel thin-film transistor and a gettering region for the n-channel thin-film transistor; forming a first mask, which exposes a portion of the first island-shaped semiconductor layer of the p-channel thin-film transistor, over the first gate electrode, and a second mask, which defines a third gate electrode for the n-channel thin-film transistor, on the second gate electrode, respectively; patterning the second gate electrode into the third gate electrode by using the second mask; introducing an n-type dopant element into portions of the first and second island-shaped semiconductor layers, which are not covered with the first mask or the third gate electrode, thereby forming an amorphized gettering region for the p-channel thin-film transistor and the source region, drain region and amorphized gettering region for the n-channel thin-film transistor, respectively; and conducting a second annealing process such that at least part of the catalytic element in the first and second island-shaped semiconductor layers is introduced into the gettering regions that have been amorphized by being doped with both the n-type dopant element and the p-type dopant element.

In one preferred embodiment of the present invention, the step of introducing the n-type dopant element preferably includes the step of introducing the n-type dopant element into the gettering region at a dose of about $1\times10^{19}/cm^3$ to about $1\times10^{21}/cm^3$. On the other hand, the step of introducing the p-type dopant element preferably includes the step of introducing the p-type dopant element into the gettering region at a dose of about $1.5\times10^{19}/cm^3$ to about $3\times10^{21}/cm^3$.

In another preferred embodiment, the step of preparing the amorphous semiconductor film preferably includes the step of preparing an amorphous silicon film. The step of forming the amorphized gettering region preferably includes the step of setting a Pa/Pc ratio of the gettering region higher than that of the channel forming region, where the Pa/Pc ratio is a ratio of a TO phonon peak Pa of amorphous Si to a TO phonon peak Pc of crystalline Si in a Raman spectrum.

In still another preferred embodiment, the method may further include the step of forming an interconnect that contacts with a region other than the gettering region after the step of conducting the second annealing process has been performed.

In yet another preferred embodiment, the step of forming the second gate electrode preferably includes the step of forming the second gate electrode such that the second gate electrode has a width greater than that of the third gate electrode.

In yet another preferred embodiment, the step of conducting the second annealing process preferably includes the step of conducting the second annealing process such that the gettering region is not crystallized.

In yet another preferred embodiment, the step of conducting the second annealing process preferably includes the step of conducting the second annealing process such that the amorphized gettering region includes an amorphous phase at a greater percentage, and a crystalline phase at a smaller percentage, than the channel forming region, source region or drain region.

In yet another preferred embodiment, the step of conducting the second annealing process preferably includes the step of conducting a rapid thermal annealing (RTA) process.

In yet another preferred embodiment, the step of preparing the amorphous semiconductor film preferably includes the steps of: defining a mask having an opening on the amorphous semiconductor film; and introducing the catalytic element through the opening into a selected area of the amorphous semiconductor film.

In yet another preferred embodiment, the step of forming the gettering region preferably includes the step of forming the gettering region adjacent to the source region or the drain region of the thin-film transistor, not to the channel forming region thereof.

In yet another preferred embodiment, the step of forming the gettering region preferably includes the step of forming the gettering region in a region other than where electros or holes travel.

In yet another preferred embodiment, the step of forming the gettering region preferably includes the step of forming the gettering region at a location that is closer to an outer edge of the island-shaped semiconductor layer than the center of a contact region is. The contact region is provided to electrically connect the island-shaped semiconductor layer to an interconnect.

In this particular preferred embodiment, the gettering region preferably partially overlaps with the contact region.

In yet another preferred embodiment, the step of preparing the amorphous semiconductor film preferably includes the step of adding at least one catalytic element, selected from the group consisting of Ni, Co, Sn, Pb, Pd, Fe and Cu, to the amorphous semiconductor film.

In yet another preferred embodiment, the method may further include the step of exposing the semiconductor film to a laser beam after the step of subjecting the amorphous semiconductor film to the first annealing process has been performed.

In yet another preferred embodiment, the step of conducting the second annealing process activates the dopant that has been introduced into the island-shaped semiconductor layers.

An electronic appliance according to a preferred embodiment of the present invention preferably includes the semiconductor device according to any of the preferred embodiments of the present invention described above.

In one preferred embodiment, the electronic appliance preferably further includes a display section that conducts a display operation by using the semiconductor device.

Other features, elements, processes, steps, characteristics and advantages of the present invention will become more apparent from the following detailed description of preferred embodiments of the present invention with reference to the attached drawings.

BRIEF DESCRIPTION OF THE DRAWINGS

FIGS. 5A through 5H are cross-sectional views illustrating respective process steps for fabricating an active-matrix substrate according to a fifth specific preferred embodiment of the present invention.

DETAILED DESCRIPTION OF PREFERRED EMBODIMENTS

Figure 1A:
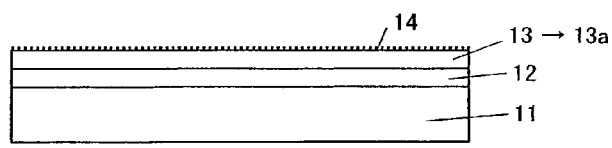
FIGS. 1A through 1G are cross-sectional views illustrating respective process steps for fabricating an n-channel TFT as a semiconductor device according to a first specific preferred embodiment of the present invention.

A gettering process is carried out on a catalytic element by utilizing two different mechanisms. One of those two mechanisms (which will be referred to herein as a "first gettering mechanism" for convenience sake) is devised based on the phenomenon that if the solid solubility of a catalytic element is set higher in a region than in the other regions, the catalytic element should move to the region with the higher solid solubility. The other mechanism (which will be referred to herein as a "second gettering mechanism" for convenience sake) is devised based on the phenomenon that when defects or locally precipitated sites that would trap a catalytic element are provided in a particular region, the catalytic element should move to the particular region and be trapped there.

The technique disclosed in Japanese Laid-Open Publication No. 10-270363 identified above utilizes the first gettering mechanism. That is to say, an element having the function of causing the diffusion of a catalytic element (i.e., an element belonging to Group Vb of the periodic table) is introduced into a region of a silicon film, thereby increasing the solid solubility of the catalytic element in that region. On the other hand, the technique disclosed in Japanese Laid-Open Publication No. 8-213317 utilizes the second gettering mechanism. Specifically, lattice defects existing in an amorphous region are used as the locally precipitated sites that would trap the catalytic element.

The present inventors discovered and confirmed via experiments that the efficiency at which the catalytic element is diffused toward the gettering region (which will be referred to herein as a "gettering efficiency") achieved by the second gettering mechanism is higher than that achieved by the first gettering mechanism and that the concentration of the catalytic element remaining in the channel forming region can be decreased much more significantly by the second gettering mechanism than by the first gettering mechanism.

However, even though the second gettering mechanism is found much more efficient than the first gettering mechanism, the second gettering mechanism still needs crystallizing amorphous gettering regions eventually if the source and drain regions of a TFT active region are initially used as the amorphous gettering regions. This is because the electrical resistivity is higher in an amorphous region than in a crystalline region. Accordingly, when the technique disclosed in Japanese Laid-Open Publication No. 8-213317 is adopted, the gettering regions need to be crystallized by exposing the gettering regions to a laser beam, for example. However, a laser beam exposure system is normally expensive, has a complicated structure, and needs frequent maintenance. Thus, the technique utilizing the second gettering mechanism should result in an increased manufacturing cost and a decreased yield.

Also, when the source and drain regions are used as the gettering regions, the pn junction between the channel forming region and the source region and the pn junction between the channel forming region and the drain region also define the boundaries between the gettering regions and the non-gettering region. Accordingly, the precipitates of the catalytic element cannot be removed from around the pn junctions.

Furthermore, if the amorphous gettering regions are crystallized eventually, then the gettering action of these regions will diminish thereafter. For that reason, the catalytic element, which has once been gathered in the amorphous gettering regions, might go back to the channel forming region (which phenomenon will be referred to herein as a "backflow") during a manufacturing process step to be performed after the gettering regions have been crystallized. Even if such a backflow of the catalytic element does not occur during the manufacturing process, the backflow still may be caused by the heat to be generated while the TFT is being driven. In any case, the backflow of the catalytic element might decrease the long-term reliability of the device.

For that reason, if the gettering regions are provided in the active region of a TFT, then the gettering regions are preferably kept amorphous even after the TFT is complete such that the TFT will not lose the gettering ability during its operation.

In view of these considerations, according to the present invention, once gettering regions including an amorphous phase are defined, the gettering regions are never crystallized eventually but are kept amorphous even after the TFT is complete. Also, those gettering regions are carefully arranged in such a manner that the high electrical resistivity of the gettering regions will not deteriorate the characteristics of the TFT or decrease the area of contact with interconnects. That is to say, the gettering regions are arranged at such locations as not to interfere with the travel of carriers (i.e., electrons or holes) in the TFT.

Thus, according to the present invention, even after the manufacturing process of the TFT is finished, gettering regions including an amorphous phase are still present in the active region and the TFT achieves high gettering efficiency during its operation. As a result, the semiconductor device ensures increased reliability. Since the gettering region is provided separately from the source and drain regions for the active region, the doping level of the n-type or p-type dopant to be introduced into the source and drain regions can be optimized. Consequently, the process margin can be expanded and the throughput of the doping system can be increased significantly. In addition, the resistivity of the source and drain regions can be decreased and the ON-state characteristics of the TFT are improvable.

If the gettering region is provided outside of the crystalline region of an island-shaped semiconductor layer, which includes the source and drain regions, then the concentration of the catalytic element in the source and drain regions will decrease sufficiently. Thus, the unwanted situation where the catalytic element, remaining around the pn junction between the channel forming region and the source or drain region, makes a leakage current path is substantially avoidable. As a result, the present invention can eliminate the unwanted increase in leakage current during the OFF state of the TFT substantially completely, thus realizing high reliability.

It should be noted that when the dopant is introduced into the source and drain regions, the source and drain regions are also amorphized just to a much lesser degree than the gettering region. If the gettering phenomenon should be caused by the second gettering mechanism described above, then the gettering region needs to be amorphized to a rather high degree. Accordingly, in the conventional manufacturing process in which the source and drain regions are used as gettering regions, the crystallinity of the source and drain regions must be recovered by subjecting the source and drain regions to a special annealing process (e.g., exposure to a laser beam) after the gettering process. In contrast, in the present invention, the gettering region is provided at a different location of each island-shaped semiconductor layer from that of the source or drain region. Thus, the crystallinity of the source and drain regions can be recovered sufficiently by a normal annealing process. Also, although the crystallinity of the gettering region is not recovered by such an annealing process, this is the key to maintaining the gettering function even during the TFT operation as described above.

The crystallinity of a given region can be effectively evaluated by a Pa/Pc ratio, which is a ratio of the TO phonon peak Pa of amorphous Si to the TO phonon peak Pc of crystalline Si in a Raman spectrum. That is to say, if the gettering region can keep a higher Pa/Pc ratio than the source and drain regions, then a gettering efficiency required for the present invention can be maintained.

As described above, according to the present invention, the leakage current, which would otherwise be caused by the precipitation of the catalytic element, can be minimized. Thus, it is possible to achieve particularly good characteristics for TFTs that should have minimized leakage current during the OFF state, e.g., a switching element in a pixel section and a sampling element or a memory element for a driver. Also, the semiconductor film, which has been crystallized with the catalytic element, can exhibit excellent crystallinity. Accordingly, the TFT of the present invention can also exhibit sufficiently good characteristics even when used as an element for a driver that needs high field effect mobility. When fabricated by the conventional technique, approximately 3% of TFTs exhibited an abnormal increase in OFF-state leakage current. However, none of the semiconductor devices (or TFTs) made by the present invention exhibited such an increase.

Unlike the prior art, a liquid crystal display including the semiconductor device of the present invention is totally free from line defects, caused by sampling TFTs in a driver, or pixel defects, caused by the OFF-state leakage current, thus improving the display quality significantly. In addition, the present invention can manufacture the liquid crystal displays by a simplified process at an increased yield.

In a preferred embodiment of the present invention, the gettering region is located closer to the outer edge of the semiconductor layer than a contact region, to which an interconnect for electrically connecting the TFTs together is connected. Then, the gettering region can have its area maximized without blocking the path of carriers (i.e., electros or holes) of the TFTs.

However, even if the gettering region, located around the outer edge of the semiconductor layer, partially overlaps with the contact region, the carrier path may still not be blocked by the gettering region. Thus, the rather high resistivity of the gettering region would not decrease the ON-state current of the TFTs significantly.

A most stabilized carrier path can be naturally secured for the TFTs and a sufficiently high ON-state current can be obtained if the contact region is provided in the crystalline portion of the island-shaped semiconductor layer, not in the gettering region thereof.

In fabricating any of various types of circuits (e.g., clocked inverters and latch circuits) by arranging multiple TFTs on the same substrate, a number of those TFTs preferably share the same semiconductor layer (or active region) to lay out the TFTs highly efficiently. In that case, the gettering region may be provided in a portion of the semiconductor layer to be shared by adjacent TFTs. Even so, the gettering region is preferably located outside of the region in which the carriers of the TFTs travel. For example, the gettering region may be provided near the outer edge of the semiconductor layer or between the source and drain regions.

In that case, the contact region and the gettering region are preferably provided at mutually different locations. However, as long as a carrier path is secured for the TFTs, the contact region may partially overlap with the gettering region.

The present invention is also applicable for use in a situation where an n-channel TFT and a p-channel TFT are provided on the same substrate. If the n-channel and p-channel TFTs include a rare gas element at the same concentration as the gettering element, then the n-channel and p-channel TFTs will have substantially equal gettering abilities. Thus, the gettering efficiency of the n-channel TFT can be substantially equalized with that of the p-channel TFT. Thus, the concentration of the catalytic element remaining in the n-channel TFT will be approximately equal to that of the catalytic element remaining in the p-channel TFT. As a result, the unwanted variation in device characteristic, resulting from the difference in the concentration of the remaining catalytic element, can be minimized. In addition, the concentration of the catalytic element can be reduced sufficiently in the channel forming region and in the junction between the channel forming region and the source or drain region.

In a pair of n-channel and p-channel TFTs, the ratio of the area S of the gettering region to the width W of the active region in the n-channel TFT is preferably substantially equalized with the S/W ratio in the p-channel TFT. Also, the distance L from the pn junction between the source or drain region and the channel forming region to the gettering region is preferably equalized for the n-channel and p-channel TFTs.

The gettering efficiency of the gettering region is a dominating factor that determines how effectively the catalytic element is removable from the channel forming region of the TFT through the gettering process. However, the ratio of the area of the gettering region to the width of the channel forming region of the TFT (i.e., the S/W ratio) and the distance L from the channel forming region of the TFT to the gettering region also count among important parameters that determine the gettering effects.

Specifically, the greater the area S of the gettering region, the higher the gettering ability would be. And the S/W ratio determines the gettering efficiency of the channel forming region. The distance over which the catalytic element should be diffused from the channel forming region to the gettering region (i.e., the distance L, which will also be referred to herein as a "gettering distance") has significant effects on the gettering efficiency of the channel forming region.

Accordingly, if the gettering efficiencies of the n-channel and p-channel TFTs are equalized with each other more completely by designing the n-channel and p-channel TFTs with substantially the same S/W ratios and distances L, then the concentration of the catalytic element remaining in the n-channel TFT will be almost equal to that of the catalytic element remaining in the p-channel TFT. Thus, the variation in device characteristic, which is normally caused by the difference in the concentration of the remaining catalytic element, can be minimized.

The active region of the TFT, except the gettering region thereof, is preferably made of a crystalline silicon film with good crystallinity. If the channel forming region and other regions are defined in the island-shaped semiconductor layer that has been obtained by patterning the crystalline silicon film, then the TFT can exhibit constant characteristics. That is to say, an adequate balance can be struck between the ON-state characteristics and OFF-state characteristics of the TFT. Crystalline silicon is a material that is so readily processable as to make the manufacturing process very easy. Examples of other preferred materials for the semiconductor device of the present invention include microcrystalline silicon and crystalline germanium.

To increase the gettering ability, an n-type dopant element belonging to Group Vb of the periodic table and/or a p-type dopant element belonging to Group IIIb of the periodic table may be added to the gettering region. Although the gettering ability can be increased to a certain degree even by adding the Group Vb element only, more remarkable gettering effects are achievable when not only the Group Vb element but also the Group IIIb element are added as well. The highest gettering effects are achievable when P (phosphorus) and B (boron) are added as the Group Vb element and Group IIIb element, respectively.

It is already known that if boron, as well as phosphorus, is introduced into the gettering region, the gettering mechanism will change.

Specifically, when only phosphorus is introduced into the gettering region, the solid solubility of the catalytic element increases much more significantly in the phosphorus-doped region (i.e., the gettering region) than in the non-phosphorus-doped region (i.e., non-gettering region). In that case, the gettering phenomenon occurs as the diffusion of the catalytic element due to the difference in solid solubility between the gettering and non-gettering regions. On the other hand, when phosphorus and boron are both introduced into the gettering region, defects or precipitation sites are created in the gettering region. As a result, the catalytic element is precipitated in the gettering region much more easily. The resultant gettering ability is higher in the latter situation than in the former situation. In the latter case, however, the gettering process is caused by the defects or precipitation sites and therefore depends much more heavily on the crystallinity. Specifically, the greater the percentage of an amorphous phase included in the gettering region, the higher the efficiency of the gettering process caused by the defects or precipitation sites.

The n-type dopant element is preferably introduced into the gettering region at a doping level of about $1\times10^{19}/cm^3$ to about $1\times10^{21}/cm^3$, while the p-type dopant element is preferably introduced into the gettering region at a doping level of about $1.5\times10^{19}/cm^3$ to about $3\times10^{21}/cm^3$. If the n-type or p-type dopant added has a concentration falling within one of these ranges, sufficiently high gettering efficiency is achievable. However, even if the n-type or p-type dopant is added at an unnecessarily high level that exceeds these ranges, the process time just increases and no further advantages are obtained because the gettering efficiency is already saturated.

In the gettering region, the concentration of the p-type dopant is preferably about 1.5 to about 3.0 times as high as that of the n-type dopant. This is because when the effects achieved by the p-type dopant are more noticeable than those achieved by the n-type dopant, the gettering action induced by the defects or precipitation sites will prevail over the gettering action induced by the diffusion.

If at least one rare gas element, which is selected from the group consisting of Ar, Kr and Xe, is included in the gettering region, then a huge interstitial strain will be created there and an intense gettering action will be done on the catalytic element, thereby trapping the catalytic element at the gettering site. When a Group Vb element (such as phosphorus) is added to a portion of a semiconductor film, the solid solubility of the catalytic element will rise in that portion of the semiconductor film, thereby turning that portion into a gettering region as described above. On the other hand, a rare gas element causes a totally different and much intenser gettering action. When at least one rare gas element is selected from the group consisting of Ar, Kr and Xe and introduced into the gettering region, sufficient gettering effects are achievable. Among other things, Ar is most preferred because most significant effects are achieved by the addition of Ar.

The rare gas element is preferably introduced into the gettering region of the active region at a doping level of about $1\times10^{19}/cm^3$ to about $3\times10^{21}/cm^3$. By defining the concentration of the rare gas element in the gettering region within such a range, the gettering effects of the present invention are achievable sufficiently. Stated otherwise, if the concentration of the rare gas element in the gettering region is lower than about $1\times10^{19}/cm^3$, almost no gettering action on the catalytic element is observable. However, if the concentration of the rare gas element in the gettering region exceeds about $3\times10^{21}/cm^3$, the gettering effects will be saturated, the gettering region will have a porous film quality, and the semiconductor layer may peel off in that region.

Hereinafter, a manufacturing process according to the present invention will be described.

A method for fabricating a semiconductor device according to the present invention includes the steps of: preparing an amorphous semiconductor film, to at least part of which a catalytic element, promoting crystallization, has been added; subjecting the amorphous semiconductor film to a first annealing process, thereby crystallizing at least a portion of the amorphous semiconductor film and obtaining a semiconductor film including a crystalline region; patterning the semiconductor film into a plurality of island-shaped semiconductor layers, each including the crystalline region; selectively adding a gettering element to a portion of each island-shaped semiconductor layer, thereby defining an amorphized gettering region; and subjecting the island-shaped semiconductor layers to a second annealing process, thereby diffusing at least part of the catalytic element to the gettering region in each island-shaped semiconductor layer.

Before the step of subjecting the island-shaped semiconductor layers to the second annealing process is performed, the step of introducing an n-type dopant element and/or a p-type dopant element to a selected portion of the island-shaped semiconductor layer may be performed to define a source or drain region there.

In introducing the catalytic element into the amorphous semiconductor film, a mask having an opening may be defined on the amorphous semiconductor film and then the catalytic element may be introduced through the opening of the mask into a selected area of the amorphous semiconductor film. Thereafter, when the amorphous semiconductor film is subjected to the first annealing process, crystals will be grown laterally or sideward from that area of the amorphous semiconductor film to which the catalytic element was introduced selectively, and a crystalline semiconductor film can be obtained. In this manner, a crystalline semiconductor film of quality, in which crystals have grown almost in the single direction, can be obtained, and the current drivability of the TFT can be further increased.

In the gettering region that has been amorphized by the addition of the gettering element, defects such as dangling bonds become precipitation sites for the catalytic element. That is to say, those defects attract the catalytic element from the channel forming region toward them, thereby trapping the catalytic element at the gettering region. As a result, the concentration of the catalytic element can be reduced significantly in the channel forming region, the source and drain regions and the pn junctions of the semiconductor device. Consequently, the abrupt increase in OFF-state leakage current can be eliminated from the semiconductor device, and a highly reliable semiconductor device can be obtained.

At least one rare gas element, selected from the group consisting of Ar, Kr and Xe, is preferably added as the gettering element by an ion doping process. If any of these rare gas elements is present in the gettering region, then a huge interstitial strain will be created there and defects and precipitation sites will have an intense gettering action on the catalytic element. These effects become even more remarkable if the rare gas element is added by an ion doping process. This is because the doped portion of the active region will lose a greater percentage of the crystallinity and will be amorphized to a higher degree. Also, if any of these elements is present in the amorphous silicon film, the element will suppress the crystal growth of the amorphous silicon film. That is to say, such an element has the function of increasing the length of a latent period (i.e., the time it takes to produce nuclei of crystals) and decreasing the crystal growth rate. Thus, the amorphized gettering region can be kept amorphous without being re-crystallized. As a result, more significant gettering effects are achievable.

An n-type dopant element belonging to Group Vb of the periodic table and a p-type dopant element belonging to Group IIIb of the periodic table may be used as the gettering elements and added by an ion doping process. Then, the gettering action by defects or precipitation sites will prevail over the gettering action by diffusion.

In a preferred embodiment of the inventive manufacturing process, the gettering region can be defined by the doping process step to be performed to form the source and drain regions. Thus, no additional photolithographic, doping or annealing process step needs to be carried out to define the gettering region. That is to say, since the manufacturing process can be simplified, the manufacturing cost of the semiconductor device can be reduced and the yield of the semiconductor devices can be increased.

In the method of the present invention, the n-type dopant element is preferably introduced into the source, drain and gettering regions of an n-channel TFT active region and into the gettering region of a p-channel TFT active region at a doping level of about $1\times10^{19}/cm^3$ to about $1\times10^{21}/cm^3$. On the other hand, the p-type dopant element is preferably introduced into the gettering region of the n-channel TFT active region and into the source, drain and gettering regions of the p-channel TFT active region at a doping level of about $1.5\times10^{19}/cm^3$ to about $3\times10^{21}/cm^3$. By performing the doping process steps at these levels, sufficient gettering efficiency is achievable and the gettering action by the defects or precipitation sites will prevail when the n-type and p-type dopants are introduced in combination.

In the present invention, it is important to not just keep the gettering region amorphized but also get an adequate correlation satisfied by the gettering region and non-gettering regions (i.e., channel forming region and source and drain regions). That is to say, if the gettering region includes an amorphous phase at a greater percentage than the channel forming region, source region or drain region, then sufficient gettering efficiency is ensured. More specifically, the crystallinity (or amorphism) of the gettering region can be effectively evaluated by the Pa/Pc ratio, i.e., the ratio of the TO phonon peak Pa of amorphous Si to the TO phonon peak Pc of crystalline Si in a Raman spectrum.

The catalytic element is preferably at least one element selected from the group consisting of Ni, Co, Sn, Pb, Pd, Fe and Cu. Each of these elements can promote crystallization sufficiently even at a very small dose. Among other things, Ni is most preferred because most significant effects are achieved by adding Ni. The reason is believed to be as follows. Generally speaking, a catalytic element cannot work by itself but can contribute to crystal growth when combined with silicon to produce a silicide. The crystal structure of that silicide is believed to work as a sort of casting mold for an amorphous silicon film being crystallized and thereby promote the crystallization of the amorphous silicon film. When combined with Si, Ni produces a silicide $NiSi_2$ with two Si atoms. $NiSi_2$ has a fluorite-type crystal structure, which is very similar to the diamond structure of single crystalline silicon. In addition, $NiSi_2$ has a lattice constant of 5.406 Å, which is very close to the lattice constant of 5.430 Å of the diamond structure of crystalline silicon. Thus, $NiSi_2$ is the best casting mold to crystallize the amorphous silicon film. For that reason, according to the present invention, Ni is most preferably used as the catalytic element.

If the semiconductor device of the present invention is fabricated by using such a catalytic element, the catalytic element, which was added to promote the crystallization of the amorphous silicon film, will be left in the gettering region of the resultant semiconductor device. The catalytic element has a concentration of at least about $1\times10^{19}/cm^3$ in the gettering region. In the channel forming region, however, the concentration of the catalytic element can be reduced to the range of about $1\times10^{15}/cm^3$ to about $1\times10^{17}/cm^3$. Thus, the concentration of the catalytic element in the gettering region is higher than that of the catalytic element in the channel forming region by two to four orders of magnitude.

After the amorphous silicon film has been crystallized by using the catalytic element, the resultant crystalline semiconductor film is preferably exposed to a laser beam. By exposing the crystalline silicon film to a laser beam, the grain boundary portions and very small residual amorphous portions (i.e., uncrystallized portions) can be processed intensively due to the difference in melting point between the crystalline portions and the amorphous portions.

The crystalline silicon film, which has been crystallized by adding the catalytic element thereto, is made up of columnar crystals and exhibits a single crystalline state inside. Accordingly, when the grain boundary portions are processed upon the exposure to the laser beam, a crystalline silicon film of quality, which is almost completely single crystalline all over the substrate, can be obtained and the crystallinity improves significantly. As a result, the ON-state characteristics of the TFT improve significantly, and therefore, a semiconductor device with increased current drivability is realized.

The n-type dopant element and/or the p-type dopant element that have been added to the active region are preferably activated by the annealing process to be conducted for gettering purposes. If gettering and dopant activation are realized simultaneously by that annealing process, then the number of process steps required can be reduced, the manufacturing process can be simplified, and the manufacturing cost can be reduced eventually.

If the annealing process is carried out for gettering purposes after the gate electrode has been formed, the gate electrode of the TFT is preferably made of a material that is selected from the group consisting of W, Ta, Ti and Mo or an alloy thereof. The annealing process for gettering purposes needs to be carried out at a temperature of at least about 500° C. Accordingly, to ensure good heat resistance, the gate metal is preferably a refractory metal.

Furthermore, in the manufacturing process of the present invention, the second annealing process is preferably carried out in such a manner as to prevent the gettering region, which has been amorphized by the addition of the gettering element or the n-type and p-type dopant elements, from being crystallized (or recovering its crystallinity) as far as the circumstances permit.

If the gettering region were crystallized during the second annealing process that is carried out to diffuse the catalytic element toward the gettering region, then the effects of the present invention could not be achieved fully. For that reason, the second annealing process should be conducted under such conditions that the amorphized gettering region is not crystallized (or does not recover its crystallinity). Then, the gettering action can be taken advantage of fully. As a result, the catalytic element can be diffused toward the gettering region with sufficiently high gettering efficiency all through the second annealing process.

Also, even after subjected to the second annealing process, the gettering region is preferably kept amorphous or at least includes an amorphous phase at a greater percentage, and a crystalline phase at a smaller percentage, than the channel forming region, source region or drain region. Then, the backflow of the catalytic element from the gettering region can be eliminated during subsequent process steps or during the operation of the TFT. As a result, the abnormal increase in OFF-state leakage current will not happen in the semiconductor device, and therefore, a highly reliable semiconductor device can be obtained.

The second annealing process is preferably carried out as a rapid thermal annealing (RTA) process. In an RTA process, the temperature can be raised or lowered instantaneously. Accordingly, even though this process is performed at an elevated temperature, the heating process can be performed at a desired temperature for an intended amount of time without extending the heating time unnecessarily. Thus, if a rapid thermal annealing process is performed as the second annealing process of the present invention, the annealing process can be precisely controllable and the gettering region can be maintained in its desired state. Specifically, the RTA process may be carried out as a lamp annealing as is done normally. Alternatively, the substrate may be heated or cooled instantaneously by blowing a high-temperature gas against the surface of the substrate.

The efficiency at which the catalytic element is diffused toward the gettering region can be evaluated by the following methods, for example.

It is believed that nickel, a catalytic element, should bond to Si to produce a nickel silicide ($NiSi_x$) during its diffusion from the channel forming region toward the gettering region due to the addition of a gettering element to the gettering region. This nickel silicide ($NiSi_x$) is selectively removable by etching away a silicon dioxide film with a mixture including about 7.13% of hydrogen ammonium fluoride ($NH_4HF_2$) and about 15.4% of ammonium fluoride ($NH_4F$) (e.g., LAL 500 produced by Stella Chemifa Corporation) and by immersing the substrate in an etchant (FPM solution) that was obtained by mixing about 50% of HF, about 33% of $H_2O_2$ and $H_2O$ at a volume ratio of about 45:72:4500 for about forty minutes.

Openings are formed by the removal of $NiSi_x$ and observable as black points with an optical microscope in a transmission mode. Thus, the greater the number of those black points observed, the greater the number of catalyst atoms (i.e., nickel atoms in this case) that have been diffused toward the gettering region would be (i.e., the higher the gettering efficiency should be).

Embodiment 1

Hereinafter, a first specific preferred embodiment of the present invention will be described with reference to FIGS. 1A through 1G.

The first preferred embodiment of the present invention is a method for fabricating an n-channel TFT on a glass substrate. FIGS. 1A through 1G are cross-sectional views illustrating respective process steps for fabricating the n-channel TFT in the order of the manufacturing process. Only a single TFT is illustrated in FIG. 1G. However, a huge number of TFTs are actually formed on the same substrate.

First, as shown in FIG. 1A, an undercoat insulating film 12 of silicon dioxide or silicon nitride is deposited to a thickness of about 50 nm to about 300 nm on a glass substrate 11. This undercoat insulating film 12 is provided to prevent the diffusion of impurities from the glass substrate 11. Thereafter, an intrinsic (i-type) amorphous silicon (a-Si) film 13 is deposited to a thickness of about 20 nm to about 80 nm on the undercoat insulating film 12.

Next, to crystallize the a-Si film 13, a catalytic element is added to the a-Si film 13 and then the a-Si film 13 is annealed. Specifically, first, the a-Si film 13 is spin-coated with an aqueous solution (e.g., an aqueous solution of nickel acetate), including about 10 ppm of catalytic element (e.g., nickel in this preferred embodiment) when converted to an equivalent weight, thereby forming a catalytic element containing layer 14. The catalytic element that may be used in this process step is at least one element that is selected from the group consisting of iron (Fe), nickel (Ni), cobalt (Co), tin (Sn), lead (Pb), ruthenium (Ru), rhodium (Rh), palladium (Pd), osmium (Os), iridium (Ir), platinum (Pt), copper (Cu) and gold (Au). The dose of the catalytic element to be added is very small. The concentration of the catalytic element on the surface of the a-Si film 13 is controlled by total reflection x-ray fluorometry (TRXRF). In this preferred embodiment, the concentration of the catalytic element on the surface of the a-Si film 13 is controlled to about $7 \times 10^{12}/cm^3$.

In this preferred embodiment, nickel is added to the a-Si film 13 by the spin coating technique. Alternatively, a thin-film of the catalytic element (e.g., a nickel thin film in this preferred embodiment) may be deposited by an evaporation or sputtering process on the a-Si film 13.

Next, the substrate that has been processed in this manner is annealed within an inert atmosphere (e.g., within a nitrogen gas). This annealing process is preferably carried out at a temperature of about 550° C. to about 600° C. for approximately 30 minutes to approximately 4 hours (e.g., at about 580° C. for about one hour). During this annealing process, the nickel atoms 14 that have been added to the surface of the a-Si film 13 diffuse into the a-Si film 13 and bond to Si to produce a nickel silicide there. Thus, the a-Si film 13 is going to be crystallized from the silicide produced as nuclei. As a result, the a-Si film 13 is crystallized to be a crystalline silicon film 13a. In this preferred embodiment, the a-Si film 13 is crystallized by a furnace annealing process. Alternatively, the a-Si film 13 may also be crystallized by an RTA system that uses a lamp as a heat source.

Figure 1B:
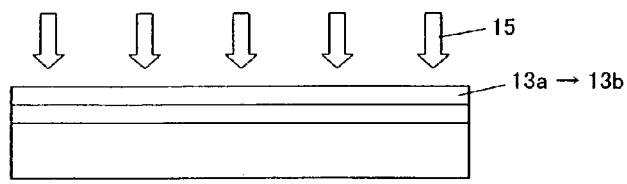

Subsequently, as shown in FIG. 1B, the crystalline silicon film 13a is exposed to laser beams 15, thereby obtaining a crystalline silicon film 13b with improved crystallinity. Examples of preferred laser beams include an XeCl excimer laser beam (with a wavelength of about 308 nm and a pulse width of about 40 nsec) and a KrF excimer laser beam (with a wavelength of about 248 nm). The laser beams are focused onto the surface of the substrate 11 so as to form elongated spots there. The substrate is preferably re-crystallized by sequentially scanning the substrate vertically to the direction in which the laser beam spots are elongated. In this case, if the substrate is scanned such that the laser beams partially overlap with each other, a given spot of the crystalline silicon film 13a is exposed to the laser beams a number of times, thus increasing the uniformity in crystallinity. In this manner, the crystalline silicon film 13a that has been obtained by the solid-phase crystallization process can reduce its crystal imperfections through the melting and solidification process using the laser beams and can be the crystalline silicon film 13b with improved crystallinity.

Figure 1C:
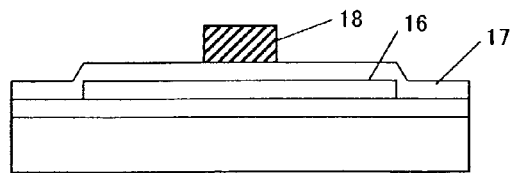

Thereafter, excessive portions of the crystalline silicon film 13b are removed, thereby electrically isolating respective element regions (to be active regions) from each other. As a result, an island-shaped crystalline silicon film 16 to be an active region (including source/drain regions and a channel forming region) for a TFT is obtained as shown in FIG. 1C. As used herein, each "active regions" refers to an island-shaped semiconductor layer that includes the source/drain regions, channel forming region and gettering region. According to the present invention, at least one thin-film transistor is formed in each active region.

Next, a gate insulating film 17 is deposited over all of these island-shaped crystalline silicon films 16. A silicon dioxide film with a thickness of about 20 nm to about 150 nm is preferably deposited as the gate insulating film. In this preferred embodiment, a silicon dioxide film is deposited to a thickness of about 100 nm.

Thereafter, a conductive film is deposited on the gate insulating film 17 by a sputtering or CVD process and then patterned into gate electrodes 18 as shown in FIG. 1C. The conductive film may be a refractory metal such as W, Ta, Ti or Mo or an alloy thereof and is preferably deposited to a thickness of about 300 nm to about 600 nm. In this preferred embodiment, the gate electrodes 18 are made of a Ta film that includes nitrogen at a very low percentage and that has been deposited to a thickness of about 450 nm.

Figure 1D:
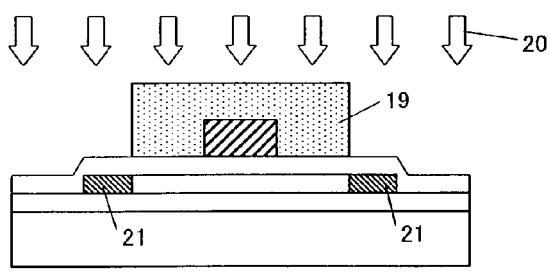

Subsequently, as shown in FIG. 1D, a photoresist mask 19 is defined on the gate insulating film 17 so as to cover the gate electrodes 18. However, the island-shaped semiconductor layer 16 is not fully overlapped with the mask 19 and outer edge portions 21 of the TFT active region 16 are located outside of the mask 19. In this state, ions 20 of a rare gas element (e.g., Ar in this preferred embodiment) are implanted from over the substrate 11 into the entire surface of the substrate 11. By performing this process step, the ions 20 of the rare gas element are implanted into the outer edge portions 21 of the TFT active region 16, thereby defining amorphized gettering regions 21. The rare gas element is not introduced into the other portion of the active region 16 that is covered with the mask 19. The rare gas element may be at least one element that is selected from the group consisting of Ar, Kr and Xe. The conditions of this doping process are preferably controlled such that the rare gas element will have a concentration of about $1\times10^{19}$/cm$^3$ to about $3\times10^{21}$/cm$^3$ in the gettering regions 21.

Figure 1E:
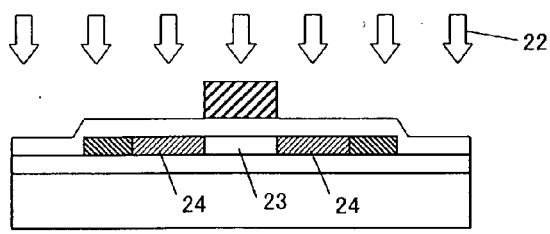

After the mask 19 has been removed, ions 22 of an n-type dopant (e.g., phosphorus) are heavily implanted into the active region 16 with the gate electrode 18 used as a mask as shown in FIG. 1E. By performing this process step, the portions 24 of the TFT active region 16 that are not covered with the gate electrode 18 are heavily doped with the phosphorus ions 22. These phosphorus-doped portions 24, other than the gettering regions 21, will be source/drain regions for the TFT in the end. On the other hand, the non-phosphorus-doped portion 23 that is masked with the gate electrode 18 will be a channel forming region for the TFT in the end.

Figure 1F:
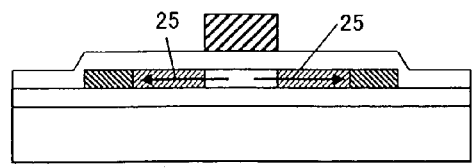
Figure 1G:
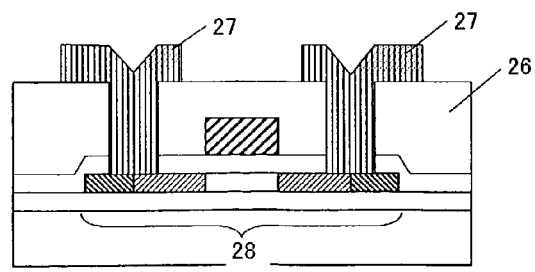

Subsequently, the substrate is annealed again within an inert atmosphere (e.g., a nitrogen gas), thereby performing a gettering treatment as shown in FIG. 1F. Specifically, the crystal defects, which have been created in the gettering regions 21 outside of the source/drain regions 24 due to the amorphization of the crystalline silicon film 16 by the implantation of the Ar ions 20, or the heavily doped Ar ions 20 themselves, diffuse the nickel atoms from the channel forming region 23 by way of the source/drain regions 24 toward the gettering regions 21 as indicated by the arrows 25 in FIG. 1F. In this manner, the catalytic element, remaining in the channel forming region 23 of the TFT active region 16 or around the pn junctions between the channel forming region 23 and the source/drain regions 24, can be removed by the gettering treatment. As a result, the unwanted increase in leakage current, which would otherwise be caused by the precipitation of the catalytic element, can be minimized.

In this manner, in various preferred embodiments of the present invention, the gettering regions 21 are included in the active region 16 and are provided separately from the source/drain regions 24. These gettering regions 21 are separated from the pn junctions between the channel forming region 23 and the source/drain regions 24. Thus, no catalytic element promoting the crystallization would be left in the pn junctions to cause the leakage current there.

Furthermore, the gettering regions 21 are located off the current path between the source/drain regions. Accordingly, even if the electrical resistance of the gettering regions 21 increases as a result of the amorphization, the ON-state resistance of the TFT will not increase.

As a result of the second annealing process, the catalytic element is introduced the gettering regions 21. Consequently, the gettering regions 21 include the catalytic element at a concentration of at least about $1\times10^{19}$/cm$^3$.

A normal annealing furnace may be used to perform this annealing process. However, an RTA system is preferably used. More particularly, an RTA system that can blow a high-temperature inert gas against the surface of the substrate and that can raise or lower the temperature instantaneously is preferably used. Specifically, in that case, the RTA process may be performed at a temperature of about 550° C. to about 750° C. for approximately 30 seconds to approximately 10 minutes. The substrate is preferably heated and cooled at a rate of about 100° C./min or more.

It should be noted that the n-type dopant (phosphorus) 22 that has been introduced into the source/drain regions 24 is also activated by this annealing process. As a result, the sheet resistance of the source/drain regions 24 decreases to about 2 kΩ/☐ or less. However, since the gettering regions 21 have been amorphized to a great degree, the gettering regions 21 can be kept amorphized even after this second annealing process.

In this manner, according to the present invention, the annealing process is carried out such that the source/drain regions 24, which may be partially amorphized due to the addition of phosphorus, have their crystallinity recovered sufficiently but that the gettering regions 21 are kept amorphized.

After the second annealing process was finished, the Pa/Pc ratio, which is the ratio of the TO phonon peak Pa of amorphous Si to the TO phonon peak Pc of crystalline Si in a Raman spectrum, was measured on the channel forming region 23 and gettering regions 21 by a laser Raman spectroscopy. As a result, the Pa/Pc ratio of the gettering regions 21 was greater than that of the channel forming region 23. When a transparent glass substrate is used as in this preferred embodiment, this measurement may be performed from under the back surface of the substrate. Since no high-temperature process is carried out after the RTA process is over, the amorphous state of the gettering regions 21 can be maintained even after the TFT is completed.

Thereafter, as shown in FIG. 1G, an interlevel dielectric film 26 of silicon dioxide or silicon nitride is deposited over the substrate and then contact holes are formed through the interlevel dielectric film 26. Subsequently, a metal material is deposited over the substrate and then patterned into the desired shape, thereby forming electrodes and interconnects 27 for the TFT on the interlevel dielectric film 26.

Finally, the substrate is annealed again at about 350° C. for approximately one hour within a hydrogen atmosphere at the atmospheric pressure to complete the TFT 28 shown in FIG. 1G. If necessary, the TFT 28 may be coated with a passivation film of silicon nitride, for example, to protect the TFT 28 from environmental contamination. In this manner, a semiconductor device including a thin-film transistor is obtained.

The semiconductor device of this preferred embodiment is a top gate type in which the gate electrode is located over the semiconductor layer. However, the present invention is not limited to this specific preferred embodiment. Rather the present invention is also applicable for use in a bottom gate type in which the gate electrode is located under the semiconductor layer and any other type of transistor.

Furthermore, in the preferred embodiment described above, silicon is used as an exemplary semiconductor. However, the present invention is not limited to this specific preferred embodiment. Thus, any other type of semiconductor material may also be used in the present invention. Also, the base substrate for the semiconductor layer does not have to be made of glass but may also be a plastic substrate, a non-flat insulator, or a semiconductor substrate including an interlevel dielectric film thereon.

As used herein, the "semiconductor device" may refer to not only a single TFT as a switching element but also a structure of any other bigger scale that utilizes the properties of the semiconductor (such as an active matrix substrate and a three-dimensional LSI) as well.

Embodiment 2

Hereinafter, a second specific preferred embodiment of the present invention will be described.

The second preferred embodiment of the present invention is a method of fabricating a CMOS circuit, in which an n-channel TFT and a p-channel TFT are arranged as a complementary pair, on a glass substrate as a peripheral driver for an active-matrix-addressed liquid crystal display or any other common thin-film integrated circuit.

FIGS. 2A through 2I are cross-sectional views illustrating respective process steps for fabricating TFTs according to the second preferred embodiment of the present invention. The manufacturing process is carried out in the illustrated order.

Figure 2A:
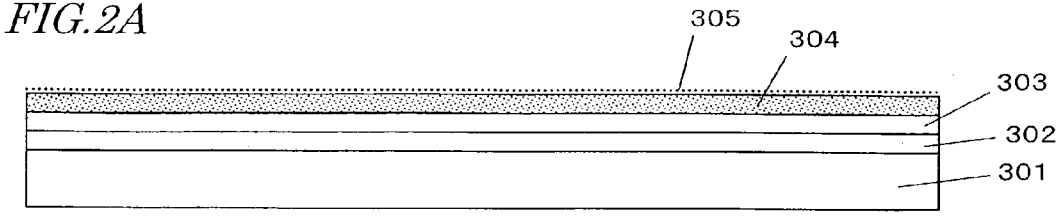
FIGS. 2A through 2I are cross-sectional views illustrating respective process steps for fabricating a CMOS circuit according to a second specific preferred embodiment of the present invention.

First, as shown in FIG. 2A, a substrate 301 of low-alkali glass or quartz is prepared. In this preferred embodiment, a low alkali glass substrate 301 is used. In this process step, the substrate 301 may be preheated to a temperature that is about 10° C. to about 20° C. lower than the glass strain point. On the surface of the substrate 301 on which TFTs should be formed, an undercoat film of silicon dioxide, silicon nitride or silicon oxynitride is deposited to prevent the diffusion of impurities from the substrate 301. In this preferred embodiment, a silicon oxynitride film is deposited as a first undercoat film 302 by a plasma CVD process using material gases of $SiH_4$, $NH_3$ and $N_2O$, and then another silicon oxynitride film is deposited thereon as a second undercoat film 303 by the same plasma CVD process using the material gases of $SiH_4$ and $N_2O$. In this process step, the first undercoat film 302 (i.e., the lower silicon oxynitride film) may have a thickness of about 25 nm to about 200 nm (e.g., about 100 nm) and the second undercoat film 303 (i.e., the upper silicon oxynitride film) may have a thickness of about 25 nm to about 300 nm (e.g., 100 nm). In this preferred embodiment, the two-layered undercoat film 302 and 303 is used. However, a single silicon dioxide film, for example, may also be used as an alternative undercoat film.

Thereafter, a silicon film having an amorphous structure (i.e., an a-Si film 304) is deposited thereon to a thickness of about 20 nm to about 150 nm (preferably about 30 nm to about 80 nm) by a known process such as a plasma CVD process or a sputtering process. In this preferred embodiment, an amorphous silicon film is deposited to a thickness of about 50 nm by a plasma CVD process. Also, the undercoat films 302 and 303 and the amorphous silicon film 304 may be formed by the same deposition process and may be deposited continuously. In that case, the undercoat film 303 deposited is never exposed to the air and should not be contaminated with impurities in the air. As a result, the variation in the characteristic (e.g., threshold voltage) of the TFTs to be formed can be minimized.

Subsequently, a catalytic element (e.g., nickel in this preferred embodiment) 305 is added at a very low dose onto the surface of the a-Si film 304. The nickel atoms 305 may be introduced by retaining a nickel solution on the a-Si film 304, uniformly spreading the nickel solution over the substrate 301 with a spinner and then drying the solution. In this preferred embodiment, nickel acetate is used as a solute, water is used as a solvent and the concentration of nickel in the solution is adjusted to about 10 ppm.

In the state shown in FIG. 2A, the concentration of nickel on the surface of the a-Si film 304 measured about $7 \times 10^{12}/cm^2$ by a total reflection x-ray fluorometry (TRXRF). In this preferred embodiment, the catalytic element is added to the a-Si film 304 by coating the surface of the a-Si film 304 with a solution containing the catalytic element. Alternatively, the catalytic element may also be introduced by some gas-phase method such as a plasma doping process, an evaporation process or a sputtering process. However, the method using a solution of the catalytic element is preferred because the dose of the catalytic element to be added can be controlled easily (e.g., the catalytic element may be easily added at a very low dose, for example).

Figure 2B:
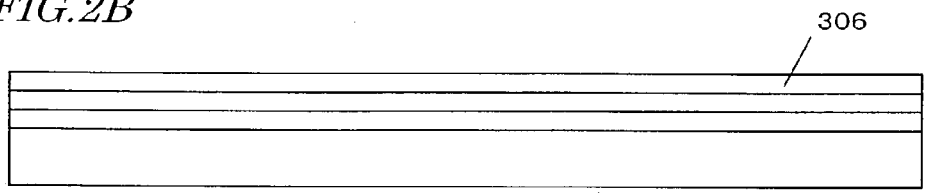

Next, the a-Si film 304 is annealed within an inert atmosphere (e.g., a nitrogen gas) at a temperature of about 520° C. to about 600° C. for approximately one hour to approximately eight hours. In this preferred embodiment, the annealing process is performed at about 580° C. for approximately one hour. During this annealing process, the nickel atoms 305 that have been added to the surface of the a-Si film 304 diffuse into the a-Si film 304 and bond to Si to produce a nickel silicide there. Thus, the a-Si film 304 is going to be crystallized from the nickel silicide as nuclei. As a result, the a-Si film 304 is crystallized to be a crystalline silicon film 306 as shown in FIG. 2B.

Figure 2C:
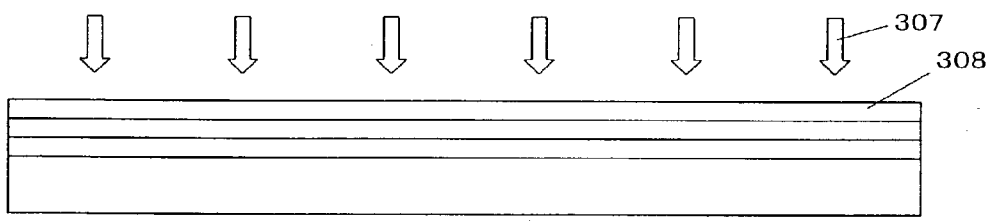

Thereafter, as shown in FIG. 2C, the crystalline silicon film 306 is exposed to, and melted and re-crystallized by, laser beams 307 so as to recover its crystallinity. In this process step, XeCl excimer laser beams (with a wavelength of about 308 nm and a pulse width of about 40 nsec) are irradiated at an energy density of about 250 mJ/cm$^2$ to about 500 mJ/cm$^2$ (e.g., about 400 mJ/cm$^2$). The laser beams are focused onto the surface of the substrate 301 so as to form elongated beam spots having sizes of about 150 mm by about 1 mm. The substrate 301 is sequentially scanned at a step width of about 0.05 mm vertically to the direction in which the beam spots are elongated. That is to say, a given point on the crystalline silicon film 306 is exposed to the laser beams 20 times in total. In this manner, the crystalline silicon film 306 that has been obtained by the solid-phase crystallization process can reduce its crystal imperfections through the melting and solidifying process caused by the laser beam exposure and can be a crystalline silicon film 308 with improved crystallinity. Examples of laser diodes for use in this process step include KrF excimer lasers, XeCl excimer lasers, YAG lasers and YVO$_4$ lasers of a pulsed type or a continuous wave type. The crystallization conditions may be appropriately defined by the designer.

Subsequently, excessive portions of the crystalline silicon film 308 are removed, thereby electrically isolating respective element regions (to be TFT active regions) from each other. As a result, an island-shaped crystalline silicon film 309n to be the active region of an n-channel TFT and another island-shaped crystalline silicon film 309p to be the active region of a p-channel TFT are formed as shown in FIG. 2D.

In this process step, boron may be introduced as a p-type dopant element into the entire active regions of the n-channel TFT and p-channel TFT to control the threshold voltages of the transistors. Boron may have a concentration of about 1×10$^{16}$/cm$^3$ to about 5×10$^7$/cm$^3$. The boron atoms may be introduced by an ion implantation process. Alternatively, the amorphous silicon film may have been doped with boron during the deposition process thereof.

Next, a silicon dioxide film is deposited as a gate insulating film 310 to a thickness of about 20 nm to about 150 nm (e.g., about 100 nm in this preferred embodiment) over the crystalline silicon films 309n and 309p to be the active regions. The silicon dioxide film 310 may be formed by using tetraethoxy-ortho silicate (TEOS) as a material and decomposing and depositing the TEOS and oxygen by an RF plasma CVD process. During the deposition process, the temperature of the substrate is preferably controlled to about 150° C. to about 600° C. (preferably about 300° C. to about 450° C.). After the gate insulating film 310 has been deposited, the substrate may be annealed at a temperature of about 500° C. to about 600° C. for approximately one hour to approximately four hours within an inert atmosphere to improve the bulk property of the gate insulating film 310 and improve the property of the interface between the crystalline silicon film and the gate insulating film 30. The gate insulating film 310 does not have to be a silicon dioxide film but may also be any other silicon-containing insulating film having a single-layer or multilayer structure.

Figure 2D:
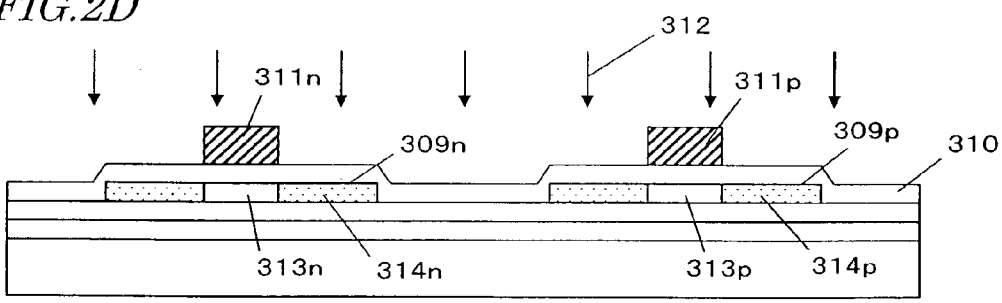

Next, as shown in FIG. 2D, a refractory metal is deposited by a sputtering process on the gate insulating film 310 and then patterned into gate electrodes 311n and 311p. The refractory metal may be an element that is selected from the group consisting of tantalum (Ta), tungsten (W), molybdenum (Mo) and titanium (Ti), an alloy including one of these elements as its main ingredient, or an alloy including at least two of these elements (such as an Mo—W alloy or an Mo—Ta alloy). The conductive layer may be made of tantalum nitride (TaN), tungsten nitride (WN), titanium nitride (TiN) or molybdenum nitride (MoN). Alternatively, tungsten silicide, titanium silicide or molybdenum silicide may also be used. In this preferred embodiment, the conductive layer is made of tungsten (W) and has a thickness of about 300 nm to about 600 nm (e.g., 450 nm). In this case, the impurity concentration is preferably decreased to reduce the resistivity. When the oxygen concentration was reduced to about 30 ppm or less, a specific resistivity of about 20 μΩcm or less was achieved.

Next, ions 312 of an n-type dopant (e.g., phosphorus in this preferred embodiment) are lightly implanted into the active regions with the gate electrodes 311n and 311p used as masks. In this process step, using phosphine (PH$_3$) as a doping gas, phosphorus ions are implanted at an acceleration voltage of about 60 kV to about 90 kV (e.g., about 80 kV) and at a dose of about 1×10$^{12}$ cm$^{-2}$ to about 1×10$^{14}$ cm$^{-2}$ (e.g., about 2×10$^{13}$ cm$^{-2}$). By performing this process step, portions of the island-shaped crystalline silicon film 309n that are not covered with the gate electrode 311n become lightly P-doped regions 314n, while portions of the island-shaped crystalline silicon film 309p that are not covered with the gate electrode 311p become lightly P-doped regions 314p. On the other hand, the non-doped regions 313n and 313p that are masked with the gate electrodes 311n and 311p will eventually be channel forming regions 313n and 313p for the n-channel TFT and p-channel TFT, respectively, as shown in FIG. 2D.

Figure 2E:
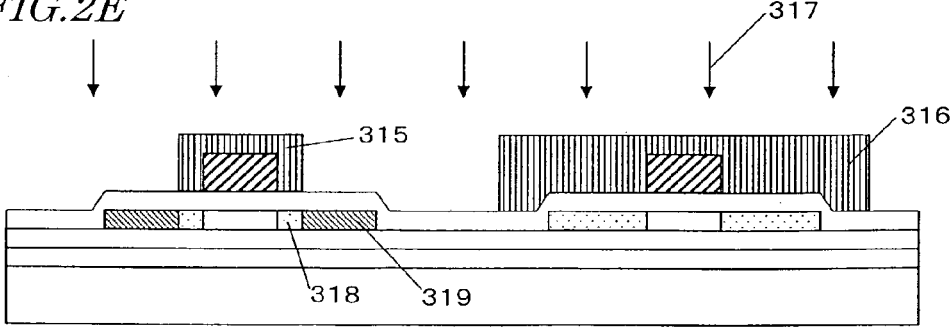

Subsequently, as shown in FIG. 2E, a photoresist pattern is defined on the gate insulating film 310 so as to cover the gate electrode 311n of the n-channel TFT barely and the active region 309p of the p-channel TFT completely. A portion of the photoresist pattern covering the gate electrode 311n will be referred to herein as a "resist masks" 315 while another portion of the photoresist pattern covering the active region 309p will be referred to herein as a "resist mask" 316. Thereafter, ions 317 of an n-type dopant (e.g., phosphorus in this preferred embodiment) are implanted into the non-masked portions 319 of the active region 309n by using the resist masks 315 and 316. In this process step, using phosphine (PH$_3$) as a doping gas, phosphorus ions are implanted at an acceleration voltage of about 60 kV to about 90 kV (e.g., about 80 kV) and at a dose of about 1×10$^{15}$ cm$^{-2}$ to about 1×10$^{16}$ cm$^{-2}$ (e.g., about 5×10$^{15}$ cm$^{-2}$). By performing this process step, ions 317 of the n-type dopant (i.e., phosphorus) are heavily implanted into the portions 319, which will eventually be source/drain regions for the n-channel TFT. On the other hand, other portions of the active region 309n, which are covered with the resist mask 315 and to which the phosphorus ions 317 have not been introduced, will be left as lightly P-doped regions 314n to be lightly doped drain (LDD) regions 318. By providing the LDD regions 318 in this manner, the intensity of the electric field around the pn junctions between the channel forming region and source/drain regions can be controlled appropriately, the OFF-state leakage current of the TFT can be minimized, and deterioration due to hot carriers can be suppressed, thus increasing the reliability of the TFT. In this process step, the phosphorus ions 317 are not introduced into the active region 309p for the p-channel TFT at all, because the active region 309p is fully covered with the mask 316.

Figure 2F:
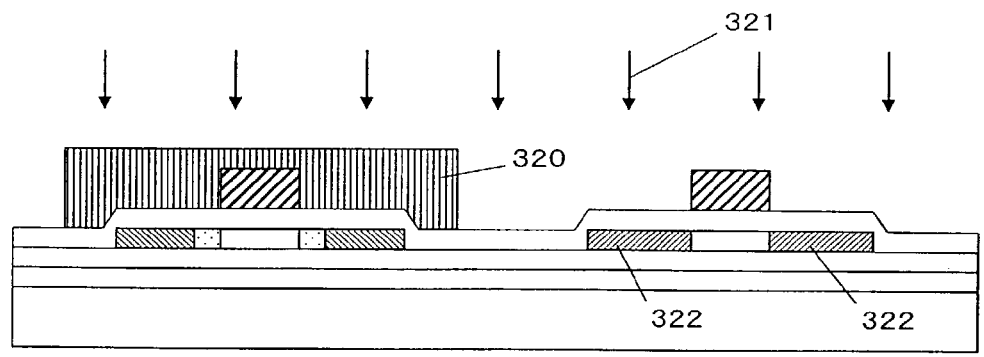

Thereafter, the resist masks 315 and 316 are removed and then another resist mask 320 is defined so as to cover the active region 309n of the n-channel TFT this time as shown in FIG. 2F. In such a state, by using the resist mask 320 and the gate electrode 311p of the p-channel TFT as a doping mask, ions 321 of a p-type dopant (e.g., boron in this preferred embodiment) are implanted into the active region 310p of the p-channel TFT. In this process step, using diborane ($B_2H_6$) as a doping gas, boron ions are implanted at an acceleration voltage of about 40 kV to about 80 kV (e.g., about 65 kV) and at a dose of about $1\times10^{15}$ cm$^{-2}$ to about $1\times10^{16}$ cm$^{-2}$ (e.g., about $5\times10^5$ cm$^{-2}$). By performing this process step, ions 321 of the p-type dopant (i.e., boron) are heavily implanted into the portions 322, which will eventually be source/drain regions for the p-channel TFT. On the other hand, the other portion of the active region 309p, which is covered with the gate electrode 311p and to which the boron ions 321 have not been introduced, will be a channel forming region 313p for the p-channel TFT. In this process step, the boron ions 321 are not introduced into the active region 309n for the n-channel TFT at all, because the active region 309n is fully covered with the mask 320.

In this manner, the n-type dopant element and the p-type dopant element are introduced selectively by covering the non-selected regions with the photoresist. As a result, n-type heavily doped regions 319 and p-type heavily doped regions 322 are formed and the n-channel TFT and the p-channel TFT can be obtained as shown in FIG. 2I. In the preferred embodiment described above, the n-type dopant is introduced first, and then the p-type dopant is introduced. However, these dopants do not have to be introduced in this order but may be added in the reverse order.

Figure 2G:
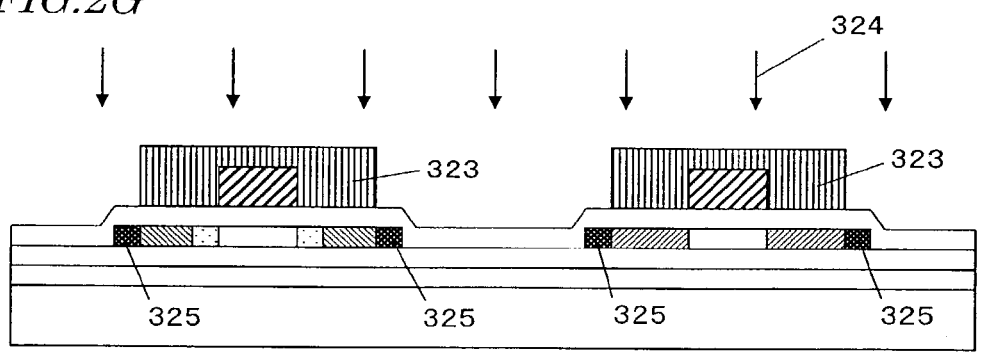

Subsequently, the resist mask 320 is removed and then another resist mask 323 is provided so as to cover the gate electrodes 311n and 311p of the n-channel and p-channel TFTs as shown in FIG. 2G. This resist mask 323 is defined so as to expose the outer edges of the active regions 309n and 309p of the n-channel and p-channel TFTs.

In such a state, ions 324 of a rare gas element (e.g., Ar in this preferred embodiment) are implanted from over the substrate into the entire surface of the substrate as shown in FIG. 2G. By performing this process step, the ions 324 of the rare gas element are introduced into the exposed portions of the TFT active regions, thereby forming gettering regions 325 around the outer edges of the active regions 309n and 309p of the n-channel and p-channel TFTs.

The rare gas element to be introduced may be at least one element that is selected from the group consisting of Ar, Kr and Xe. The ions 324 of the rare gas element are not implanted at all into the other portions of the active regions that are covered with the resist mask 323.

In this preferred embodiment, using 100% Ar as a doping gas, the Ar ions 324 are implanted at an acceleration voltage of about 60 kV to about 90 kV (e.g., about 80 kV) and at a dose of about $1\times10^{15}$ cm$^{-2}$ to about $1\times10^{16}$ cm$^{-2}$ (e.g., about $1\times10^{15}$ cm$^{-2}$). When the ion implantation process is carried out under these conditions, the gettering regions 325 will include the rare gas element at a concentration of about $1\times10^{19}$/cm$^3$ to about $3\times10^{21}$/cm$^3$. As a result of this rare gas doping process, the gettering regions are amorphized.

In this preferred embodiment, the respective components are laid out such that the ratio of the area S of the gettering region 325 to the channel width W of the TFT (which will be referred to herein as an "S/W ratio") is approximately equal to one. Normally, an n-channel TFT and a p-channel TFT have mutually different degrees of current drivability. In this preferred embodiment, the current drivability of the n-channel TFT is at least twice greater than that of the p-channel TFT. Accordingly, to make similar amounts of currents flow through the n-channel and p-channel TFTs, the p-channel TFT needs to have an increased channel width. For example, if the active region 309n of the n-channel TFT has a channel width W of about 20 μm, then the active region 309p of the p-channel TFT should have a channel width W of about 40 μm. In that case, the area of the gettering region 325 included in the active region of the p-channel TFT needs to be about twice greater than that of the gettering region 325 included in the active region of the n-channel TFT. Then, the n-channel and p-channel TFTs will have approximately equal gettering efficiencies in their active region.

Subsequently, after the resist mask 323 has been removed, the substrate is annealed in an inert atmosphere (e.g., a nitrogen gas). In this preferred embodiment, an RTA process is carried out using an RTA system, which rapidly heats and cools the substrate in a short time by blowing a nitrogen gas against the surface of the substrate within a nitrogen atmosphere. Specifically, the substrate is preferably annealed at a temperature of about 550° C. to about 750° C. for about 30 seconds to about 10 minutes, more preferably at a temperature of about 600° C. to about 700° C. for about 1 minute to about 7 minutes. In this preferred embodiment, the RTA process is carried out at about 650° C. for about 5 minutes. The substrate is preferably heated and cooled at a rate of at least about 100° C./min, e.g., about 200° C./min in this preferred embodiment.

Figure 2H:
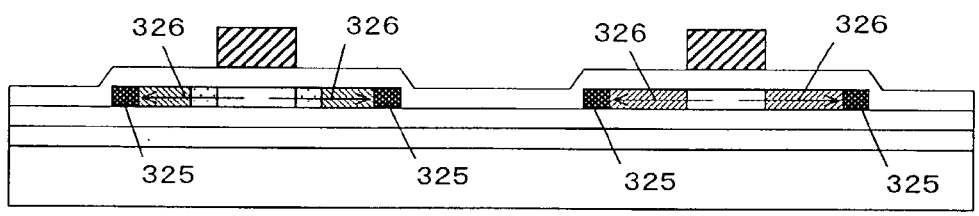
Figure 2I:
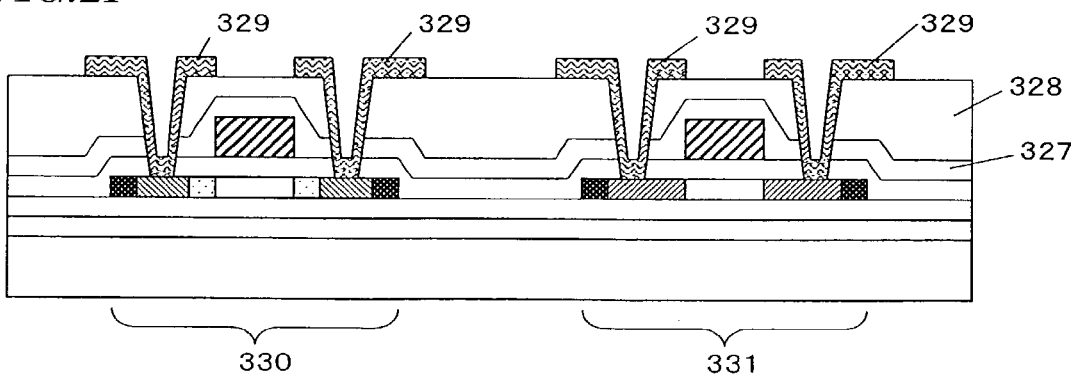

By performing this annealing process, the gettering action advances as shown in FIG. 2H. Specifically, in the active region 309n of the n-channel TFT, the crystal defects, which have been created in the gettering regions 325 outside of the source 7 drain regions 319 due to the amorphization of the crystalline silicon film 308 by the implantation of the Ar ions 324, or the heavily doped Ar ions 324 themselves, diffuse the nickel atoms from the channel forming region 313n toward the gettering regions 325 by way of the LDD regions 318 and the source/drain regions 319 as indicated by the arrows 326 in FIG. 2H. In the active region 309p of the p-channel TFT on the other hand, the crystal defects, which have been created in the gettering regions 325 outside of the source/drain regions 322 due to the amorphization of the crystalline silicon film 308 by the implantation of the Ar ions 324, or the heavily doped Ar ions 324 themselves, diffuse the nickel atoms from the channel forming region 313p toward the gettering regions 325 by way of the source/drain regions 322 as indicated by the arrows 326 in FIG. 2H.

As a result of this annealing process, the nickel atoms are introduced into the gettering regions 325, and the concentration of nickel in the gettering regions 325 increases to about $1\times10^{19}$/cm$^3$ or more.

In this manner, according to this preferred embodiment, the catalytic element, remaining in the channel forming region of the TFT active region, the junctions between the channel forming region and the source and drain regions and the junctions between the channel forming region and the LDD regions, is removable by the gettering action. Thus, the abnormal increase in OFF-state leakage current, caused by the precipitation of the catalytic element, can be minimized.

The n-type dopant (phosphorus) 317 that has been introduced into the source/drain regions 319 and LDD regions 318 of the n-channel TFT and the p-type dopant (boron) 321 that has been introduced into the source/drain regions 322 of the p-channel TFT are also activated by this annealing process. As a result, the source/drain regions 319 of the n-channel TFT will have a sheet resistance of about 400 $\Omega/\square$ to about 700 $\Omega/\square$ and the LDD regions 318 thereof will have a sheet resistance of about 30 k$\Omega/\square$ to about 60 k$\Omega/\square$. On the other hand, the source/drain regions 322 of the p-channel TFT will have a sheet resistance of about 1 k$\Omega/\square$ to about 1.5 k$\Omega/\square$ In this preferred embodiment, in the active region of the n-channel and p-channel TFTs, the gettering regions are provided separately from the source/drain regions. Thus, even if the electrical resistivity should increase in a portion of the TFT active region due to the amorphization caused by the rare gas element introduced, the transistor characteristics would not be affected by such an increase in electrical resistivity.

The RTA process described above is normally carried out as a lamp annealing process by using a tungsten-halogen lamp or an arc lamp, for example. However, when such a lamp annealing system is used, the temperature distribution in the substrate being heated or cooled likely becomes non-uniform due to a variation in the illuminance of the lamp or the transportation of the substrate on a conveyer. For that reason, it is difficult to anneal a glass wafer of a big size (e.g., on the order of several meters) uniformly enough by such a technique. Thus, the substrate is likely deformed thermally (e.g., warps or chips). In the present invention, not just such a deformation of the substrate must be eliminated but also the temperature distribution in the substrate needs to be highly uniform. This is because if the temperature distribution is not so uniform, then the catalytic element might be left at a non-negligible concentration in some portions of the active region or the gettering regions might be re-crystallized. In view of these considerations, an RTA system for use in this preferred embodiment of the present invention blows a high-temperature inert gas (such as a nitrogen gas) onto the surface of the substrate uniformly.

Figure 12:
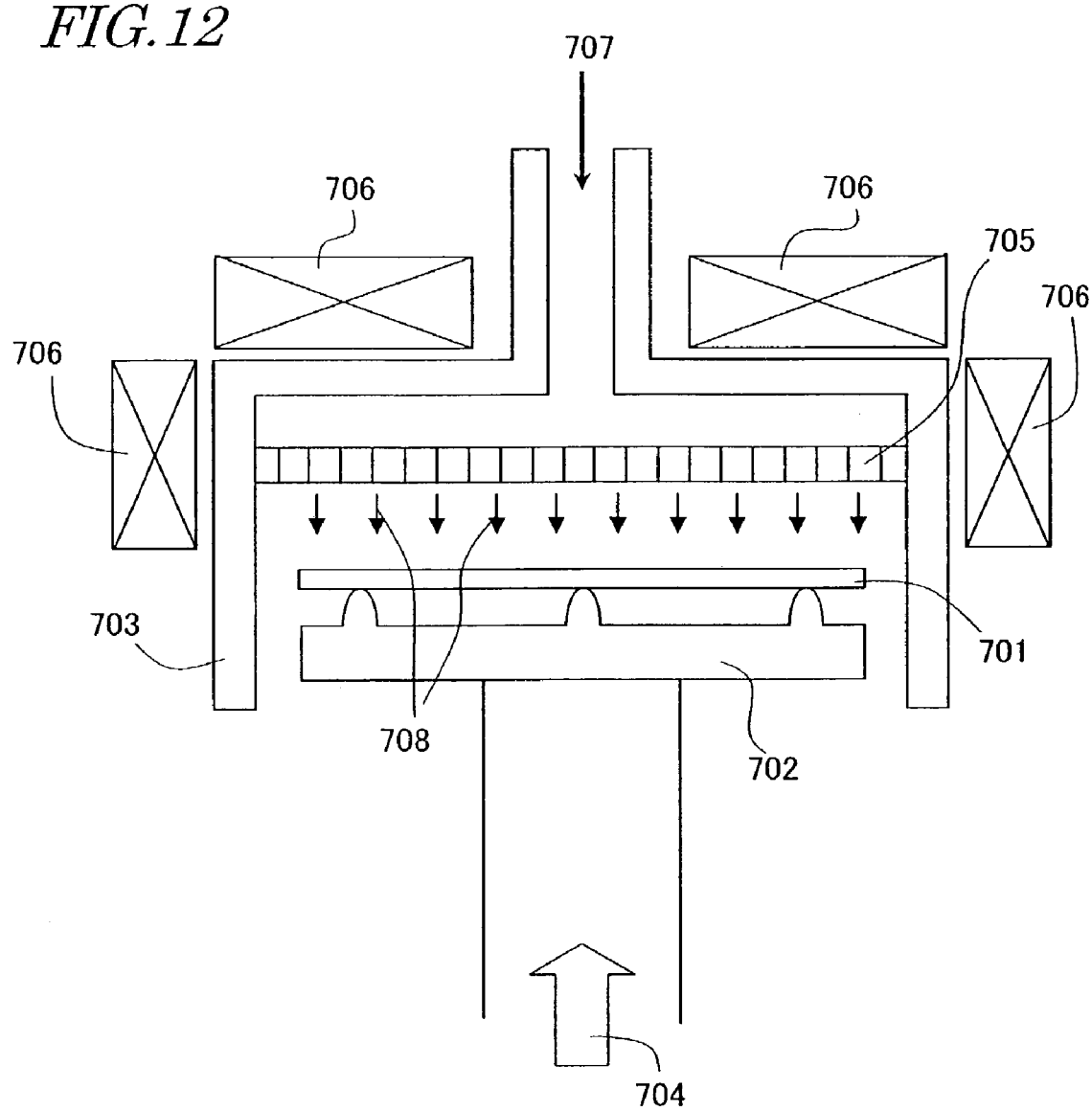
FIG. 12 is a cross-sectional view schematically illustrating a rapid thermal annealing system that can be used effectively in various preferred embodiments of the present invention.

FIG. 12 schematically illustrates a rapid thermal annealing system that can be used effectively in this preferred embodiment.

As shown in FIG. 12, the annealing system includes a quartz tube 703, a quartz table 702 for supporting a wafer 701 thereon, and a quartz shower plate 705. This annealing system is a single wafer processing type for processing wafers one by one. Two heaters 706 are provided beside and over the tube 703, respectively. Specifically, one of the heaters 706 is provided over the tube 703 to heat the wafer 701. The other heater 706 is provided beside the tube 703 to prevent the heat from being dissipated through the side surfaces of the tube 703 and to uniformize the temperature distribution of the wafer 701.

A nitrogen gas 707 is introduced into the quartz tube 703 and heated between the quartz tube 703 and the shower plate 705. Then, the heated nitrogen gas 708 blows down through tiny holes of the shower plate 705.

While the heated nitrogen gas 708 is blowing down through the shower plate 705, the table 702 holding the wafer 701 thereon is lifted in the direction indicated by the arrow 704. In this case, the heating and cooling rate of the wafer 701 is controllable by adjusting the rate at which the table 702 is lifted.

When the distance between the wafer 701 and the shower plate 705 reaches about 1 cm, the table 702 is stopped and then held there for a predetermined amount of time. Thereafter, the table 702 holding the wafer 701 thereon will be lowered.

By using an RTA system of this type, the temperature distribution in the wafer being heated or cooled can be kept substantially uniform, and even a glass wafer of a big size (e.g., on the order of several meters) can be processed constantly without allowing the wafer to warp or chip. Furthermore, in the conventional lamp annealing process, the temperature of the substrate goes on rising all through the period in which the lamp is ON, and cannot be controlled as intended. In contrast, according to the method of the present invention, the annealing process can be carried out following a predetermined temperature profile. For these reasons, when the second annealing process of the present invention is performed as a rapid thermal annealing, an RTA system having such a configuration is preferably used.

If multiple RTA systems, each having the configuration shown in FIG. 12, are clustered together such that the RTA process can be performed in multiple chambers simultaneously, then a manufacturing system having high processibility is realized at a small footprint.

After the annealing process was performed by using the RTA system described above, the Pa/Pc ratio, i.e., the ratio of the TO phonon peak Pa of amorphous Si to the TO phonon peak Pc of crystalline Si in a Raman spectrum, was measured on the channel forming region and gettering region of each TFT by a laser Raman spectroscopy. As a result, the Pa/Pc ratio of the gettering region was greater than that of the channel forming region. When a transparent glass substrate is used as in this preferred embodiment, this measurement may be performed from under the back surface of the substrate. Since no high-temperature process is carried out after this RTA process is over, the amorphous state of the gettering regions can be maintained even after the TFT is completed.

Subsequently, as shown in FIG. 2I, an inorganic interlevel dielectric film is formed over an n-channel TFT and a p-channel TFT. The interlevel dielectric film may be made of silicon nitride, silicon dioxide or silicon oxynitride, and may have a thickness of about 400 nm to about 1500 nm (typically in the range of about 600 nm to about 1000 nm). In this preferred embodiment, the interlevel dielectric film has a two-layered structure consisting of a silicon nitride film 327 having a thickness of about 200 nm and a silicon dioxide film 328 having a thickness of about 700 nm. These two films 327 and 328 are deposited by a plasma CVD process. Specifically, the silicon nitride film 327 is deposited by using $SiH_4$ and $NH_3$ as source gases, while the silicon dioxide film 328 is deposited by using TEOS and $O_2$ as source gases. These two films may be deposited continuously.

However, the inorganic interlevel dielectric film does not have to have this structure. Alternatively, the interlevel dielectric film may have either a single-layered structure or a multilayer structure including a silicon-containing insulating film.

Thereafter, the substrate is annealed again at a temperature of about 300° C. to about 500° C. for approximately 1 hour to approximately 12 hours, thereby hydrogenating the semiconductor layers. This hydrogenation process is carried out to terminate and inactivate dangling bonds, which might deteriorate the TFT characteristics, by supplying hydrogen atoms to the interface between the active regions and the gate insulating film. In this preferred embodiment, the substrate is annealed at about 410° C. for approximately one hour within a nitrogen atmosphere including about 3% of hydrogen. If the interlevel dielectric film (or the silicon nitride film 327, in particular) includes hydrogen at an insufficient percentage, the annealing process within the nitrogen atmosphere can also be effective. Optionally, the semiconductor layers may also be hydrogenated by a plasma hydrogenation process in which hydrogen atoms, excited by plasma, are used.

Next, after contact holes have been provided through the interlevel dielectric film, the contact holes are filled with a metal material (e.g., a two-layered structure consisting of titanium nitride film and an aluminum film), thereby forming electrodes and interconnects 329 for the TFTs. In this case, the titanium nitride film is provided as a barrier film to prevent aluminum from diffusing through the semiconductor layers. Finally, the substrate is annealed one more time at about 350° C. for approximately one hour, thereby completing the n-channel TFT 330 and p-channel TFT 331 shown in FIG. 2I. If necessary, additional contact holes may be provided over the gate electrodes 311$n$ and 311$p$ such that some electrodes can be connected together by way of the interconnects 329. Optionally, the TFTs 330 and 331 may be coated with a passivation film of silicon nitride, for example, to protect the TFTs 330 and 331 from environmental contamination.

When fabricated by the method of the second preferred embodiment described above, the n-channel TFT has a field effect mobility of about 250 $cm^2$/Vs to about 300 $cm^2$/Vs and a threshold voltage of about 1 V, while the p-channel TFT has a field effect mobility of about 120 $cm^2$/Vs to about 150 $cm^2$/Vs and a threshold voltage of about −1.5 V. In this manner, the n-channel and p-channel TFTs both exhibit excellent characteristics. In addition, the abnormal increase in the OFF-state leakage current of the TFTs, which occurs frequently in the prior art, is totally absent from the TFTs of the present invention. Also, even when subjected to a durability test by the repeated application of voltage or thermal stress, the TFTs exhibited almost no deterioration in characteristics. Furthermore, when a circuit such as a chain of inverters or ring oscillator is made up of the CMOS circuits each including a complementary pair of n-channel TFT and p-channel TFT of the preferred embodiment described above, the circuit exhibits much more reliable and far more stabilized characteristics than conventional ones.

Embodiment 3

Hereinafter, a third specific preferred embodiment of the present invention will be described.

The third preferred embodiment of the present invention is also a method of fabricating a CMOS circuit, in which an n-channel TFT and a p-channel TFT are arranged as a complementary pair, on a glass substrate.

FIGS. 3A through 3H are cross-sectional views illustrating respective process steps for fabricating TFTs according to the third preferred embodiment of the present invention. The manufacturing process is carried out in the illustrated order.

Figure 3A:
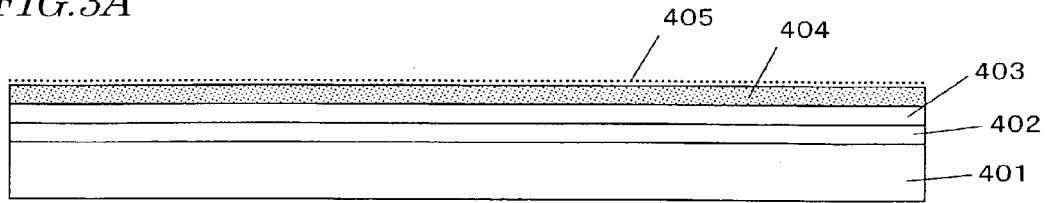
FIGS. 3A through 3H are cross-sectional views illustrating respective process steps for fabricating a CMOS circuit according to a third specific preferred embodiment of the present invention.

First, as shown in FIG. 3A, a substrate 401 of low-alkali glass or quartz is prepared. In this preferred embodiment, a low alkali glass substrate 401 is used. On the surface of the substrate 401 on which TFTs should be formed, an undercoat film of silicon dioxide, silicon nitride or silicon oxynitride is deposited to prevent the diffusion of impurities from the substrate 401. In this preferred embodiment, a silicon oxynitride film is deposited as a first undercoat film 402 by a plasma CVD process using material gases of $SiH_4$, $NH_3$ and $N_2O$, and then another silicon oxynitride film is deposited thereon as a second undercoat film 403 by the same plasma CVD process using the material gases of TEOS and $O_2$. In this process step, the first undercoat film 402 (i.e., the lower silicon oxynitride film) may have a thickness of about 25 nm to about 200 nm (e.g., about 100 nm) and the second undercoat film 403 (i.e., the upper silicon oxynitride film) may have a thickness of about 25 nm to about 300 nm (e.g., 100 nm).

Thereafter, a silicon film having an amorphous structure (i.e., an a-Si film 404) is deposited thereon to a thickness of about 20 nm to about 150 nm (preferably about 30 nm to about 80 nm) by a known process such as a plasma CVD process or a sputtering process. In this preferred embodiment, an amorphous silicon film is deposited to a thickness of about 50 nm by a plasma CVD process. Also, the undercoat films 402 and 403 and the amorphous silicon film 404 may be formed by the same deposition process and may be deposited continuously.

Subsequently, a catalytic element (e.g., nickel in this preferred embodiment) 405 is added at a very low dose onto the surface of the a-Si film 404. The nickel atoms 405 may be introduced by retaining a nickel solution on the a-Si film 404, uniformly spreading the nickel solution over the substrate 401 with a spinner and then drying the solution. In this preferred embodiment, nickel acetate is used as a solute, water is used as a solvent and the concentration of nickel in the solution is adjusted to about 10 ppm. In the state shown in FIG. 3A, the concentration of nickel on the surface of the a-Si film 404 measured about $7 \times 10^{12}/cm^2$ by a total reflection x-ray fluorometry (TRXRF).

Figure 3B:
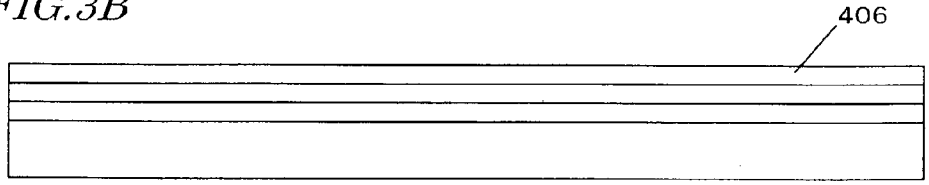

Next, the a-Si film 404 is annealed within an inert atmosphere (e.g., a nitrogen gas) at a temperature of about 520° C. to about 600° C. for approximately one hour to approximately eight hours. In this preferred embodiment, the annealing process is performed at about 550° C. for approximately four hours. During this annealing process, the nickel atoms 405 that have been added to the surface of the a-Si film 404 diffuse into the a-Si film 404 and bond to Si to produce a nickel silicide there. Thus, the a-Si film 404 is going to be crystallized from the nickel silicide as nuclei. As a result, the a-Si film 404 is crystallized to be a crystalline silicon film 406 as shown in FIG. 3B.

Figure 3C:
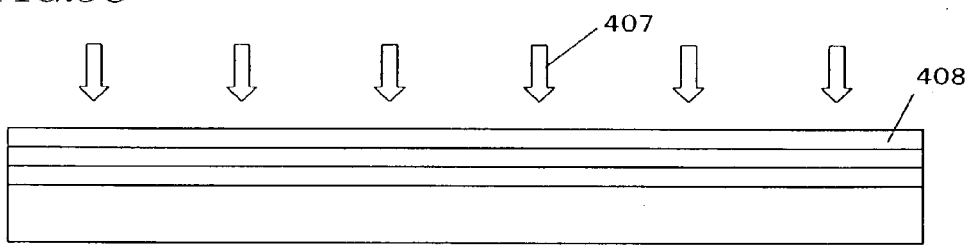

Thereafter, as shown in FIG. 3C, the crystalline silicon film 406 is exposed to, and further re-crystallized by, laser beams 407 so as to improve its crystallinity. In this process step, XeCl excimer laser beams (with a wavelength of about 308 nm and a pulse width of about 40 nsec) may be irradiated at an energy density of about 400 $mJ/cm^2$. The laser beams are focused onto the surface of the substrate 401 so as to form elongated beam spots having sizes of about 150 mm by about 1 mm. The substrate 401 is sequentially scanned at a step width of about 0.05 mm vertically to the direction in which the beam spots are elongated. That is to say, a given point on the crystalline silicon film 406 is exposed to the laser beams 20 times in total. In this manner, the crystalline silicon film 406 that has been obtained by the solid-phase crystallization process can reduce its crystal imperfections through the melting and solidifying process caused by the laser beam exposure and can be a crystalline silicon film 408 with improved crystallinity.

Subsequently, excessive portions of the crystalline silicon film 408 are removed, thereby electrically isolating respective element regions (to be TFT active regions) from each other. As a result, an island-shaped crystalline silicon film 409$n$ to be the active region of an n-channel TFT and another island-shaped crystalline silicon film 409$p$ to be the active region of a p-channel TFT are formed as shown in FIG. 3D.

In this process step, boron may be introduced as a p-type dopant element into the entire active regions of the n-channel TFT and p-channel TFT to control the threshold voltages of the transistors. Boron may have a concentration of about $1 \times 10^{16}/cm^3$ to about $5 \times 10^{17}/cm^3$. The boron atoms may be introduced by an ion implantation process. Alternatively, the amorphous silicon film may have been doped with boron during the deposition process thereof.

Next, a silicon dioxide film is deposited as a gate insulating film 410 to a thickness of about 20 nm to about 150 nm (e.g., about 100 nm in this preferred embodiment) over the crystalline silicon films 409n and 409p to be the active regions. The silicon dioxide film 410 may be formed by using TEOS as a material and decomposing and depositing the TEOS and oxygen by an RF plasma CVD process. During the deposition process, the temperature of the substrate is preferably controlled to about 150° C. to about 600° C. (preferably about 300° C. to about 450° C.).

Figure 3D:
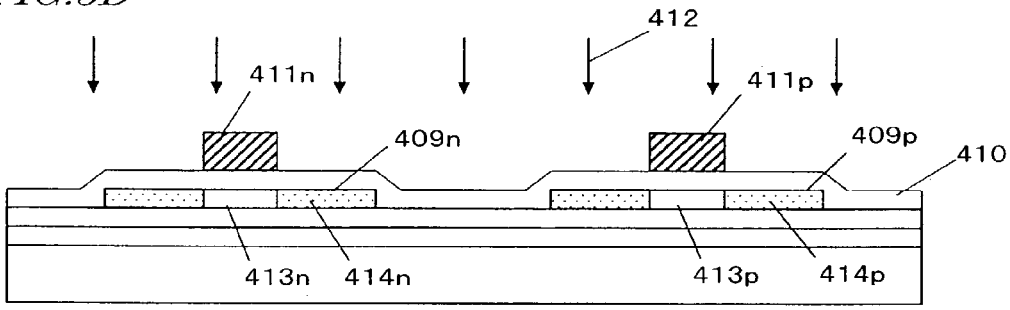

Next, as shown in FIG. 3D, a refractory metal is deposited by a sputtering process on the gate insulating film 410 and then patterned into gate electrodes 411n and 411p. In this preferred embodiment, the refractory metal is tantalum (Ta), doped with nitrogen at a very low dose, and has a thickness of about 300 nm to about 600 nm (e.g., about 450 nm).

Next, ions 412 of an n-type dopant (e.g., phosphorus in this preferred embodiment) are lightly implanted into the active regions with the gate electrodes 411n and 411p used as masks. In this process step, using phosphine ($PH_3$) as a doping gas, phosphorus ions are implanted at an acceleration voltage of about 60 kV to about 90 kV (e.g., about 80 kV) and at a dose of about $1 \times 10^{12}$ cm$^{-2}$ to about $1 \times 10^{14}$ cm$^{-2}$ (e.g., about $2 \times 10^{13}$ cm$^{-2}$). By performing this process step, portions of the island-shaped crystalline silicon film 409n that are not covered with the gate electrode 411n become lightly P-doped regions 414n, while portions of the island-shaped crystalline silicon film 409p that are not covered with the gate electrode 411p become lightly P-doped regions 414p. On the other hand, the non-doped regions 413n and 413p that are masked with the gate electrodes 411n and 411p will eventually be channel forming regions 413n and 413p for the n-channel TFT and p-channel TFT, respectively, as shown in FIG. 3D.

Figure 3E:
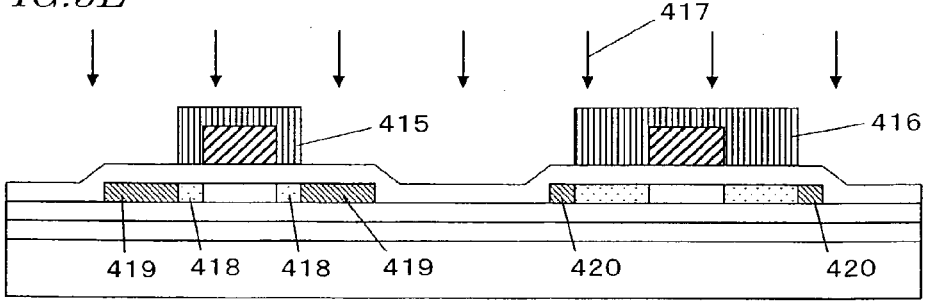

Next, as shown in FIG. 3E, a photoresist doping mask 415 is provided so as to cover the gate electrode 411n barely for the n-channel TFT, while a photoresist doping mask 416 is provided so as to cover the gate electrode 411p completely but expose the outer edges of the active region 409p for the p-channel TFT. Thereafter, ions 417 of an n-type dopant (e.g., phosphorus in this preferred embodiment) are implanted into the non-masked portions 419 and 420 of the active regions 409n and 409p by using the resist masks 415 and 416. In this process step, using phosphine ($PH_3$) as a doping gas, phosphorus ions are implanted at an acceleration voltage of about 60 kV to about 90 kV (e.g., about 80 kV) and at a dose of about $1 \times 10^{15}$ cm$^{-2}$ to about $1 \times 10^{16}$ cm$^{-2}$ (e.g., about $5 \times 10^{15}$ cm$^{-2}$). By performing this process step, ions 417 of the n-type dopant (i.e., phosphorus) are heavily implanted into the portions 419, which will eventually be source/drain regions for the n-channel TFT. Other portions of the active region 409n, which are covered with the resist mask 415 and to which the phosphorus ions 417 have not been introduced, will be left as lightly P-doped regions 414n to be lightly doped drain (LDD) regions 418. On the other hand, by performing this process step, ions 417 of the n-type dopant (i.e., phosphorus) are also heavily implanted into portions 420 to be gettering regions for the p-channel TFT. In this process step, the n-type dopant element (i.e., phosphorus) 417 has a concentration of about $1 \times 10^{19}/cm^3$ to about $1 \times 10^{21}/cm^3$ in the regions 419 and 420. Meanwhile, the n-type dopant element (i.e., phosphorus) 417 has a concentration of about $1 \times 10^{17}/cm^3$ to about $1 \times 10^{20}/cm^3$ in the LDD regions 418 of the n-channel TFT. Stated otherwise, the regions 418 can function as the LDD regions when the regions 418 has an n-type dopant concentration falling within this range.

Figure 3F:
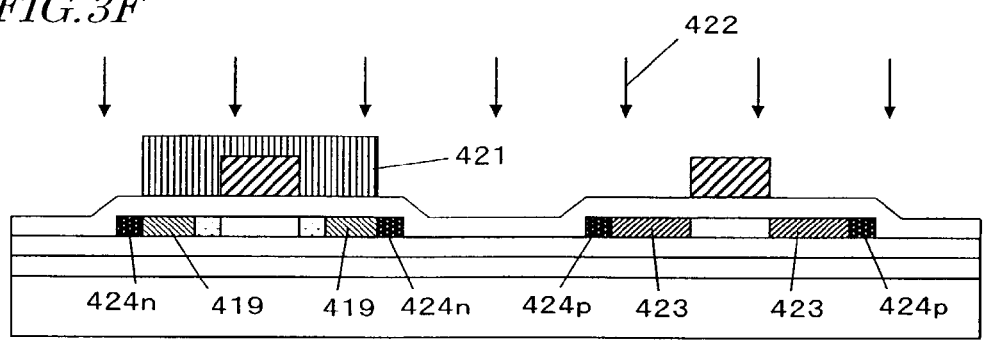

Thereafter, the resist masks 415 and 416 are removed, and then another photoresist doping mask 421 is provided so as to cover the LDD regions 418 completely but expose the outer edges of the active region 409n of the n-channel TFT as shown in FIG. 3F. In this process step, the p-channel TFT is not covered with any mask and is exposed fully. In such a state, by using the resist mask 421 and the gate electrode 411p of the p-channel TFT as a mask, ions 422 of a p-type dopant (e.g., boron in this preferred embodiment) are implanted into the active regions. In this process step, using diborane ($B_2H_6$) as a doping gas, boron ions are implanted at an acceleration voltage of about 40 kV to about 80 kV (e.g., about 65 kV) and at a dose of about $1 \times 10^{15}$ cm$^{-2}$ to about $2 \times 10^{16}$ cm$^{-2}$ (e.g., about $1 \times 10^{16}$ cm$^{-2}$). By performing this process step, ions 422 of the p-type dopant (i.e., boron) are heavily implanted into the portions 424n, which will eventually be gettering regions for the n-channel TFT.

On the other hand, the boron ions 422 are heavily implanted into the entire active region 409p of the p-channel TFT except the channel forming region 413p thereof under the gate electrode 411p. As a result, the conductivity type of the phosphorus ions 412 (i.e., n-type) that were lightly introduced in the process step shown in FIG. 3D is inverted into p-type, thereby defining source drain regions 423 for the p-channel TFT.

Furthermore, the boron ions 422 are also heavily implanted into the regions 420 that were heavily doped with the phosphorus ions 417 in the process step shown in FIG. 3E, thereby defining gettering regions 424p for the p-channel TFT. In this process step, the p-type dopant (i.e., boron) 422 has a concentration of about $1.5 \times 10^{19}/cm^3$ to about $3 \times 10^{21}/cm^3$ in the regions 423, 424n and 424p. Thus, the concentration of the p-type dopant (boron) is about 1.5 to about 3.0 times as high as that of the n-type dopant (phosphorus).

As a result of this process step, the gettering regions 424n of the n-channel TFT and the gettering regions 424p of the p-channel TFT are amorphized to a great degree because phosphorus ions 417 and boron ions 422 have been implanted thereto in combination. The source/drain regions 419 of the n-channel TFT, which have been doped with the phosphorus ions only, and the source/drain regions 423 of the p-channel TFT, which have just been heavily doped with the boron ions, are both damaged to a certain degree by the ion doping processes, thereby creating crystal imperfections there. However, those gettering regions 424n and 424p are damaged and amorphized to greater degrees because the phosphorus and boron ions have both been implanted thereto.

In this manner, the n-type dopant element and the p-type dopant element are introduced selectively by covering the non-selected regions with the photoresist. As a result, n-type heavily doped regions 419, p-type heavily doped regions 423 and gettering regions 424n and 424p are formed and the n-channel TFT 429 and the p-channel TFT 430 can be obtained as shown in FIG. 3H.

In the preferred embodiment described above, the n-type dopant element is introduced first, and then the p-type dopant element is introduced. However, these dopant elements do not have to be introduced in this order but may be added in the reverse order.

In this preferred embodiment, the gettering regions 424n and 424p are defined such that the ratio of the area S of the gettering regions 424n to the channel width W of the n-channel TFT is approximately equal to the ratio of the area S of the gettering regions 424p to the channel width W of the p-channel TFT. Normally, an n-channel TFT and a p-channel TFT have mutually different degrees of current drivability. In this preferred embodiment, the current drivability of the n-channel TFT is at least twice greater than that of the p-channel TFT. Accordingly, to make similar amounts of currents flow through the n-channel and p-channel TFTs, the p-channel TFT needs to have an increased channel width. For example, if the active region 409n of the n-channel TFT has a channel width W of about 20 µm, then the active region 409p of the p-channel TFT should have a channel width W of about 40 µm. In that case, the area of the gettering region 424p included in the active region of the p-channel TFT needs to be about twice greater than that of the gettering region 424n included in the active region of the n-channel TFT.

Furthermore, in this preferred embodiment, the distance between the channel forming region 413n and the gettering regions 424n in the n-channel TFT is approximately equal to the distance between the channel forming region 413p and the gettering regions 424p in the p-channel TFT. Then, the n-channel and p-channel TFTs will have approximately equal gettering efficiencies in their active region.

Thereafter, the resist mask 421 is removed and then the substrate is annealed within an inert atmosphere (e.g., a nitrogen gas). In this preferred embodiment, the RTA system shown in FIG. 12 is also used. That is to say, the substrate is subjected to an RTA process (i.e., heated and cooled instantaneously) by blowing a high-temperature nitrogen gas against the surface of the substrate within a nitrogen atmosphere.

Specifically, the substrate may be rapidly annealed at about 670° C. for approximately 5 minutes, and may be heated and cooled at a rate of about 200° C./min. The RTA process may be started at an idle temperature of about 400° C. As a result of this annealing process, in the active region 409n of the n-channel TFT, the phosphorus and boron ions, which have been heavily introduced into the gettering regions 424n outside of the source/drain regions 419, and crystal imperfections, which have been caused by the amorphization of the crystalline silicon film during those ion implantation processes, diffuse the nickel atoms, existing in the channel forming region 413n, LDD regions 418 and source/drain regions 419, toward the gettering regions 424n by way of the channel forming region 413n, LDD regions 418 and source/drain regions 419 as indicated by the arrow 425 in FIG. 3G. The source/drain regions 419, which have been doped with the phosphorus ions only, also exhibit some gettering effects. However, since the gettering ability of the gettering regions 424n is much higher than that of the source/drain regions 419, the nickel atoms are collected in the gettering regions 424n.

Figure 3G:
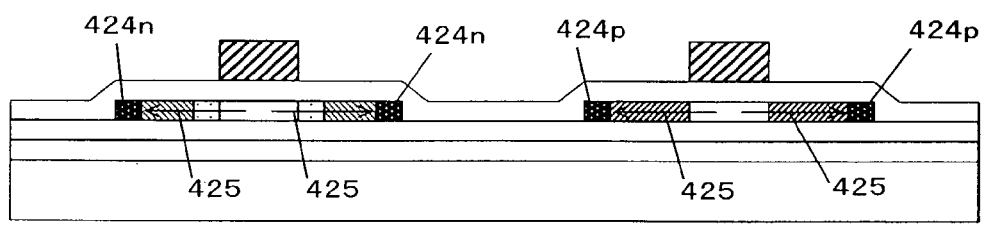
Figure 3H:
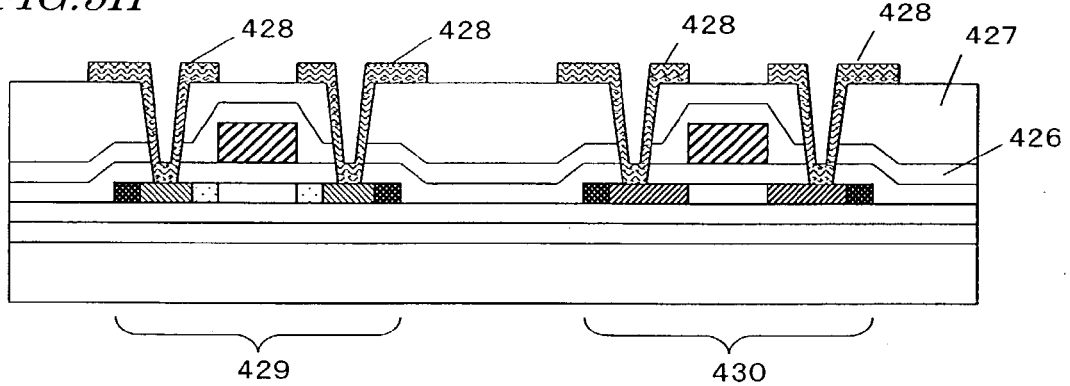

In the same way, in the active region 409p of the p-channel TFT, the phosphorus and boron ions, which have been heavily introduced into the gettering regions 424p outside of the source/drain regions 423, and crystal imperfections, which have been caused by the amorphization of the crystalline silicon film during those ion implantation processes, diffuse the nickel atoms, existing in the channel forming region 413p and source/drain regions 423, toward the gettering regions 424p by way of the channel forming region 413p and source/drain regions 423 as indicated by the arrows 425 in FIG. 3G.

As a result of this annealing process, the nickel atoms are introduced into the gettering regions 424n and 424p, and the concentration of nickel in the gettering regions 424n and 424p increases to about $1 \times 10^{19}/cm^3$ or more. In this manner, according to this preferred embodiment, the catalytic element, remaining in the channel forming region of the TFT active region, the junctions between the channel forming region and the source/drain regions and the junctions between the channel forming region and the LDD regions, are removable by the gettering action. Thus, the abnormal increase in OFF-state leakage current, caused by the precipitation of the catalytic element, can be minimized.

The n-type dopant (phosphorus) that has been introduced into the source/drain regions 419 and LDD regions 418 of the n-channel TFT and the p-type dopant (boron) that has been introduced into the source/drain regions 423 of the p-channel TFT are also activated by this annealing process. As a result, the source/drain regions 419 of the n-channel TFT will have a sheet resistance of about 400 Ω/□ to about 700 Ω/□ and the LDD regions 418 thereof will have a sheet resistance of about 30 kΩ/□ to about 60 kΩ/□. On the other hand, the source/drain regions 423 of the p-channel TFT will have a sheet resistance of about 1 kΩ/□ to about 1.5 kΩ/□.

Meanwhile, the gettering regions 424n and 424p have not had their crystallinity recovered by the RTA process and still include an amorphous phase. Such regions as having an amorphous phase have extremely high electrical resistivity. However, no serious problems will arise because the gettering regions 424n and 424p are provided separately from the source/drain regions.

After the annealing process was performed, the Pa/Pc ratio, i.e., the ratio of the TO phonon peak Pa of amorphous Si to the TO phonon peak Pc of crystalline Si in a Raman spectrum, was measured on the respective regions of each TFT by a laser Raman spectroscopy. As a result, the Pa/Pc ratio of the gettering regions 424n or 424p was greater than that of the channel forming region 413n or 413p, LDD regions 418 or source/drain regions 419 or 423. Since no high-temperature process is carried out after this RTA process is over, the amorphous state of the gettering regions can be maintained even after the TFT is completed.

Subsequently, as shown in FIG. 3H, an interlevel dielectric film is formed over an n-channel TFT and a p-channel TFT. The interlevel dielectric film may be made of silicon nitride, silicon dioxide or silicon oxynitride, and may have a thickness of about 400 nm to about 1500 nm (typically in the range of about 600 nm to about 1000 nm). In this preferred embodiment, the interlevel dielectric film has a two-layered structure consisting of a silicon nitride film 426 having a thickness of about 200 nm and a silicon dioxide film 427 having a thickness of about 700 nm. These two films 426 and 427 may be deposited by a plasma CVD process. Specifically, the silicon nitride film 426 may be deposited by using $SiH_4$ and $NH_3$ as source gases, while the silicon dioxide film 427 may be deposited by using TEOS and $O_2$ as source gases. These two films may be deposited continuously. However, the inorganic interlevel dielectric film does not have to have this structure. Alternatively, the interlevel dielectric film may have either a single-layered structure or a multilayer structure including a silicon-containing insulating film.

Thereafter, the substrate is annealed again at a temperature of about 300° C. to about 500° C. for approximately 1 hour, thereby hydrogenating the semiconductor layers. This hydrogenation process is carried out to terminate and inactivate dangling bonds, which might deteriorate the TFT characteristics, by supplying hydrogen atoms from the interlevel dielectric film (or the silicon nitride film 426, in particular) to the interface between the active regions and the gate insulating film. In this preferred embodiment, the substrate is annealed at about 410° C. for approximately one hour within a nitrogen atmosphere.

Next, after contact holes have been provided through the interlevel dielectric film, the contact holes are filled with a metal material (e.g., a two-layered structure consisting of titanium nitride film and an aluminum film), thereby forming electrodes and interconnects 428 for the TFTs. In this case, the titanium nitride film is provided as a barrier film to prevent aluminum from diffusing through the semiconductor layers. Finally, the substrate is annealed one more time at about 350° C. for approximately one hour, thereby completing the n-channel TFT 429 and p-channel TFT 430 shown in FIG. 3H. If necessary, additional contact holes may be provided over the gate electrodes 411n and 411p such that some electrodes can be connected together by way of the interconnects 428. Optionally, the TFTs 429 and 430 may be further coated with a passivation film of silicon nitride, for example, to protect the TFTs 429 and 430 from environmental contamination.

When fabricated by the method of the third preferred embodiment described above, the n-channel and p-channel TFTs also exhibit as good field effect mobilities as the counterparts of the second preferred embodiment described above. In addition, the abnormal increase in the OFF-state leakage current of the TFTS, which occurs frequently in the prior art, is totally absent from the TFTs of the present invention. Also, even when subjected to a durability test by the repeated application of voltage or thermal stress, the TFTs exhibited almost no deterioration in characteristics. Furthermore, when a circuit such as a chain of inverters or ring oscillator is made up of the CMOS circuits each including a complementary pair of n-channel TFT and p-channel TFT of the preferred embodiment described above, the circuit exhibits much more reliable and far more stabilized characteristics than conventional ones.

In addition, according to the third preferred embodiment described above, the gettering regions can be formed for the n-channel and p-channel TFTs at the same time by taking advantage of the process step of forming the source/drain regions. Thus, the gettering regions can be obtained without performing the additional photolithographic, doping and annealing process steps for that special purpose. Consequently, the manufacturing process of the semiconductor device can be simplified, the manufacturing cost thereof can be decreased, and the yield thereof can be increased.

Embodiment 4

Hereinafter, a fourth specific preferred embodiment of the present invention will be described with reference to FIGS. 4A through 4H.

The fourth preferred embodiment of the present invention is also a method of fabricating a CMOS circuit, in which an n-channel TFT and a p-channel TFT are arranged as a complementary pair, on a glass substrate.

FIGS. 4A through 4H are cross-sectional views illustrating respective process steps for fabricating TFTs according to the fourth preferred embodiment of the present invention. The manufacturing process is carried out in the illustrated order.

Figure 4A:
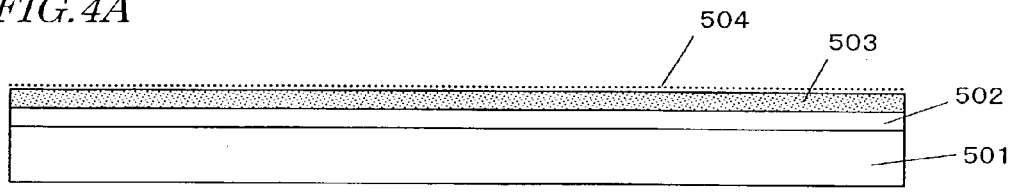
FIGS. 4A through 4H are cross-sectional views illustrating respective process steps for fabricating a CMOS circuit according to a fourth specific preferred embodiment of the present invention.

First, as shown in FIG. 4A, an undercoat insulating film 502 of silicon dioxide is deposited to a thickness of about 100 nm on a glass substrate 501 and then an amorphous silicon film 503 is deposited thereon to a thickness of about 20 nm to about 100 nm.

Next, a catalytic element is added to the amorphous silicon film 503 and then the amorphous silicon film 503 is annealed. Specifically, first, the amorphous silicon film 503 is spin-coated with an aqueous solution (e.g., an aqueous solution of nickel acetate), including about 10 ppm of catalytic element (e.g., nickel in this preferred embodiment) when converted to an equivalent weight, thereby forming a catalytic element containing layer 504 as shown in FIG. 4A.

Figure 4B:
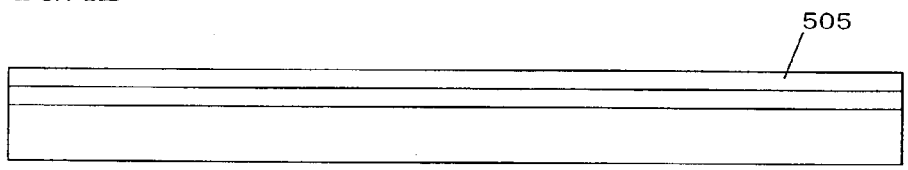

Thereafter, the substrate is annealed within an inert atmosphere (e.g., within a nitrogen gas). This annealing process is preferably carried out at a temperature of about 520° C. to about 600° C. for approximately 1 hour to approximately 8 hours (e.g., at about 580° C. for approximately one hour). During this annealing process, the nickel atoms 14 that have been added to the surface of the a-Si film 503 diffuse into the a-Si film 503 and bond to Si to produce a nickel silicide there. Thus, the a-Si film 503 is going to be crystallized from the silicide produced as nuclei. As a result, the a-Si film 503 is crystallized to be a crystalline silicon film 505 as shown in FIG. 4B.

Figure 4C:
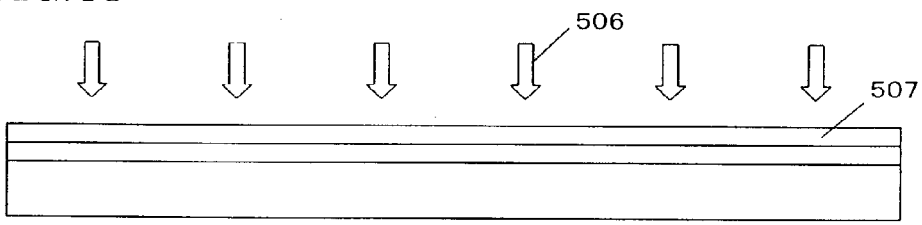

Subsequently, as shown in FIG. 4C, the crystalline silicon film 505 is exposed to laser beams 506, thereby obtaining a crystalline silicon film 507 with improved crystallinity. By being exposed to these laser beams 506, the crystallinity of the crystalline silicon film 505 is improved significantly. In this preferred embodiment, pulsed XeCl excimer laser beams with a wavelength of about 308 nm are irradiated as the laser beams 506.

Thereafter, the crystalline silicon film 507 is etched into a predetermined shape, thereby forming active regions 508n and 508p for an n-channel TFT and a p-channel TFT, respectively. Then, a gate insulating film 509 is deposited over these active regions 508n and 508p.

Figure 4D:
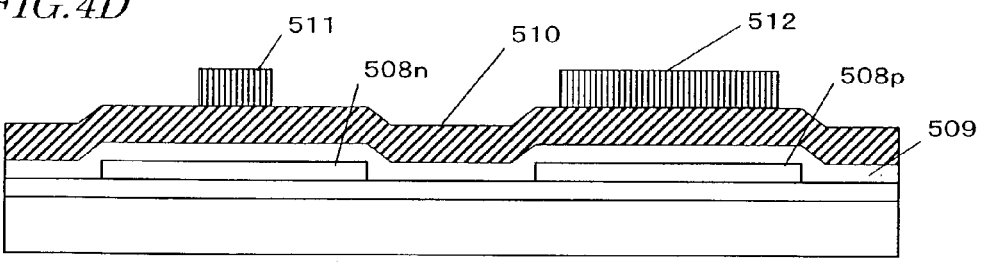

Subsequently, a conductive film 510 is deposited on the gate insulating film 509 by a sputtering or CVD process as shown in FIG. 4D. The conductive film may be made of a refractory metal such as W, Ta, Ti or Mo or an alloy thereof.

Next, as shown in FIG. 4D, resist masks 511 and 512 are defined on the conductive film 510. These masks 511 and 512 are provided to define gate electrodes. In this preferred embodiment, the gate electrode for the p-channel TFT is used as a mask for defining regions to be doped with an n-type dopant (i.e., to be gettering regions eventually) in the active region. Thus, the mask 512 for the p-channel TFT is designed to have a greater width than the mask 511 for the n-channel TFT.

Thereafter, the conductive film 510 is etched, thereby forming gate electrodes 513 and 514 in first and second shapes, respectively.

Figure 4E:
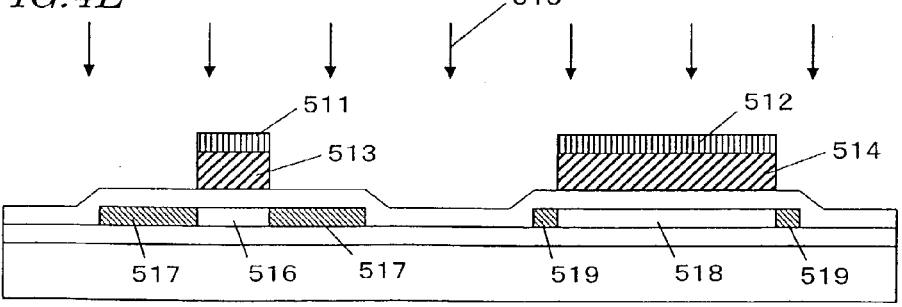

Then, ions 515 of an n-type dopant element (e.g., phosphorus in this preferred embodiment) are implanted into the active regions 508n and 508p (which process step will be referred to herein as a "first doping process"), thereby forming n-type doped regions 517 and 519 including the n-type dopant element at a concentration of about $1 \times 10^{19}/cm^3$ to about $1 \times 10^{21}/cm^3$ as shown in FIG. 4E.

It should be noted that a portion 516 of the active region 508n, which is overlapped by the gate electrode 513 in the first shape, will be a channel forming region for the n-channel TFT eventually. On the other hand, no dopant element is added either to a portion 518 of the active region 508p, which is overlapped by the gate electrode 514 in the second shape and which will be a channel forming region and source/drain regions for the p-channel TFT in the end.

Subsequently, the masks 511 and 512 are removed, and instead a resist mask 521 for use to etch the gate electrode 514 in the second shape into a predetermined shape for the p-channel TFT and another resist mask 520 for use to define gettering regions in the active region 508n of the n-channel TFT are defined. By selectively etching away the gate electrode 514 in the second shape through the resist mask 521, a gate electrode 522 in a third shape (i.e., the predetermined shape) is obtained as shown in FIG. 4F.

Figure 4F:
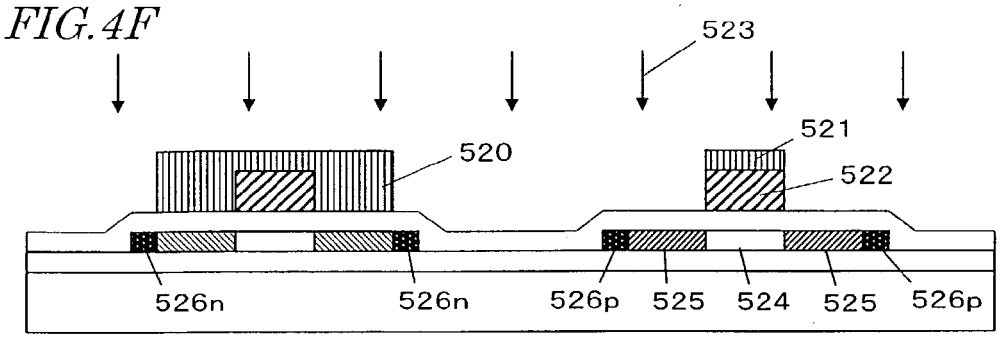
Figure 4G:
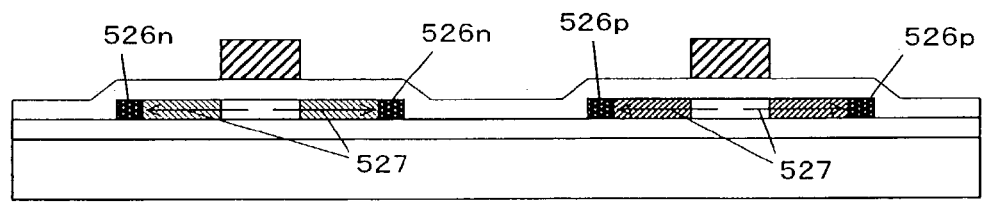

Thereafter, as also shown in FIG. 4F, ions 523 of a p-type dopant element (e.g., boron in this preferred embodiment) are introduced into the active regions, thereby forming gettering regions 526n in the active region of the n-channel TFT and source/drain regions 525 and gettering regions 526p in the active region of the p-channel TFT, respectively. In this process step, no boron ions 523 are implanted into a portion of the active region of the p-channel TFT, which is covered with the gate electrode 522 in the third shape. Thus, that portion of the active region of the p-channel TFT will be a channel forming region 524. The gettering regions 526n and 526p formed by these process steps have been amorphized.

Next, the resist masks 520 and 521 are removed and then the substrate is annealed to diffuse the catalytic element, remaining in the active regions, toward the gettering regions 526n and 526p. In this preferred embodiment, the RTA system shown in FIG. 12 is also used. That is to say, an RTA process is carried out with the substrate heated and cooled instantaneously by blowing a high-temperature nitrogen gas against the surface of the substrate within a nitrogen atmosphere. As a result of this annealing process, the catalytic element, remaining in the channel forming region of the active region or in the junctions between the channel forming region and the source/drain regions, can be diffused toward the gettering regions as indicated by the arrows 527 in FIG. 4G. Thus, the abnormal increase in OFF-state leakage current, which would otherwise be caused by the precipitation of the catalytic element, can be minimized.

In this preferred embodiment, the concentrations of the n-type and p-type dopant elements included in the gettering regions of the active region of the n-channel TFT are equal to those of the n-type and p-type dopant elements included in the gettering regions of the active region of the p-channel TFT. Thus, the gettering efficiency of the n-channel TFT can be equalized with that of the p-channel TFT. Also, portions of the active region of the p-channel TFT to be the source/drain regions are not subjected to the counter doping process. Thus, the unwanted increase in resistance can be eliminated from the source/drain regions of the p-channel TFT. As a result of the gettering process, the catalytic element is introduced into the gettering regions. Consequently, the gettering regions include the catalytic element at a concentration of at least about $1 \times 10^{19}/cm^3$.

This annealing process also activates the dopants in the source/drain regions 517 of the n-channel TFT and the source/drain regions 525 of the p-channel TFT. Meanwhile, the gettering regions 526n and 526p have not had their crystallinity recovered by the RTA process and still include an amorphous phase. Such regions have extremely high electrical resistivity. However, no serious problems will arise because the gettering regions 526n and 526p are provided separately from the source/drain regions.

After this annealing process is finished, the Pa/Pc ratio, which is the ratio of the TO phonon peak Pa of amorphous Si to the TO phonon peak Pc of crystalline Si in a Raman spectrum, is measured on the respective regions by a laser Raman spectroscopy. As a result, the Pa/Pc ratio of the gettering regions is greater than that of the channel forming region or source/drain regions. Since no high-temperature process is carried out after the RTA process is over, the amorphous state of the gettering regions can be maintained even after the TFT is completed.

In the preferred embodiment described above, the n-type dopant element is introduced into the semiconductor layer first, and then the p-type dopant element is introduced thereto. However, these dopant elements do not have to be introduced in this order but the doping order may be appropriately determined by the designer.

Figure 4H:
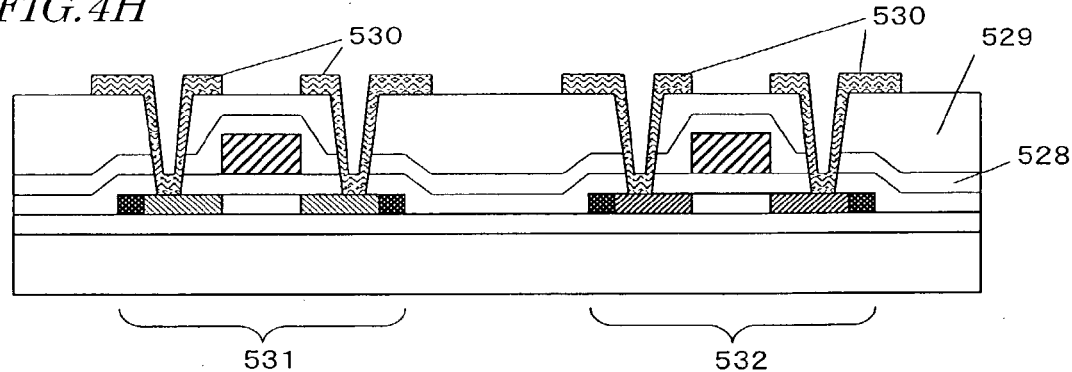

Subsequently, as shown in FIG. 4H, an interlevel dielectric film is formed over the n-channel TFT and the p-channel TFT. In this preferred embodiment, the interlevel dielectric film has a two-layered structure consisting of a silicon nitride film 528 having a thickness of about 200 nm and a silicon dioxide film 529 having a thickness of about 700 nm.

Thereafter, the substrate is annealed again at a temperature of about 300° C. to about 500° C. for approximately 1 hour, thereby hydrogenating the semiconductor layers. This hydrogenation process is carried out to terminate and inactivate dangling bonds, which might deteriorate the TFT characteristics, by supplying hydrogen atoms from the interlevel dielectric film (or the silicon nitride film 528, in particular) to the interface between the active regions and the gate insulating film.

Next, contact holes are provided through the interlevel dielectric film and then filled with a metal material to be electrodes and interconnects 530 for the TFT, thereby completing the n-channel TFT 531 and p-channel TFT 532 as shown in FIG. 4H. If necessary, additional contact holes may be provided over the gate electrodes 513 and 522 such that some electrodes can be connected together by way of the interconnects 530.

When fabricated by the method of the fourth preferred embodiment described above, the n-channel and p-channel TFTs also exhibit as good field effect mobilities as the counterparts of the second preferred embodiment described above. In addition, the abnormal increase in the OFF-state leakage current of the TFTs, which occurs frequently in the prior art, is totally absent from the TFTs of the present invention. Also, even when subjected to a durability test by the repeated application of voltage or thermal stress, the TFTs still exhibited almost no deterioration in characteristics. Furthermore, when a circuit such as a chain of inverters or ring oscillator is made up of the CMOS circuits each including a complementary pair of n-channel TFT and p-channel TFT of the preferred embodiment described above, the circuit exhibits much more reliable and far more stabilized characteristics than conventional ones.

In the fourth preferred embodiment described above, the gate electrodes for the n-channel and p-channel TFTs are used as doping masks to define the source/drain regions and gettering regions for the TFTs. Thus, the number of photolithographic processes required can be further reduced. As a result, the manufacturing process of the semiconductor devices can be simplified, the manufacturing cost thereof can be cut down, and the yield thereof can be increased.

Embodiment 5

Hereinafter, a fifth specific preferred embodiment of the present invention will be described with reference to FIGS. 5A through 5H and FIG. 6. The fifth preferred embodiment of the present invention is a method for fabricating a pixel TFT inside of a pixel section and a driver circuit TFT outside of, and around, the pixel section, respectively, on the same substrate.

First, as shown in FIG. 5A, a substrate 100 of low-alkali glass or quartz is prepared. In this preferred embodiment, a low alkali glass substrate 100 is used. In this process step, the substrate 100 may be preheated to a temperature that is about 10° C. to about 20° C. lower than the glass strain point.

On the surface of the substrate 100 on which TFTs should be formed, an undercoat film 101 of silicon dioxide, silicon nitride or silicon oxynitride is deposited to prevent the diffusion of impurities from the substrate 100. In this preferred embodiment, a silicon oxynitride film is deposited to a thickness of about 100 nm as a first undercoat film 101a by a plasma CVD process using material gases of $SiH_4$, $NH_3$ and $N_2O$, and then another silicon oxynitride film is deposited thereon to a thickness of about 200 nm as a second undercoat film 101b by the same plasma CVD process using the material gases of $SiH_4$ and $N_2O$.

Thereafter, a semiconductor film having an amorphous structure is deposited thereon to a thickness of about 20 nm to about 150 nm (preferably about 30 nm to about 80 nm) by a known process such as a plasma CVD process or a sputtering process. In this preferred embodiment, an amorphous silicon film is deposited to a thickness of about 55 nm by a plasma CVD process. Examples of semiconductor films having an amorphous structure include an amorphous semiconductor film and a microcrystalline semiconductor film. Also, the undercoat film 101 and the amorphous silicon film may be formed by the same deposition process and may be deposited continuously. In that case, the undercoat film 101 deposited is never exposed to the air and should not be contaminated with impurities in the air. As a result, the variation in the characteristic (e.g., threshold voltage) of the TFTs to be formed can be minimized.

Next, a semiconductor film having a crystalline structure (e.g., a crystalline silicon film in this preferred embodiment) is formed by the technique described for any of the first through fourth preferred embodiments.

By performing the crystallization process described above and a laser crystallization process in combination, the crystallinity of the crystalline semiconductor film can be further improved. Examples of laser diodes for use in this process step include KrF excimer lasers, XeCl excimer lasers, YAG lasers and $YVO_4$ lasers of a pulsed type or a continuous wave type. When any of these laser diodes is used, the laser radiation, emitted from the laser diode, is preferably condensed by an optical system into a laser beam to be focused onto the semiconductor film.

Subsequently, the crystalline silicon film is divided into multiple portions having a predetermined shape, thereby obtaining island-shaped semiconductor layers 102 through 105. To control the threshold voltage of n-channel TFTs to be formed on the island-shaped semiconductor layers 102 through 105, boron (B) may be added as a p-type dopant element to the entire surface of the island-shaped semiconductor layers 102 through 105 at a doping level of about $1\times10^{16}/cm^3$ to about $5\times10^{17}/cm^3$. Boron (B) may be introduced by an ion implantation process. Alternatively, the amorphous silicon film may also be doped with boron (B) during the deposition process thereof.

Thereafter, an insulating film including silicon is deposited thereon as a gate insulating film 106 to a thickness of about 10 nm to about 150 nm by a plasma CVD process or a sputtering process. In this preferred embodiment, a silicon dioxide film is deposited as the gate insulating film 106 to a thickness of about 100 nm. Alternatively, the gate insulating film 106 may also be any other silicon-containing insulating film having either a single layer structure or a multilayer structure.

Next, a first conductive layer 107 and a second conductive layer 108 to be shaped into gate electrodes are deposited thereon. In this preferred embodiment, a first conductive layer 107 of an electrically conductive metal nitride and a second conductive layer 108 of a metal are stacked in this order. The second conductive layer 108 may be made of a metal element that is selected from the group consisting of tantalum (Ta), titanium (Ti), molybdenum (Mo) and tungsten (W), an alloy including one of these elements as its main ingredient, or an alloy including at least two of these elements (such as an Mo—W alloy or an Mo—Ta alloy). The first conductive layer 107 may be made of tantalum nitride (TaN), tungsten nitride (WN), titanium nitride (TiN) or molybdenum nitride (MoN). Alternatively, tungsten silicide, titanium silicide or molybdenum silicide may also be used as a material for the first conductive layer 107. In this case, the impurity concentration of the second conductive layer 108 is preferably decreased to reduce the resistivity. Specifically, the second conductive layer 108 preferably has an oxygen concentration of at most about 30 ppm. For example, when the second conductive layer 108 of tungsten (W) has an oxygen concentration of about 30 ppm or less, a specific resistivity of about 20 µcm or less is achieved.

The first conductive layer 107 preferably has a thickness of about 10 nm to about 50 nm (more preferably about 20 nm to about 30 nm), while the second conductive layer 108 preferably has a thickness of about 200 nm to about 400 nm (more preferably about 250 nm to about 350 nm).

In this preferred embodiment, the first conductive layer 107 is a tantalum nitride film with a thickness of about 30 nm, and the second conductive layer 108 is a Ta film with a thickness of about 350 nm. These two layers 107 and 108 are both preferably formed by a sputtering process. If Xe and Kr are added at appropriate doses to a sputtering gas of Ar, then the internal stress of the film to be formed can be relaxed and peeling of the film can be prevented.

Next, resist masks 109 through 112 are defined, and a first etching process is carried out to form gate electrodes and capacitor lines for the respective TFTs. In this preferred embodiment, the first etching process is performed as an inductively coupled plasma (ICP) etching process in which $CF_4$, $Cl_2$ and $O_2$ gases are supplied as etching gases at flow rates of about 25 sccm, about 25 sccm and about 10 sccm, respectively, and in which an RF power of about 500 W is applied to a coil electrode at a frequency of about 13.56 MHz and at a pressure of about 1 Pa. The gate insulating film 106 and the first and second conductive layers 107 and 108 are selectively etched away by a plasma that has been generated under these conditions.

An RF power of about 150 W is also applied at a frequency of about 13.56 MHz to the wafer on a sample stage, thereby applying a substantially negative self-bias voltage thereto. By performing this first etching process, the second conductive layer 108 of Ta is selectively etched away into an upwardly tapered shape.

Thereafter, while leaving the resist masks 109 through 112 as they are, the conditions of the etching process are changed into those for a second etching process. Specifically, the second etching process is carried out by supplying $CF_4$ and $Cl_2$ gases as etching gases at flow rates of about 30 sccm and about 30 sccm, respectively, and by applying an RF power of about 500 W to a coil electrode at a frequency of about 13.56 MHz and at a pressure of about 1 Pa. The second etching process is continued for about 30 seconds with a plasma that has been generated under these conditions. An RF power of about 20 W is also applied at a frequency of about 13.56 MHz to the wafer, thereby applying a substantially negative self-bias voltage thereto. As a result of this second etching process that uses the mixture of $CF_4$ and $Cl_2$ gases, the Ta and TaN films are both etched to substantially the same degree. By performing these process steps, gate electrodes 113, 114 and 115 and a capacitor line 116 with upwardly tapered ends are made of the first and second conductive layers 107 and 108. It should be noted that the gate electrode 114 for the p-channel TFT will be used as a mask to prevent a portion of the semiconductor layer for the p-channel TFT to be doped with the n-type dopant element from being broadened excessively while the n-type dopant element is being introduced. Accordingly, the mask 110 for the gate electrode 114 of the p-channel TFT should have a greater width than the mask 109 for the gate electrode 113 of the n-channel TFT or the mask 111 for the gate electrode 115 of the pixel TFT.

Thereafter, as shown in FIG. 5B, while still leaving the masks 109 through 112 as they are, ions of an n-type dopant element are implanted into the island-shaped semiconductor layers 102 through 105, thereby forming n-type doped regions 118. Phosphorus (P) or arsenic (As) may be used as the n-type dopant element. In this preferred embodiment, phosphorus (P) ions are implanted by using a phosphine ($PH_3$) gas as a doping gas.

Furthermore, with the mask 109 through 112 still left there, the second etching process is carried out. In this preferred embodiment, the second etching process is carried out by supplying $CF_4$, $Cl_2$ and $O_2$ gases as etching gases at flow rates of about 20 sccm, about 20 sccm and about 20 sccm, respectively, and by applying an RF power of about 500 W to a coil electrode at a frequency of about 13.56 MHz and at a pressure of about 1 Pa, thereby applying a substantially negative self-bias voltage thereto. As a result of this second etching process, the second conductive layer 108 of Ta is selectively etched away.

As a result of this second etching process, the first conductive layer 107 including portions 113a, 114a, 115a and 116a and the second conductive layer 108 including portions 113b, 114b, 115b and 116b are selectively etched away, thereby forming gate electrodes 119, 120 and 121 and a capacitor line 122. In this process step, the gate electrodes 119 and 121 for n-channel TFTs are narrower in width than the gate electrode 120 for the p-channel TFT. This is because the gate electrode 120 for the p-channel TFT will be used as a mask to prevent the portion of the semiconductor layer of the p-channel TFT to be heavily doped with an n-type dopant element from being broadened excessively. Thus, the gate electrode 120 has a greater width than the gate electrodes 119 and 121 having the predetermined shape. The gate electrodes 119 and 121 for the n-channel TFTs and the capacitor line 122 that have been obtained by performing these process steps will be referred to herein as "gate electrodes with first shape" and "capacitor line with first shape". On the other hand, the gate electrode 120 for the p-channel TFT that has been obtained by performing these process steps will be referred to herein as a "gate electrode with second shaped".

Thereafter, an n-type dopant element is introduced into the semiconductor layers. Specifically, using the gate electrodes 119, 120 and 121, obtained by the second etching process, as masks, ions of an n-type dopant element (e.g., phosphorus (P) ions in this preferred embodiment) are implanted into portions of the semiconductor layers, which are located below the tapered edges of the first conductive layer 107, thereby forming a first group of n-type doped regions 123a, 124a, 125a and 126a and a second group of n-type doped regions 123b, 124b, 125b and 126b. In this case, the first group of n-type doped regions 123a through 126a may have a dopant (i.e., phosphorus (P)) concentration of about $1\times10^{20}/cm^3$ to about $1\times10^{21}/cm^3$, while the second group of n-type doped regions 123b through 126b may have a dopant (i.e., phosphorus (P)) concentration of about $5\times10^{17}/cm^3$ to about $5\times10^{19}/cm^3$. It should be noted that another n-type doped region 123c, which is formed under a tapered edge of the portion 119a of the first conductive layer 107, has a dopant concentration that is slightly lower than, but approximately equal to, that of the n-type doped region 123b.

Next, the resist masks 109 through 112 are removed, and instead another resist mask 127 is defined so as to partially cover the semiconductor layer of the n-channel TFT and perform a third etching process. Specifically, the third etching process is carried out by supplying $SF_6$ and $Cl_2$ gases as etching gases at flow rates of about 50 sccm and 10 sccm, respectively, and by applying an RF power of about 500 W to a coil electrode at a frequency of about 13.56 MHz and at a pressure of about 1.3 Pa. The third etching process is continued for about 30 seconds with a plasma that has been generated under these conditions. An RF power of about 10 W is also applied to the wafer on the sample stage at a frequency of about 13.56 MHz, thereby applying a substantially negative bias voltage thereto. As a result of this third etching process, portions 120a and 121a of the first conductive layer 107 are etched selectively, thereby forming gate electrodes 128 and 129 for the p-channel TFT and the pixel TFT, respectively, as shown in FIG. 5D.

Thereafter, a resist mask 130 for use to etch the gate electrode 128 for the p-channel TFT into a predetermined shape, a resist mask 131 that partially exposes the semiconductor layer of the pixel TFTs, and a resist mask 132 that covers the capacitor line completely, are defined as shown in FIG. 5E.

Then, the gate electrode 128 for the p-channel TFT is selectively etched away through the resist mask 130, thereby obtaining a gate electrode 133 for the p-channel TFT as shown in FIG. 5F. This gate electrode 133 of the p-channel TFT, obtained by performing these process steps, will be referred to herein as a "gate electrode with third shape". Also, the gate electrodes 129 for the pixel TFTs will be referred to herein as "gate electrodes with fourth shape".

Subsequently, ions of a p-type dopant element (e.g., boron (B) in this preferred embodiment) are implanted into the semiconductor layers, thereby forming p-type doped regions 134 through 139. The p-type dopant is added such that the p-type doped regions 134, 135, 137 and 138 will have p-type dopant concentrations of about $1\times10^{20}/cm^3$ to about $1\times10^{21}/cm^3$. The semiconductor layer of the p-channel TFT for the driver circuit (i.e., the pixel TFT) includes the n-type heavily doped region 124a. Accordingly, the semiconductor layer of the p-channel TFT will include a region 135a that has been heavily doped with both the n-type and p-type dopant elements and a region 135b that has been heavily doped with the p-type dopant element only.

In this preferred embodiment, before boron atoms are introduced into the semiconductor layer of the p-channel TFT, phosphorus ions are implanted into portions of the semiconductor layer, which are located under the etched portions of the TaN film. Thus, the boron ions can be implanted at a low acceleration voltage and the semiconductor layer is not damaged so much during the ion implantation process.

By performing these process steps, the n-type doped regions and p-type doped regions are defined in the respective semiconductor layers as shown in FIG. 5F.

Thereafter, the masks 127 and 130 through 132 are removed, and then a silicon nitride film, silicon dioxide film or silicon oxynitride film to be an inorganic interlevel dielectric film 140 is deposited to a thickness of about 50 nm to about 500 nm (typically in the range of about 100 nm to about 300 nm). In this preferred embodiment, a silicon oxynitride film is deposited to a thickness of about 150 nm by a plasma CVD process. Naturally, the inorganic interlevel dielectric film is not limited to the silicon oxynitride film, but may be any other silicon-containing insulating film with either a single-layer structure or a multilayer structure.

Next, to activate the dopant elements that have been introduced into the semiconductor layers and remove the catalytic element by a gettering action, the substrate is subjected to an annealing process, which may be a rapid thermal annealing (RTA) process as in the first through fourth preferred embodiments described above. As a result of the gettering process, the catalytic element is introduced into the gettering regions that have been doped with the phosphorus and boron atoms. Thus, the gettering regions will include the catalytic element at a concentration of at least about $1\times10^{19}/cm^3$. Also, as in the preferred embodiments described above, the gettering regions include an amorphous phase at a high percentage.

This annealing process may be performed before the inorganic interlevel dielectric film 140 is deposited. However, if the material of the gate electrodes is poorly resistant to heat, then the annealing process is preferably carried out after the interlevel dielectric film (i.e., an insulating film including silicon as its main ingredient such as a silicon nitride film) has been deposited to protect the interconnects and so on as in this preferred embodiment.

Then, the substrate may be further annealed at a temperature of about 300° C. to about 550° C. for approximately 1 hour to approximately 12 hours within an atmosphere including about 3% to about 100% of hydrogen, thereby hydrogenating the semiconductor layers. In this preferred embodiment, the substrate is annealed at about 410° C. for approximately 1 hour within a nitrogen atmosphere including about 3% of hydrogen. This annealing process is carried out to terminate the dangling bonds in the semiconductor layers with hydrogen atoms included in the interlevel dielectric film. The hydrogenation process may also be carried out as a plasma hydrogenation process, which uses hydrogen atoms that have been excited by plasma.

Thereafter, an organic interlevel dielectric film 141 made of an organic insulator is deposited on the inorganic interlevel dielectric film 140. In this preferred embodiment, an acrylic resin film is deposited to a thickness of about 1.6 µm. Then, the organic and inorganic interlevel dielectric films 141 and 140 are patterned to form contact holes that reach the respective doped regions.

Subsequently, a transparent conductive film is deposited thereon to a thickness of about 80 nm to about 120 nm and then patterned, thereby forming pixel electrodes 142. The transparent conductive film may be made of an indium oxide-zinc oxide ($In_2O_3$—ZnO) alloy, zinc oxide (ZnO), or zinc oxide to which gallium is added (ZnO:Ga) to increase the visible radiation transmittance or electrical conductivity.

Next, interconnects 143 and 144 to be electrically connected to the doped regions are formed in the driver circuit region 205. These interconnects 143 and 144 may be formed by patterning a multilayer structure consisting of a Ti film with a thickness of about 50 nm and an Al—Ti alloy film with a thickness of about 50 nm.

Meanwhile, interconnects 146 through 149 to be electrically connected to the doped regions are also formed in the pixel section 206.

The pixel electrode 142 is electrically connected to the semiconductor layer 105, which functions as one of the two electrodes that forms a storage capacitance along with the interconnect 148.

In this preferred embodiment, the pixel electrode 142 is made of the transparent conductive film. However, if the pixel electrode is made of a conductive material with reflectivity, then a reflective display device can be obtained. In that case, the pixel electrodes are also obtained by performing the process step of forming electrodes. The pixel electrodes are preferably made of a film that includes Al or Ag as its main ingredient or a multilayer structure thereof. In any case, the pixel electrodes are preferably made of a material having high reflectivity.

Figure 5G:
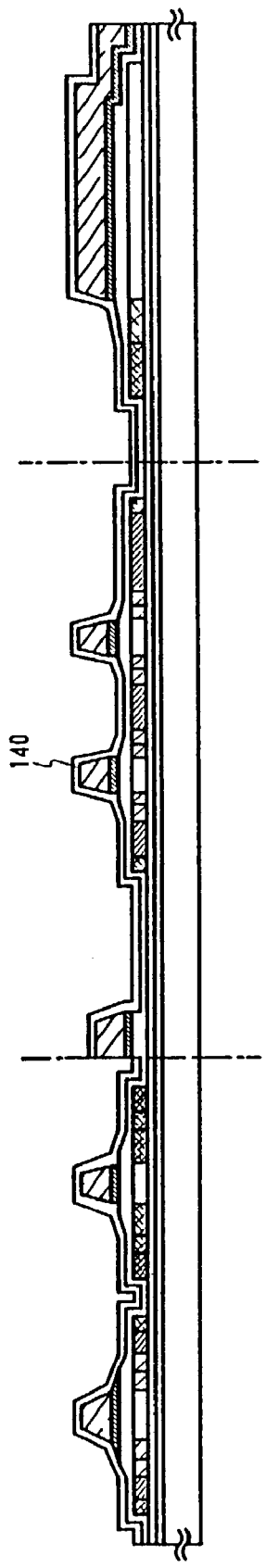
Figure 5H:
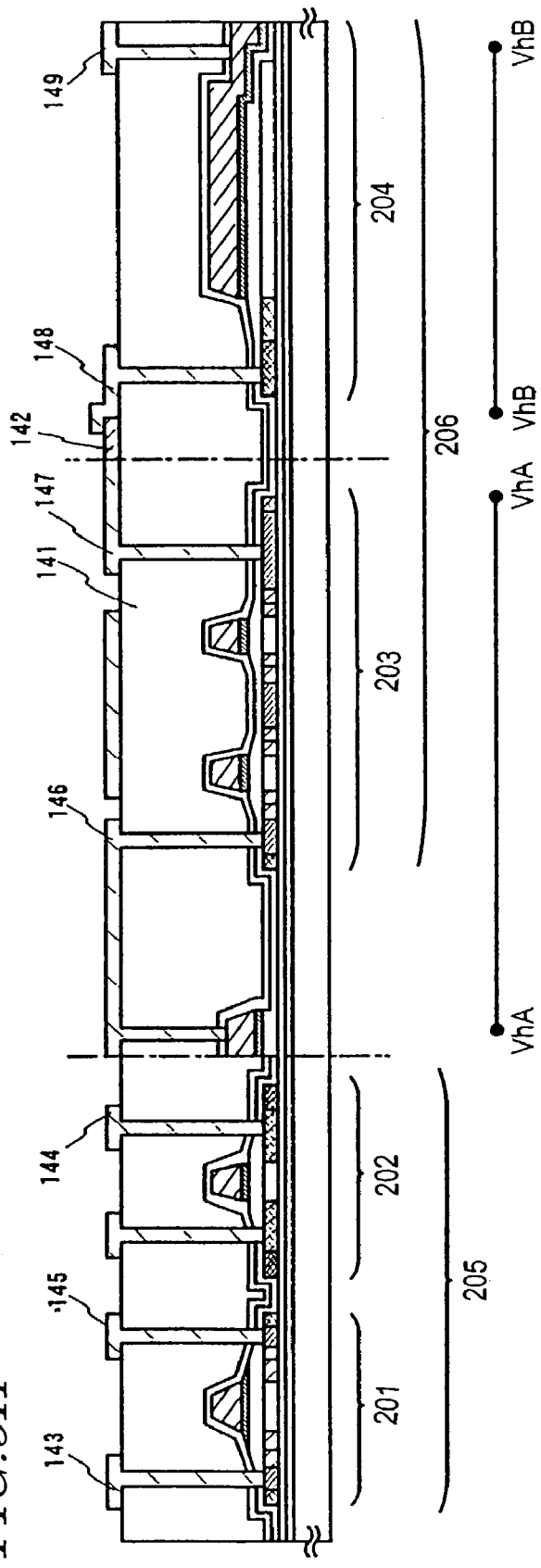

In this manner, TFTs for a driver circuit and TFTs for a pixel section (i.e., pixel TFTs) can be formed on the same substrate. Specifically, the driver circuit includes the n-channel TFT 201 and p-channel TFT 202, while the pixel section includes the pixel TFT 203 and storage capacitor 204 as shown in FIG. 5H. It should be noted that such a substrate will be referred to herein as an "active-matrix substrate" for convenience sake.

Figure 6:
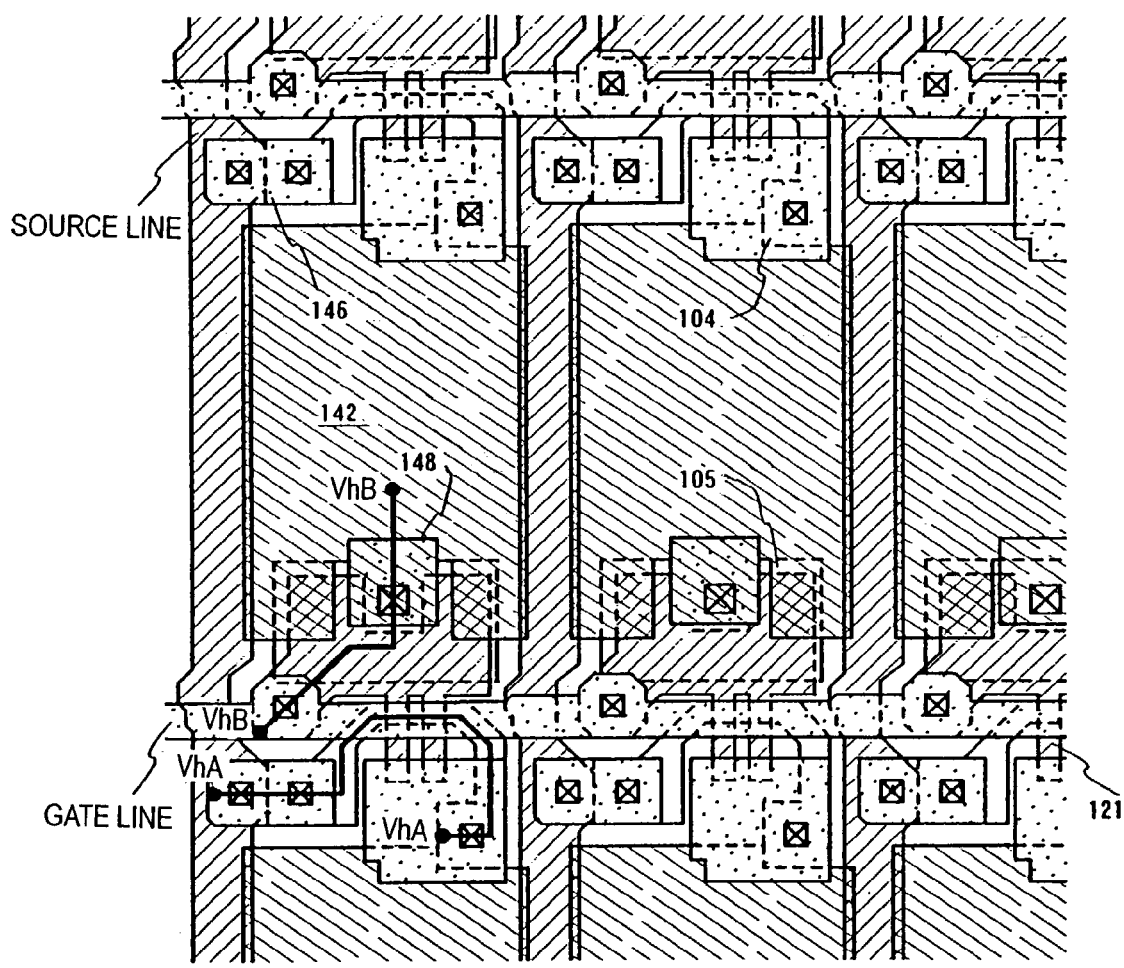
FIG. 6 is a plan view illustrating the active-matrix substrate obtained by performing the process steps shown in FIGS. 5A through 5H.

FIG. 6 is a plan view illustrating an active-matrix substrate obtained by performing these process steps. It should be noted that FIG. 5H is a cross-sectional view taken along lines VhA-VhA and VhB-VhB shown in FIG. 6.

The island-shaped semiconductor layer 102 of the n-channel TFT 201 for the driver circuit includes the channel forming region, source/drain regions 123a, doped regions 123b, doped regions 123c overlapped by the gate electrode 119 in the first shape (which doped regions will be identified herein by $L_{ov}$) and doped regions 134, which have been heavily doped with the n-type and p-type dopant elements and which will be gettering regions. The doped regions $L_{ov}$ preferably have a length of about 0.5 µm to about 3.0 µm (more preferably about 1.0 µm to about 1.5 µm) as measured in the channel length direction. The n-channel TFT 201 further includes the gate electrode 119 in the first shape, which consists of the portion 119a of the first conductive layer 107 and the portion 119b of the second conductive layer 108 that have been stacked in this order one upon the other.

The island-shaped semiconductor layer 103 of the p-channel TFT 202 for the driver circuit includes the channel forming region, source/drain regions 124a, doped regions 124b and doped regions 135a, which have been heavily doped with the n-type and p-type dopant elements and which will be gettering regions The p-channel TFT 202 further includes the gate electrode 133 in the third shape, which consists of the portion 133a of the first conductive layer 107 and the portion 133b of the second conductive layer 108 that have been stacked in this order one upon the other.

The island-shaped semiconductor layer 104 of the pixel TFT 203 in the pixel section includes the channel forming region, source/drain regions 125a and doped regions 125b and 125c. The pixel TFT 203 further includes the gate electrode 129 in the fourth shape, which consists of the portion 129a of the first conductive layer 107 and the portion 129b of the second conductive layer 108 that have been stacked in this order one upon the other.

Furthermore, the storage capacitor 204, including the capacitor line 122, an insulating film made of the same material as the gate insulating film, and the semiconductor layer 105 doped with the p-type dopant element, is provided. In the example illustrated in FIG. 6, the pixel TFT 203 has a double gate structure. Alternatively, the pixel TFT 203 may also have a single-gate structure or a multi-gate structure including three or more gate electrodes.

In this preferred embodiment, the structure of the TFTs that make up each of various circuits on the substrate is optimized according to the specifications required for the pixel TFTs and driver circuit, thereby improving the performance and reliability of the semiconductor devices. In addition, the gate electrodes are made of a conductive material having good heat resistance, thus making it easier to activate the dopants in the LDD regions and source/drain regions. Furthermore, since the interconnects are made of a material with low resistivity, the wiring resistance can be reduced sufficiently.

Embodiment 6

Hereinafter, a sixth specific preferred embodiment of the present invention will be described. The sixth preferred embodiment is a method for fabricating an active-matrixaddressed liquid crystal display (which will also be referred to herein as an "active-matrix-addressed LCD panel") on the active-matrix substrate of the fifth preferred embodiment described above.

Figure 7:
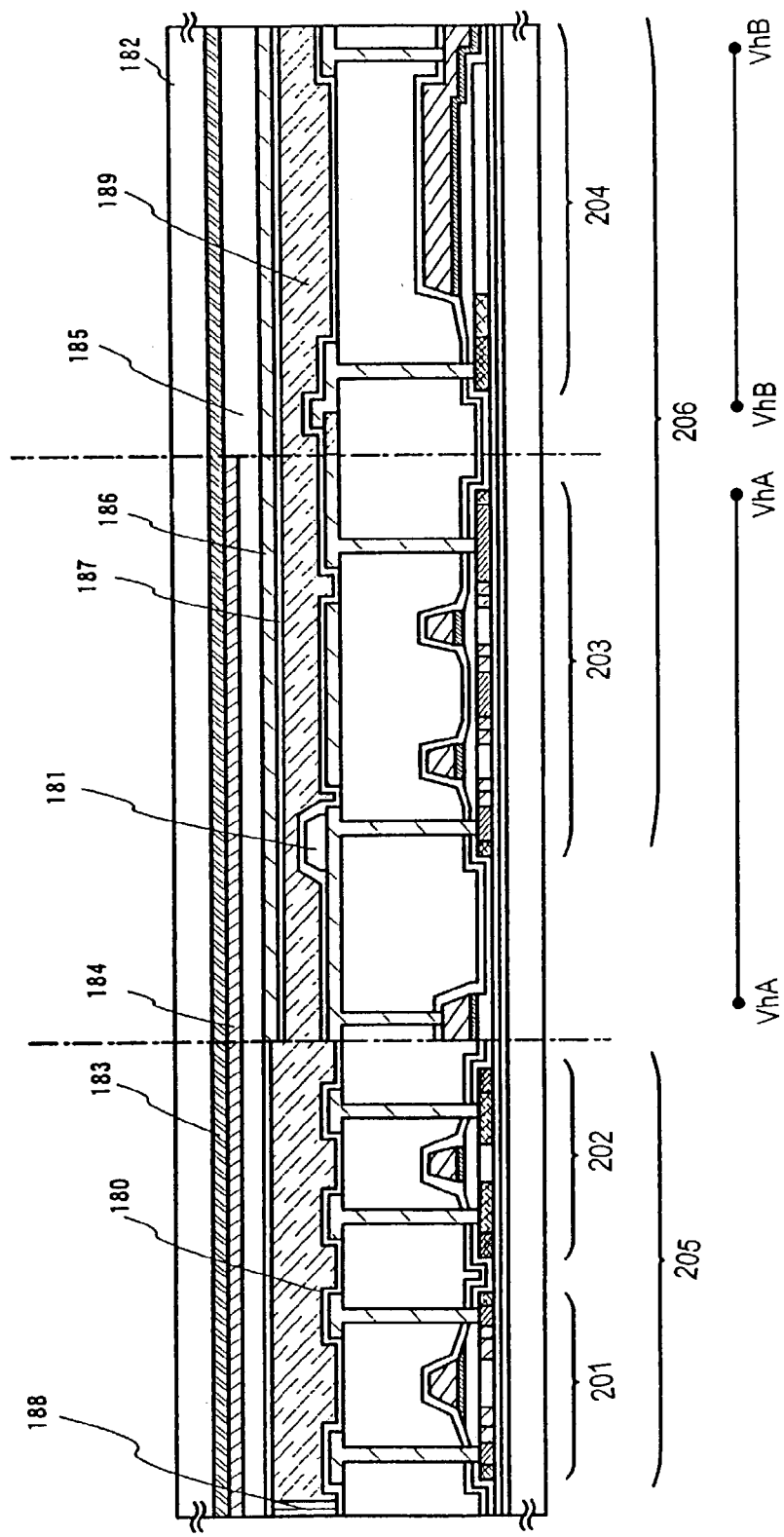
FIG. 7 is a cross-sectional view illustrating an active-matrix-addressed liquid crystal display according to a sixth specific preferred embodiment of the present invention.

First, the active-matrix substrate shown in FIG. 5H is prepared. Next, as shown in FIG. 7, an alignment film 180 is formed on the active-matrix substrate and then subjected to a rubbing treatment. In this preferred embodiment, before the alignment film 180 is formed, columnar spacers 181 are provided at predetermined positions to maintain an intended gap between the substrates. The spacers 181 may be formed by patterning an organic resin film of an acrylic resin, for example. The columnar spacers 181 may be replaced with spherical spacers that are dispersed over the entire surface of the substrate.

Next, a counter substrate 182 is prepared. The counter substrate 182 includes red and blue coloring layers 183 and 184 and a flattening film 185. A second opaque region is defined by partially overlapping the coloring layers 183 and 184 one upon the other. Although not shown in FIG. 7, a first opaque region is defined by partially overlapping the red coloring layer 183 with a green coloring layer.

Subsequently, a counter electrode 186 is formed on the pixel section and another alignment film 187 is deposited over the counter substrate 182 and then subjected to a rubbing treatment.

Then, the active-matrix substrate, including the pixel section and the driver circuit thereon, is bonded to the counter substrate 182 with a seal member 188. The seal member 188 includes a filler. Thus, the two substrates can be bonded together with a uniform gap provided between them by the filler and columnar spacers. Thereafter, a liquid crystal material 189 is injected into the gap between the substrates and then the assembly is hermetically sealed up with an encapsulant (not shown). The liquid crystal material 189 may be any known liquid crystal material. In this manner, the active-matrix-addressed liquid crystal display shown in FIG. 7 is completed. If necessary, the active-matrix substrate or the counter substrate may be divided into portions with a predetermined shape. Although not shown, polarizers, flexible printed circuits (FPCs) and so on are further provided for the LCD by known techniques.

The configuration of the LCD panel obtained in this manner will be described with reference to FIG. 8A. In FIG. 8, each member having the same function as the counterpart shown in FIG. 7 is identified by the same reference numeral.

Figure 8A:
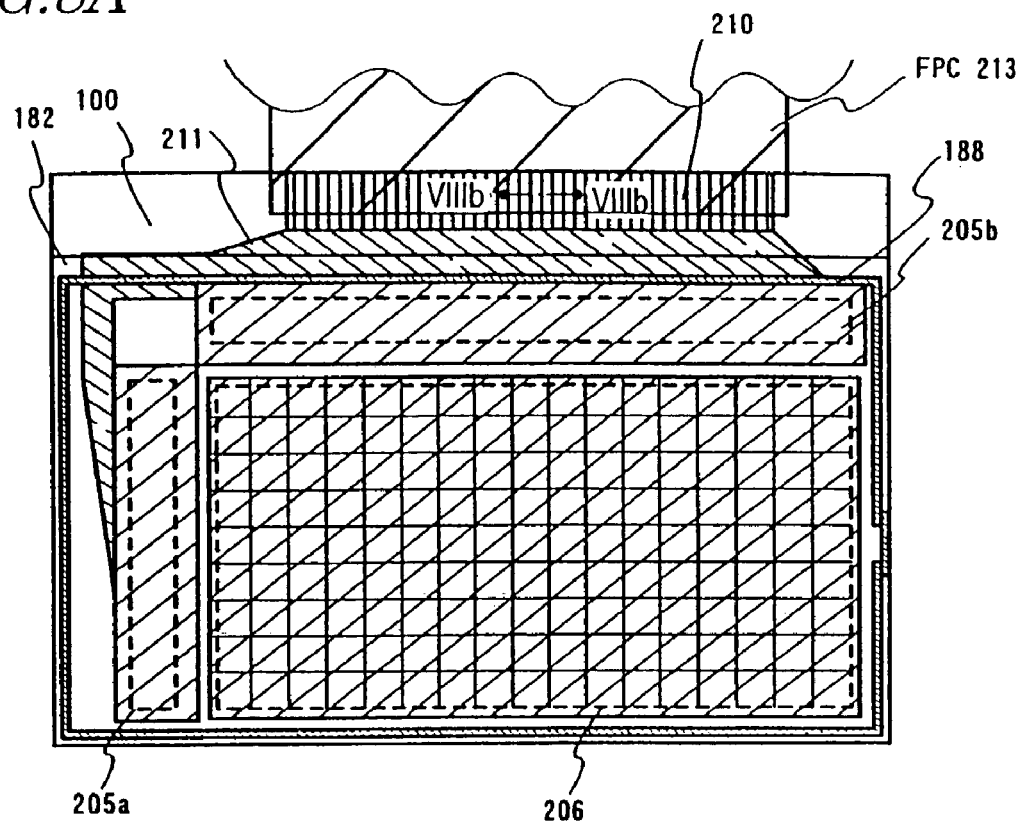
FIG. 8A is a plan view of the active-matrix-addressed liquid crystal display shown in FIG. 7.

FIG. 8A is a plan view illustrating the active-matrix substrate and the counter substrate 182 that have been bonded together with the seal member 188. As shown in FIG. 8A, the active-matrix substrate includes a pixel section 206, driver circuits 205a and 205b, external input terminals 210 to which the FPC will be bonded, and an interconnect 211 to connect the external input terminals 210 to the input terminals of the respective circuits. The counter substrate 182 includes color filters as described above.

Figure 8B:
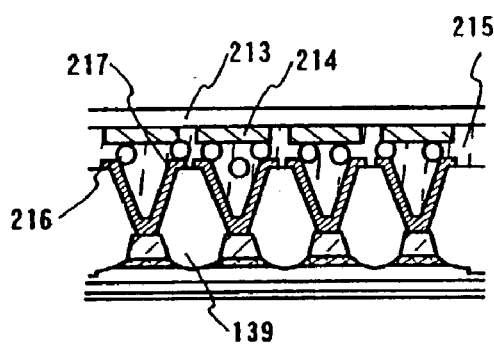
FIG. 8B is a partial cross-sectional view thereof as taken on the plane VIIIb-VIIIb shown in FIG. 8A.

FIG. 8B is a cross-sectional view of the external input terminals 210 as taken on the plane VIIIb-VIIIb shown in FIG. 8A. As shown in FIG. 8B, an FPC, including a base film 213 and interconnects 214, is bonded to the external input terminals 210 with an anisotropic conductive resin 215. To increase the mechanical strength, a reinforcing plate is further provided under the external input terminals 210. The external input terminals 210 include interconnects 217 that are made of the same conductive film as the pixel electrodes 140. The diameter of conductive particles 216 included in the anisotropic conductive resin 215 is smaller than the pitch of the interconnects 217. Thus, if an appropriate amount of conductive particles 216 are dispersed in the resin adhesive 215, the interconnects 217 can be electrically connected to the interconnects 214 on the FPC without causing any short-circuit between the conductive particles 216 and adjacent interconnects 217.

The LCD panel obtained in this manner may be used as a display for any of various types of electronic appliances.

Embodiment 7

Figure 9:
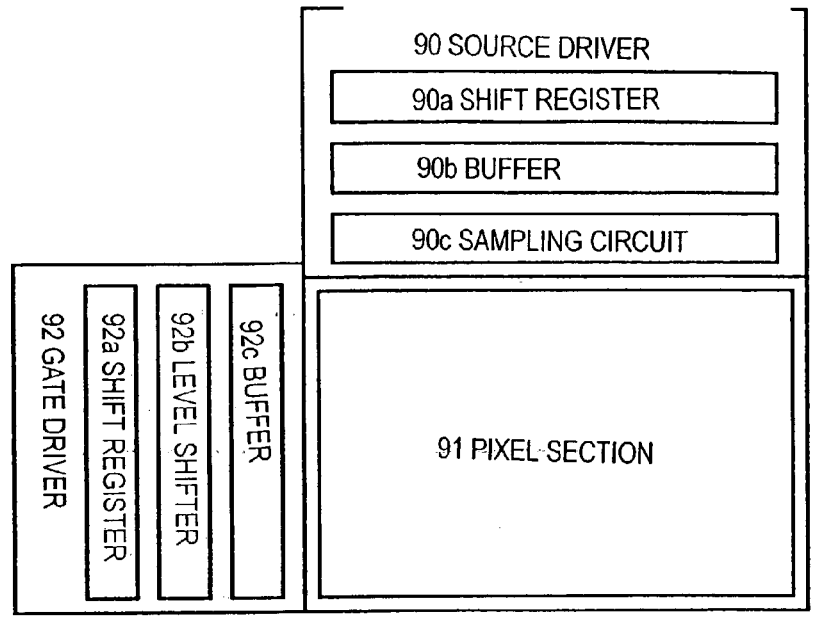
FIG. 9 is a schematic plan view of an analog driver circuit according to a seventh specific preferred embodiment of the present invention.

Hereinafter, a seventh specific preferred embodiment of the present invention will be described with reference to FIG. 9. FIG. 9 is a block diagram showing a configuration for an analog driver circuit for a semiconductor device. As shown in FIG. 9, the analog driver circuit includes a source driver 90, a pixel section 91, and a gate driver 92. As used herein, the "driver circuit" is a generic term for any circuit including the source driver and gate driver.

As shown in FIG. 9, the source driver 90 includes a shift register 90a, a buffer 90b and a sampling circuit (i.e., transfer gate) 90c. The gate driver 92 includes a shift register 92a, a level shifter 92b and a buffer 92c. If necessary, the source driver 90 may further include a level shifter between the shift register 90a and the sampling circuit 90c.

The pixel section 91 is made up of a number of pixels, which are arranged in columns and rows (i.e., in matrix) and each of which includes a TFT according to any of the preferred embodiments of the present invention described above. Although not shown in FIG. 9, another gate driver may be provided so as to be opposed to the gate driver 92 with the pixel section 91 interposed between them.

Figure 10:
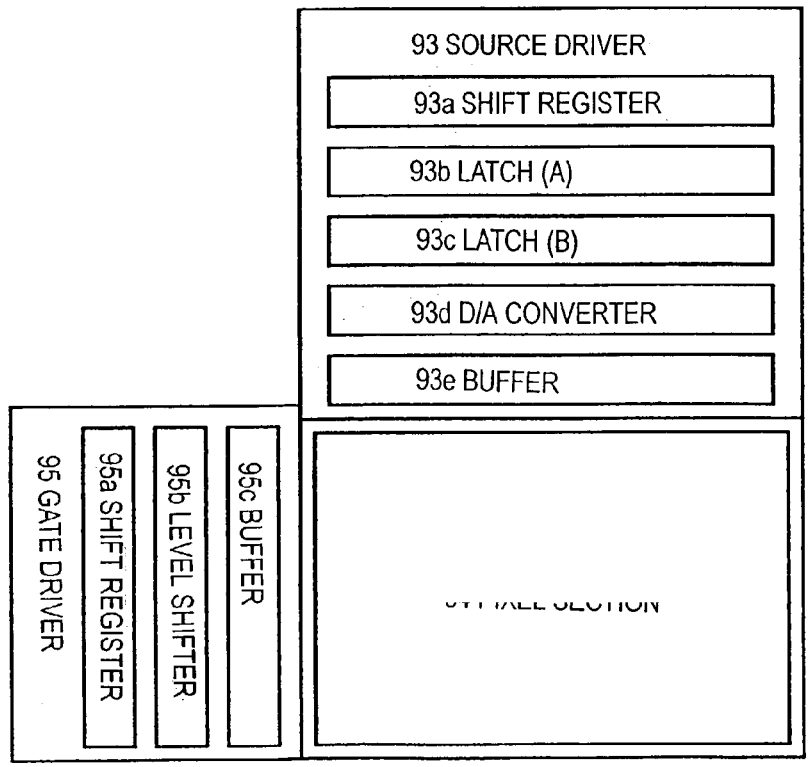
FIG. 10 is a schematic plan view of a digital driver circuit according to the seventh preferred embodiment of the present invention.

When the semiconductor device should be driven by a digital signal processing technique, not the analog signal processing, the sampling circuit 90c may be replaced with latches 93b and 93c as shown in FIG. 10. In that case, the source driver 93 may include a shift register 93a, first and second latches 93b and 93c, a D/A converter 93d and a buffer 93e. On the other hand, the gate driver 95 may include a shift register 95a, a level shifter 95b and a buffer 95c. If necessary, the source driver 93 may further include a level shifter between the second latch 93c and the D/A converter 93d.

These circuits may be fabricated by any of the methods of the present invention described above. FIGS. 9 and 10 show only the arrangements of the pixel section and respective drivers. Optionally, a memory and/or a microprocessor may be formed on the substrate of the display panel. TFTs for the memory and/or microprocessor may also be fabricated by performing the process steps of forming TFTs for the drivers or pixel section.

Embodiment 8

Hereinafter, an eighth specific preferred embodiment of the present invention will be described with reference to FIGS. 11A through 11D.

In this preferred embodiment, the amorphous silicon film is crystallized by a different method from that of the fifth preferred embodiment described above. FIGS. 11A through 11D are cross-sectional views illustrating respective process steps of the manufacturing process of the eighth preferred embodiment. The process steps shown in FIGS. 11A through 11D are supposed to be carried out in this order.

Figure 11A:
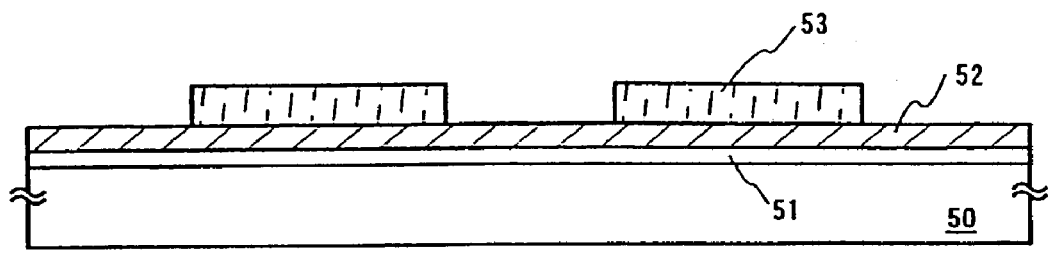
FIGS. 11A through 11D are cross-sectional views illustrating respective process steps for fabricating a semiconductor device according to an eighth specific preferred embodiment of the present invention.

First, as shown in FIG. 11A, an undercoat insulating film 51 of silicon oxynitride and an amorphous silicon film 52 are deposited in this order to thicknesses of about 300 nm and about 50 nm, respectively, on a glass substrate 50. This deposition process is preferably performed continuously inside the same deposition system without exposing the undercoat insulating film or the amorphous silicon film to the air.

Then, a masking insulating film 53 of silicon dioxide is deposited to a thickness of about 200 nm on the amorphous silicon film 52. As shown in FIG. 11A, the masking insulating film 53 has openings, through which a catalytic element will be introduced into the amorphous silicon film 52 in the next process step.

Figure 11B:
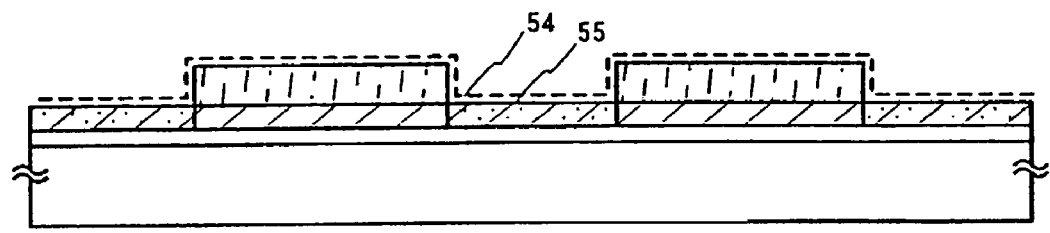

Subsequently, as shown in FIG. 11B, the surface of the substrate is spin-coated with an aqueous solution (e.g., a nickel acetate aqueous solution), including a catalytic element (e.g., nickel in this preferred embodiment) at a concentration of about 10 ppm when converted into an equivalent weight, thereby forming a catalytic element layer 54 thereon. In this process step, the catalytic element layer 54 selectively contacts with the amorphous silicon film 52 inside the openings of the masking insulating film 53, thereby defining catalytic element doped regions 55 in the amorphous silicon film 52. The catalytic element that may be used in this process step is at least one element that is selected from the group consisting of iron (Fe), nickel (Ni), cobalt (Co), ruthenium (Ru), rhodium (Rh), palladium (Pd), osmium (Os), iridium (Ir), platinum (Pt), copper (Cu) and gold (Au).

In this preferred embodiment, nickel is added to the amorphous silicon film 52 by the spin coating technique. Alternatively, a thin-film of the catalytic element (e.g., a nickel thin film in this preferred embodiment) may be deposited on the amorphous silicon film 52 by an evaporation process or a sputtering process.

Figure 11C:
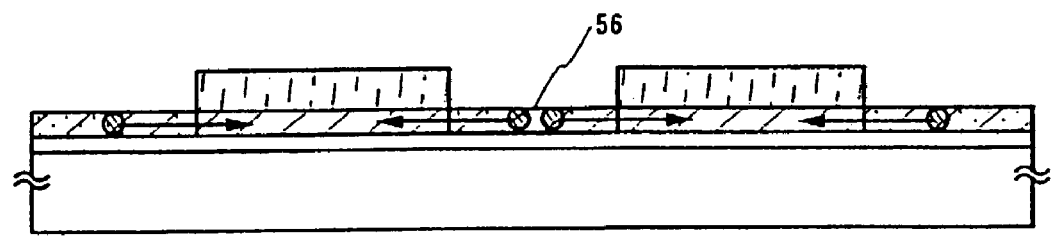
Figure 11D:
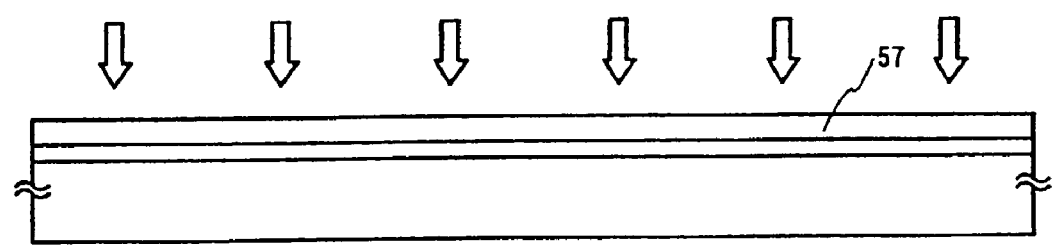

Thereafter, as shown in FIG. 11C, the substrate is preferably annealed at a temperature of about 500° C. to about 650° C. (more preferably at about 550° C. to about 600° C.) for approximately 6 hours to approximately 16 hours (more preferably approximately 8 hours to approximately 14 hours). In this preferred embodiment, the substrate is annealed at about 570° C. for approximately 14 hours. As a result, as shown in FIG. 11C, crystal nuclei are created in the catalytic element introduced regions 55 and crystals grow from these crystal nuclei substantially parallelly to the surface of the substrate (as indicated by the arrows in FIG. 11C). Consequently, a crystalline silicon film 57, of which the crystal growing directions are aligned with each other macroscopically, can be obtained. In this process step, the nickel atoms 54 existing on the masking insulating film 53 are blocked by the masking insulating film 53 and cannot reach the amorphous silicon film 52. Thus, the amorphous silicon film 52 is crystallized only by the nickel atoms that have been introduced into the regions 55 of the amorphous silicon film 52. Optionally, the resultant crystalline silicon film 57 may have its crystallinity further improved by being exposed to laser beams as shown in FIG. 11D.

The crystallization method of this preferred embodiment is applicable for use in any of the manufacturing processes of the preferred embodiments described above. By adopting this crystallization method, a high-performance TFT with further increased current drivability can be obtained.

Embodiment 9

Hereinafter, a ninth specific preferred embodiment of the present invention will be described. FIGS. 13A through 13F are plan views showing exemplary arrangements of gettering regions in a semiconductor layer. The arrangements of this preferred embodiment are applicable for use in the n-channel TFT and/or p-channel TFT according to any of various preferred embodiments of the present invention described above. It should be noted that where the n-channel TFT and p-channel TFT are both formed on the same substrate, the area of the gettering regions in the active region of the n-channel TFT is preferably approximately equal to that of the gettering regions in the active region of the p-channel TFT. Also, the distance between the gettering regions and the channel forming region in the n-channel TFT is preferably approximately equal to the distance between the gettering regions and the channel forming region in the p-channel TFT. Then, the catalytic element gettering efficiency of the n-channel TFT can be almost equalized with that of the p-channel TFT.

As used herein, when the area of the gettering regions in the active region of the n-channel TFT is approximately equal to that of the gettering regions in the active region of the p-channel TFT, the S/W ratio of the n-channel TFT is preferably approximately equal to that of the p-channel TFT. The S/W ratio is the ratio of the area S of the gettering regions to the width W of the active region (or channel forming region) in the n-channel and p-channel TFTs.

Hereinafter, it will be described exactly in what shapes the gettering regions may be defined in the active region of the n-channel or p-Channel TFT according to this preferred embodiment. In this preferred embodiment, the gettering regions have been doped with a p-type dopant and/or an n-type dopant and a rare gas element, have not been crystallized completely, and still include some amorphous portions.

Figure 13A:
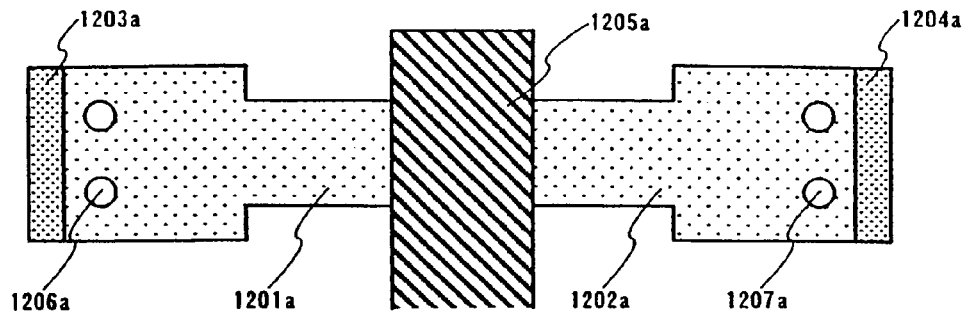
FIGS. 13A through 13F are plan views illustrating exemplary arrangements of gettering regions according to a ninth specific preferred embodiment of the present invention.

FIG. 13A shows an exemplary layout in which rectangular gettering regions 1203a and 1204a are arranged at the outer edges of the active region (i.e., so as to be separated from the channel forming region of the active region under the gate electrode 1205a) such that their longer sides are parallel to those of the gate electrode 1205a and that the four corners thereof overlap with those of the active region.

Figure 13B:
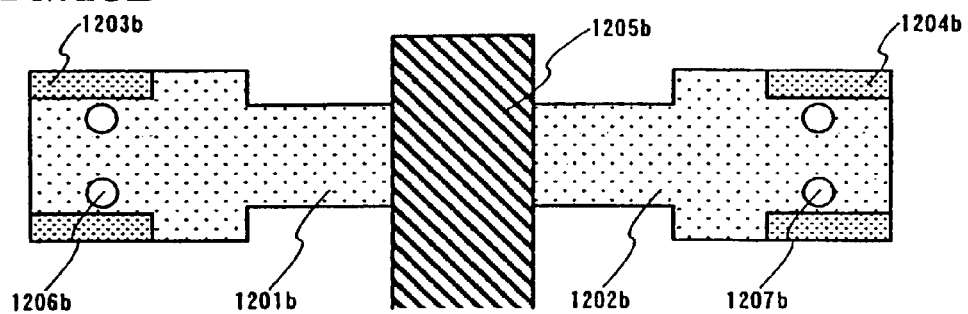

FIG. 13B shows another exemplary layout in which rectangular gettering regions 1203b and 1204b are arranged at the outer edges of the active region (i.e., so as to be separated from the channel forming region of the active region under the gate electrode 1205b) such that their longer sides are perpendicular to those of the gate electrode 1205b and that the four corners thereof overlap with those of the active region.

Figure 13C:
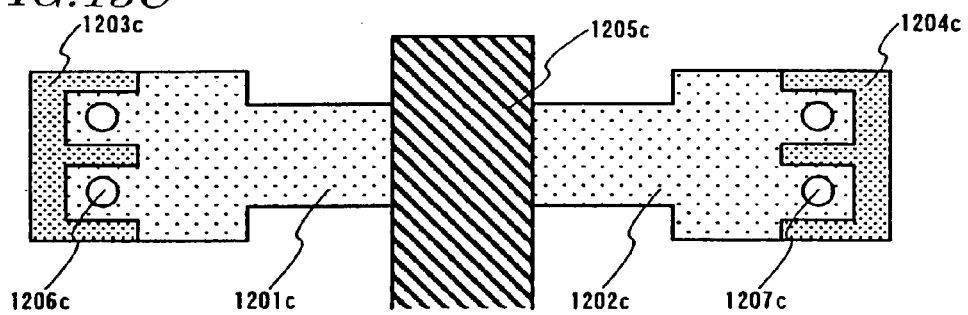

FIG. 13C shows still another exemplary layout in which gettering regions 1203c and 1204c of a complex shape are arranged at the outer edges of the active region (i.e., so as to be separated from the channel forming region of the active region under the gate electrode 1205c) such that the four corners thereof overlap with those of the active region. Each of these complex gettering regions 1203c and 1204c consists of a rectangle of which the longer sides are parallel to those of the gate electrode 1205c and three other rectangles of which the longer sides are perpendicular to those of the gate electrodes 1205c. According to the arrangement shown in FIG. 13C, the gettering regions can have a greater area and can exhibit higher catalytic element gettering efficiency than the arrangement shown in FIG. 13A or 13B.

In each of these three arrangements shown in FIGS. 13A, 13B and 13C, the gettering regions are arranged at such locations as not to block the current that should flow between the contact members provided for the source/drain regions. As used herein, the "contact member" is a member that electrically connects a portion of a line, which connects respective TFTs together, to a portion of an active region. Specifically, in the arrangement shown in FIG. 13A, the gettering regions 1203a and 1204a are arranged at such locations as not to block the current that flows between the contact members 1206a and 1207a provided for the source and drain regions 1201a and 1202a, respectively.

In the same way, in the arrangement shown in FIG. 13B, the gettering regions 1203b and 1204b are arranged at such locations as not to block the current that flows between the contact members 1206*b* and 1207*b* provided for the source and drain regions 1201*b* and 1202*b*, respectively.

In the same way, in the arrangement shown in FIG. 13C, the gettering regions 1203*c* and 1204*c* are arranged at such locations as not to block the current that flows between the contact members 1206*c* and 1207*c* provided for the source and drain regions 1201*c* and 1202*c*, respectively.

Figure 13D:
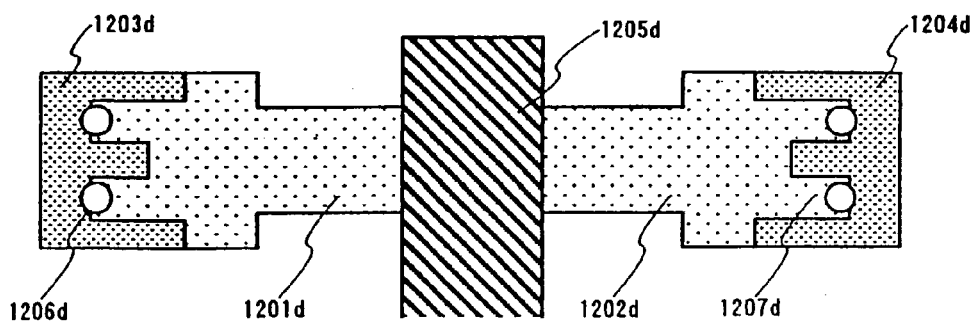

Furthermore, in yet another exemplary arrangement shown in FIG. 13D, the gettering regions 1203*d* and 1204*d* are further expanded to increase the gettering efficiency thereof compared to the arrangement shown in FIG. 13C, and the gettering regions 1203*d* and 1204*d* partially overlap with the contact members 1206*d* and 1207*d*, respectively. As far as the area of the partial overlap between the gettering region 1203*d* or 1204*d* and the contact member 1206*d* or 1207*d* is not so significant, no serious problems should arise. However, once the overlap area exceeds a certain limit, the increase in contact resistance will be a non-negligible one. For that reason, the overlap area should not exceed half of the area of the contact members 1206*d* and 1207*d*. It should be noted that the distance between the contact member 1206*d* or 1207*d* and the gettering region 1203*d* or 1204*d* needs to be defined with the alignment accuracy of an aligner for use to form respective regions by a photolithographic process taken into account.

However, the gettering regions do not have to be arranged at the locations shown in FIG. 13A, 13B, 13C or 13D but may be defined at any other pair of locations unless the gettering regions block the current flowing between the source/drain regions during the ON-state operation of the TFTs.

Next, two more exemplary arrangements will be described with reference to FIGS. 13E and 13F.

Figure 13E:
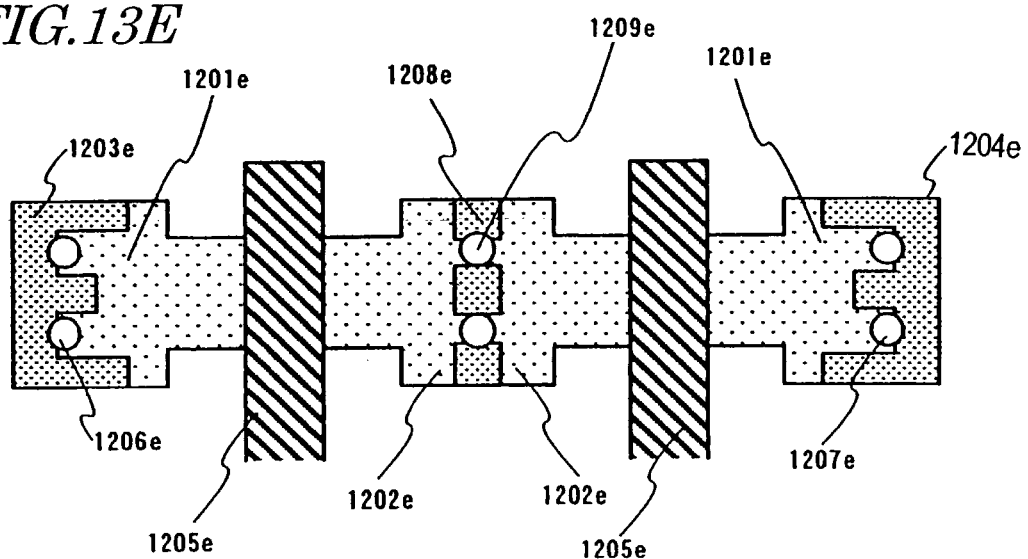

In the arrangement shown in FIG. 13E, two gate electrodes 1205*e* cross the active region to define two channel forming regions under them. A source region 1201*e* (or drain region 1202*e*), a gettering region 1208*e* and contact members 1209*e* are provided between the two gate electrodes 1205*e*. As in the arrangements shown in FIGS. 13A through 13D, the gettering regions 1203*e* and 1204*e* are provided at the outer edges of the active region, and the source regions 1201*e* (or drain regions 1202*e*) and contact members 1206*e* and 1207*e* are provided inside of the gettering regions 1203*e* and 1204*e*. In the arrangement shown in FIG. 13E, the gettering region 1203*e* or 1204*e* may also partially overlap with the contact member 1206*e* or 1207*e*. Care should be taken, however, such that the overlap area should not exceed half of the area of the contact member 1206*e* or 1207*e*.

Figure 13F:
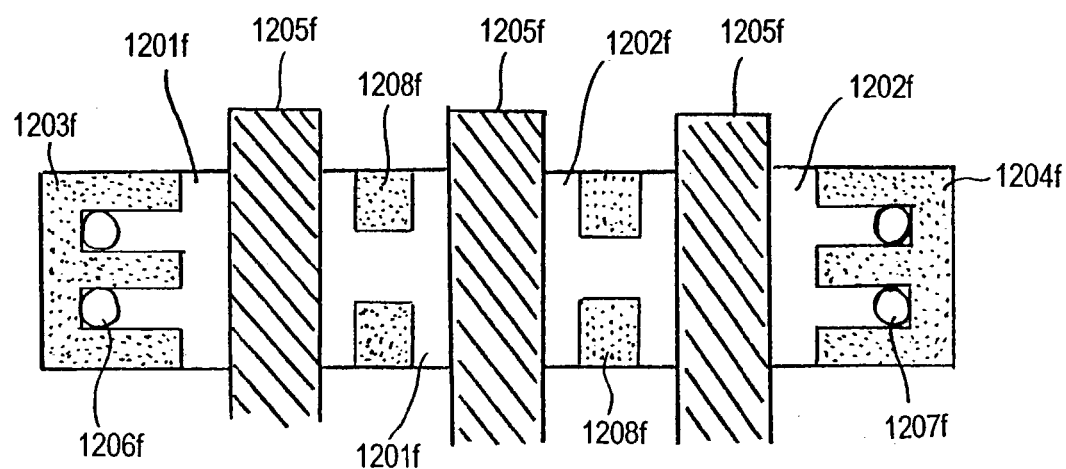

In the arrangement shown in FIG. 13F, three gate electrodes 1205*f* cross the active region to define three channel forming regions under them. In the example illustrated in FIG. 13F, the three TFTs share the same active region and the source/drain regions are connected in series together. In this arrangement, no contact members are provided at the junctions. Thus, this arrangement may be used when no electric signals need to be output through the junctions. TFTs with such an arrangement are actually used in a circuit such as a clocked inverter or a latch circuit. The source/drain regions 1201*f* and 1202*f* and gettering regions 1208*f* are defined between the multiple gate electrodes 1205*f*.

As in the arrangements shown in FIGS. 13A through 13D, the gettering regions 1203*f* and 1204*f* are provided at the outer edges of the active region, and the source region 1201*f* (or drain region 1202*f*) and contact members 1206*f* and 1207*f* are provided inside of the gettering regions 1203*f* and 1204*f*. In the junction regions, the gettering regions 1208*f* are arranged at such locations as not to block the current flowing from the contact member 1206*f* to the contact member 1207*f*.

The shape and sizes of the active region of a TFT are appropriately determined according to the amount of current that should flow through the TFT. In the arrangements shown in FIGS. 13A through 13E, the active region has a wedge shape in which the channel forming region has a narrower width than the source/drain regions. On the other hand, in the active region of the arrangement shown in FIG. 13F, the channel forming regions have the same width as the source/drain regions. In the example shown in FIG. 13F, the active region may have any arbitrary shape.

As a result of the annealing process performed for gettering purposes, the catalytic element is introduced into the gettering regions. Consequently, the gettering regions include the catalytic element at a concentration of about $1 \times 10^{19}/cm^3$ or more.

Embodiment 10

Hereinafter, a tenth specific preferred embodiment of the present invention will be described.

As described above, a semiconductor device according to any of the preferred embodiments of the present invention can be used effectively in an active-matrix-addressed display device. That is to say, the present invention is applicable for use in any of various electronic appliances that includes such an active-matrix-addressed display device in its display panel. Examples of electronic appliances in which the present invention can effectively find applications include camcorders, digital cameras, (rear or front) projectors, head mounted displays (goggle type displays), personal computers and personal digital assistants such as mobile computers, cell phones and electronic books.

Hereinafter, exemplary electronic appliances, each including the semiconductor device of the present invention, will be described with reference to FIGS. 14A through 16C.

Figure 14A:
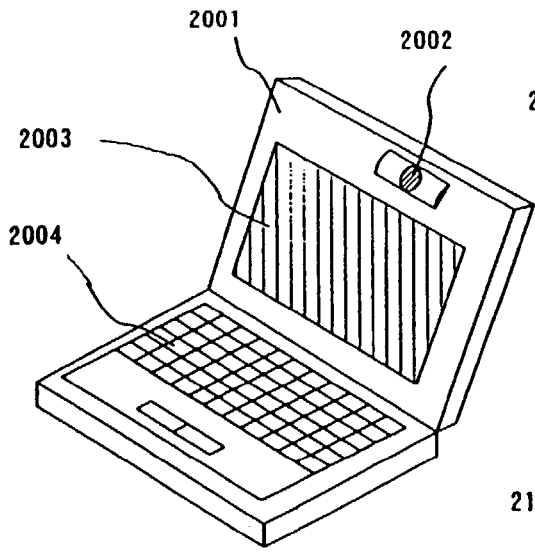
FIGS. 14A through 14F illustrate various electronic appliances in which semiconductor devices according to the present invention can be used effectively.

The electronic appliance shown in FIG. 14A is a personal computer, which includes a body 2001, an image input device 2002, a display 2003 and a keyboard 2004.

Figure 14B:
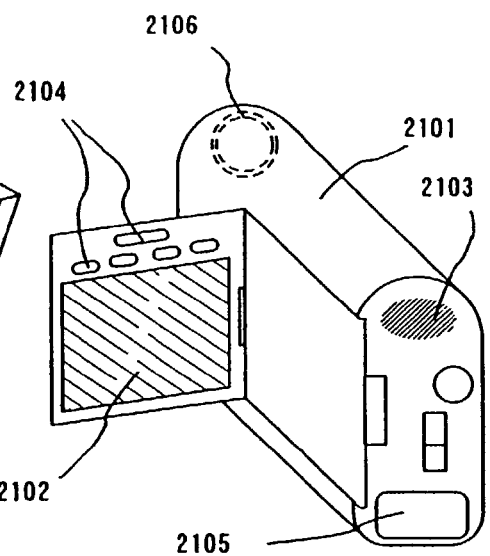

The electronic appliance shown in FIG. 14B is a camcorder, which includes a body 2101, a display 2102, an audio input device 2103, operating switches 2104, a battery 2105 and an image pickup device 2106.

Figure 14C:
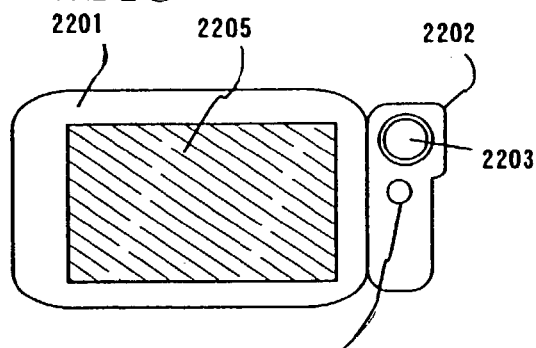

The electronic appliance shown in FIG. 14C is a mobile computer, which includes a body 2201, a camera 2202 with an image pickup device 2203, an operating switch 2204 and a display 2205.

Figure 14D:
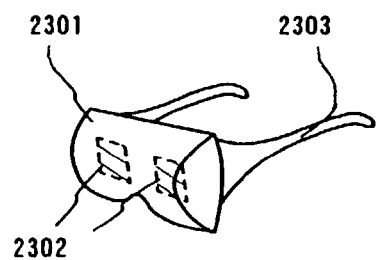

The electronic appliance shown in FIG. 14D is a goggle type display, which includes a body 2301, displays 2302 and arms 2303.

Figure 14E:
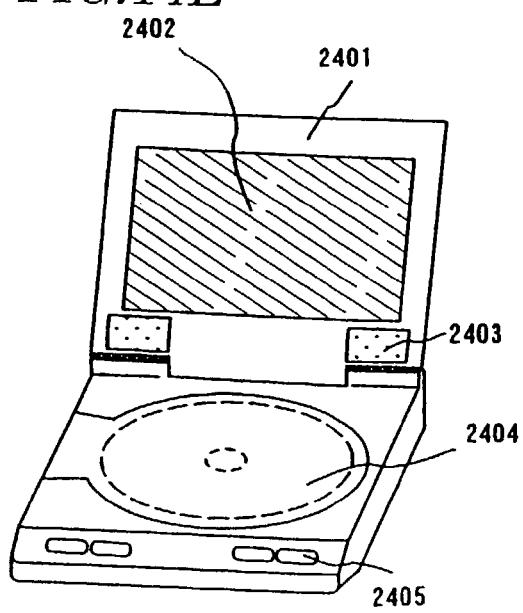

The electronic appliance shown in FIG. 14E is a player to read a storage medium on which data or a program is stored. The player includes a body 2401, a display 2402, loudspeakers 2403, a storage medium 2404 and operating switches 2405. This player can read a DVD or a CD as the storage medium and may be used to listen to the music, watch a movie, play games, and browse web pages.

Figure 14F:
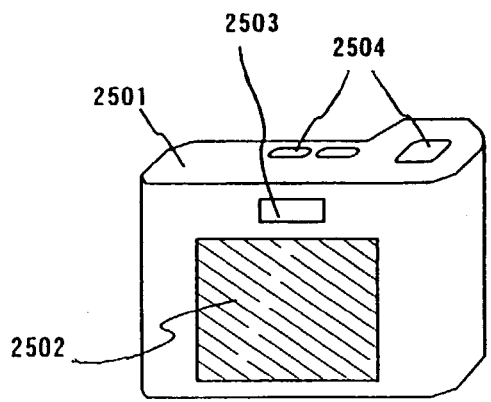

The electronic appliance shown in FIG. 14F is a digital camera, which includes a body 2501, a display 2502, a viewfinder 2503, operating switches 2504 and an image pickup device (not shown).

By using the semiconductor device of the present invention in the CMOS driver section of any of these electronic appliances, the driver circuit can exhibit highly reliable and stabilized circuit characteristics. This is because the present invention improves the characteristics of the n-channel and p-channel TFTs by upgrading the crystallinity of the crystalline silicon film with the addition of the catalytic element and then by removing the catalytic element sufficiently through the gettering process. In addition, according to the present invention, the abnormal increase in OFF-state leakage current, which is believed to be caused normally by the precipitation of the catalytic element, can be minimized even in pixel TFTs as switching elements or in TFTs for a sampling circuit in an analog switch. As a result, an image of quality can be displayed uniformly in any of these various electronic appliances.

Figure 15A:
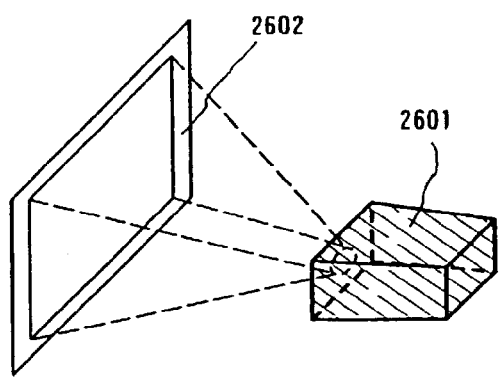
FIGS. 15A and 15B illustrate projectors in which semiconductor devices according to the present invention can be used effectively.

The electronic appliance shown in FIG. 15A is a front projector, which includes a projector 2601 and a screen 2602.

Figure 15B:
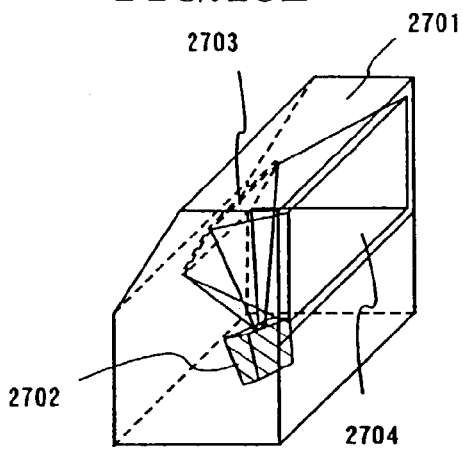

The electronic appliance shown in FIG. 15B is a rear projector, which includes a body 2701, a projector 2702, a mirror 2703 and a screen 2704.

Figure 15C:
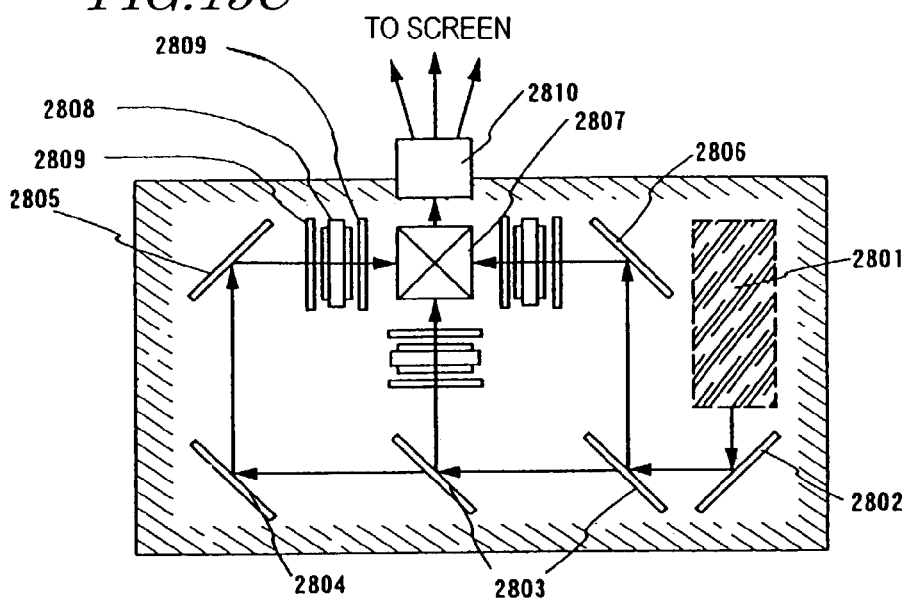
FIG. 15C shows an exemplary internal arrangement for the projectors shown in FIGS. 15A and 15B.

FIG. 15C shows an exemplary internal arrangement for the projectors 2601 and 2702 shown in FIGS. 15A and 15B. As shown in FIG. 15C, the projectors 2601 and 2702 each include a light source optical system 2801, mirrors 2802 and 2804 through 2806, dichroic mirrors 2803, a prism 2807, LCD panels 2808, phase plates 2809, and a projection optical system 2810. The projection optical system 2810 is an optical system including a projection lens. The preferred embodiment illustrated in FIG. 15C is a projector of a three-panel type. Alternatively, the projector 2601 or 2702 may also be a single-panel type as well. Optionally, the designer may appropriately insert additional optical systems such as optical lenses, films with a polarizing function, films with a phase difference control function and/or IR films into the optical path as pointed by the arrows in FIG. 15C.

Figure 15D:
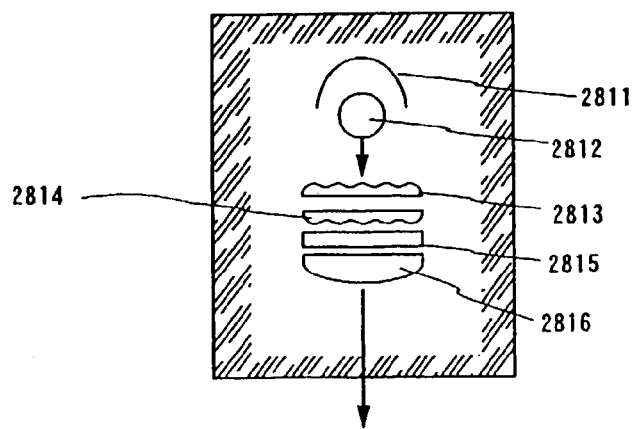
FIG. 15D shows an exemplary internal arrangement for the light source optical system shown in FIG. 15C.

FIG. 15D illustrates an exemplary internal arrangement for the light source optical system 2801 shown in FIG. 15C. In this preferred embodiment, the light source optical system 2801 includes a reflector 2811, a light source 2812, lens arrays 2813 and 2814, a polarization converter 2815 and a condenser lens 2816. However, the present invention is in no way limited to the specific light source optical system shown in FIG. 15D. Optionally, the designer may appropriately insert additional optical systems such as optical lenses, films with a polarizing function, films with a phase difference control function and/or IR films into this light source optical system 2801.

The projectors 2601 and 2702 shown in FIGS. 15A, 15B and 15C include transmissive LCD panels. Alternatively, the projectors 2601 and 2702 may also include reflective LCD panels or display panels of any other type.

As described above, according to the present invention, a crystalline silicon film with excellent crystallinity can be formed with a catalytic element first, and then the catalytic element can be removed from the active region substantially completely through the gettering action. Thus, the abnormal increase in OFF-state leakage current, which is believed to be caused normally by the precipitation of the catalytic element, can be minimized in pixel TFTs as switching elements or in TFTs for a sampling circuit of an analog switch. Consequently, by applying the present invention to these projectors, the projectors can project an image of quality onto the screen uniformly enough. In addition, since the image can be displayed uniformly enough, the light source is controllable more easily and the power dissipation can also be cut down eventually.

Figure 16A:
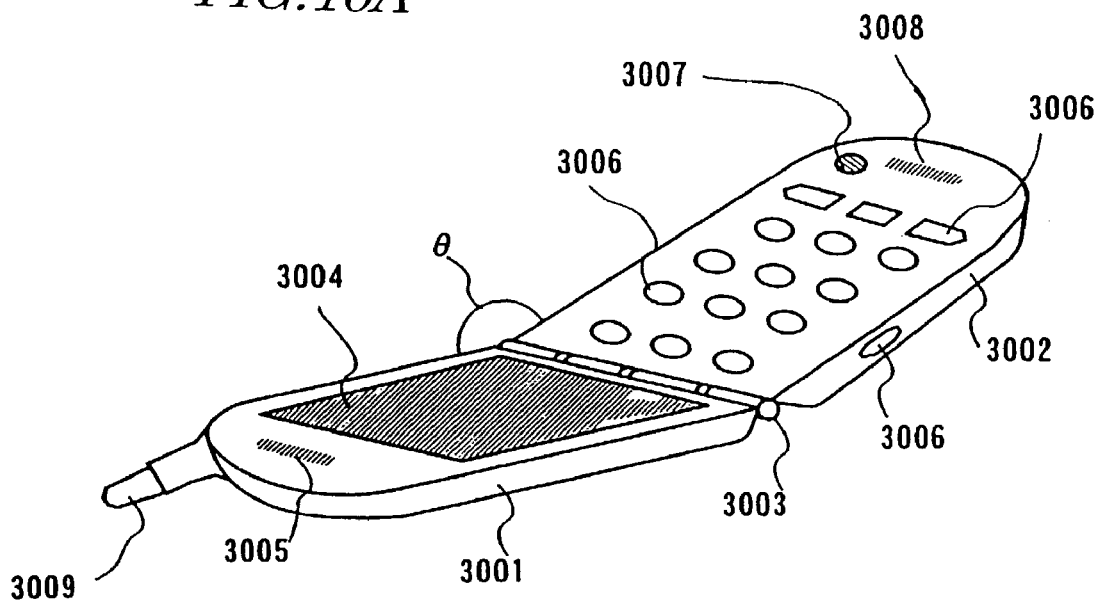
FIGS. 16A through 16C illustrate other electronic appliances in which semiconductor devices according to the present invention can be used effectively.

The electronic appliance shown in FIG. 16A is a cell phone. As shown in FIG. 16A, the cell phone includes a display panel 3001 including semiconductor devices according to the present invention and an operating panel 3002 including various operating keys 3006. The display panel 3001 and the operating panel 3002 are joined together by way of a connecting portion 3003. The angle θ defined between the plane on which the display 3004 of the display panel 3001 is provided and the plane on which the operating keys 3006 of the operating panel 3002 are provided is arbitrarily adjustable by the connecting portion 3003 within a range of approximately 0 degrees to approximately 180 degrees.

This cell phone includes an audio output device 3005, operating keys 3006, a power switch 3007 and an audio input device 3008.

Figure 16B:
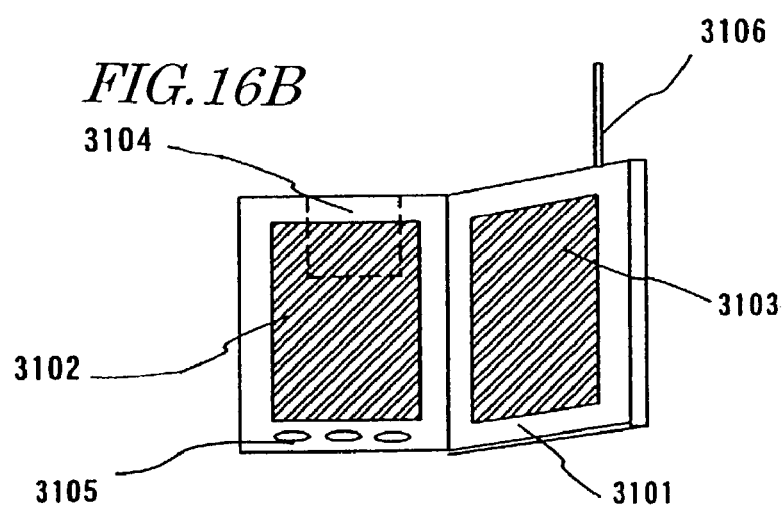

The electronic appliance shown in FIG. 16B is a portable electronic book, which includes a body 3101, displays 3102 and 3103, a storage medium 3104, operating switches 3105 and an antenna 3106.

Figure 16C:
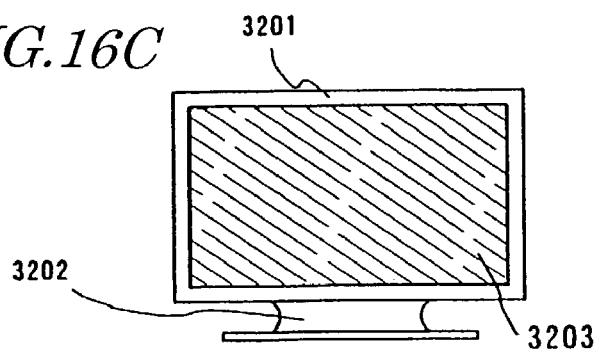

The electronic appliance shown in FIG. 16C is a display panel, which includes a body 3201, a supporting base 3202 and a display 3203.

By applying the present invention to any of these electronic appliances, a CMOS driver circuit, exhibiting highly reliable and stabilized circuit characteristics, can be obtained. This is because the present invention improves the characteristics of the n-channel and p-channel TFTs by upgrading the crystallinity of the crystalline silicon film with the addition of the catalytic element and then by removing the catalytic element sufficiently through the gettering process. In addition, according to the present invention, the abnormal increase in OFF-state leakage current, which is believed to be caused normally by the precipitation of the catalytic element, can be minimized even in pixel TFTs as switching elements or in TFTs for a sampling circuit in an analog switch. As a result, an image of quality can be displayed uniformly in any of these various electronic appliances. Furthermore, when such a quality image can be displayed uniformly, the light source does not have to be operated unnecessarily. Consequently, the power dissipation of these electronic appliances (i.e., cell phones, electronic books and display panels) can be cut down significantly.

As can be seen from these specific examples, the present invention is very broadly applicable for use in almost every electronic appliance.

According to various preferred embodiments of the present invention described above, the concentration of a catalytic element, remaining in the active region of a crystalline silicon film with excellent crystallinity that has been formed with the addition of the catalytic element (e.g., in the channel forming region or in the junctions between the channel forming region and source/drain regions, in particular), can be reduced sufficiently.

In addition, according to the present invention, the catalytic element gettering efficiency of the n-channel TFT can be substantially equalized with that of the p-channel TFT. Thus, the gettering process can be carried out just as intended on both of the n-channel and p-channel TFTs, and a crystalline silicon film of quality can be obtained for both of these two types of TFTs. Also, when TFTs including such a quality semiconductor film are used, the abnormal increase in OFF-state leakage current can be minimized. As a result, a high-performance semiconductor device with highly reliable and stabilized characteristics can be obtained.

Furthermore, the present invention can reduce the number of additional process steps to be performed for gettering purposes, thus simplifying the manufacturing process. As a result, the yield of semiconductor devices can be increased remarkably and the manufacturing cost thereof can be decreased significantly.

Moreover, the present invention provides a semiconductor device, in which high-performance TFTs are densely integrated together, by a simplified manufacturing process.

In particular, where the present invention is applied to a liquid crystal display, pixel TFTs can have their switching characteristics improved in an active-matrix substrate and TFTs for a peripheral driver circuit can have their performance improved and their sizes reduced at the same time. As a result, in a driver-monolithic active-matrix substrate, in which active-matrix circuit components and peripheral drivers are integrated together on the same substrate, the module can have its sizes and manufacturing cost reduced and yet its performance improved significantly.

While the present invention has been described with respect to preferred embodiments thereof, it will be apparent to those skilled in the art that the disclosed invention may be modified in numerous ways and may assume many embodiments other than those specifically described above. Accordingly, it is intended by the appended claims to cover all modifications of the invention that fall within the true spirit and scope of the invention.

What is claimed is:

1. A semiconductor device comprising at least one thin-film transistor, the thin-film transistor including:
   a semiconductor layer, including at least one catalytic element for promoting crystallization, in which a crystalline region, including a channel forming region, a source region and a drain region, is defined;
   a gate electrode for controlling the conductivity of the channel forming region; and
   a gate insulating film, which is provided between the gate electrode and the semiconductor layer, wherein,
   when the thin-film transistor operates, the semiconductor layer includes a gettering region having an amorphous phase outside of the crystalline region thereof adjacent to the source region or the drain region,
   the at least one catalytic element is included in each of the gettering region, the channel forming region, the source region and the drain region,
   a concentration of the at least one catalytic element in the gettering region is higher than the concentration of the at least one catalytic element in each of the channel forming region, the source region and the drain region, individually, and
   the at least one catalytic element is selected from the group consisting of Ni, Co, Sn, Pb, Pd, Fe and Cu.

2. The device of claim 1, wherein the gettering region is partially amorphous.

3. The device of claim 1, wherein the gettering region is substantially completely amorphous.

4. The device of claim 1, wherein the percentage of the gettering region that is amorphous is greater than the percentage of the channel forming region that is amorphous, the percentage of the source region that is amorphous and the percentage of the drain region that is amorphous.

5. The device of claim 1, wherein the semiconductor layer is made of Si, and
   wherein the gettering region has a higher Pa/Pc ratio than the channel forming region, where the Pa/Pc ratio is a ratio of a TO phonon peak Pa of amorphous Si to a TO phonon peak Pc of crystalline Si in a Raman spectrum.

6. The device of claim 5, wherein the gettering region has a higher Pa/Pc ratio than the source region or the drain region.

7. The device of claim 1, wherein the gettering region is not adjacent to the channel forming region.

8. The device of claim 1, wherein the gettering region is located outside of a portion of the semiconductor layer, in which an interconnect, connecting respective thin-film transistors together electrically, contacts with the semiconductor layer.

9. The device of claim 1, wherein the gettering region is located at an outer edge of the semiconductor layer, and
   wherein the contact portion between the interconnect and the semiconductor layer overlaps with a portion of the gettering region and a portion of the crystalline region.

10. The device of claim 1, wherein the gettering region is located at an outer edge of the semiconductor layer, and
    wherein the contact portion between the interconnect and the semiconductor layer overlaps with the crystalline region only.

11. The device of claim 1, wherein multiple thin-film transistors are allocated to the single semiconductor layer and at least two of the thin-film transistors share the source region or the drain region, and
    wherein the gettering region is located adjacent to the source region or the drain region that is shared by the at least two thin-film transistors.

12. The device of claim 1, wherein the gettering regions are provided at the outer edges of the semiconductor layer and between the source regions, between the drain regions or between the source and drain regions, and
    wherein the contact portion between the interconnect and the semiconductor layer overlaps with a portion of one of the gettering regions and a portion of the crystalline region.

13. The device of claim 1, wherein the gettering regions are provided at the outer edges of the semiconductor layer and between the source regions, between the drain regions or between the source and drain regions, and
    wherein the contact portion between the interconnect and the semiconductor layer overlaps with the crystalline region only.

14. A semiconductor device comprising an n-channel thin-film transistor and a p-channel thin-film transistor,
    wherein the n-channel thin-film transistor and the p-channel thin-film transistor each include:
    a semiconductor layer, including at least one catalytic element for promoting crystallization, in which a crystalline region, including a channel forming region, a source region and a drain region, is defined;
    a semiconductor layer, including at least one catalytic element for promoting crystallization, in which a crystalline region, including a channel forming region, a source region and a drain region, is defined;
    a gate electrode for controlling the conductivity of the channel forming region; and
    a gate insulating film, which is provided between the gate electrode and the semiconductor layer, wherein,
    when the thin-film transistor operates, the semiconductor layer includes a gettering region having an amorphous phase outside of the crystalline region thereof adjacent to the source region or the drain region,
    the at least one catalytic element is included in each of the gettering region, the channel forming region, the source region and the drain region,
    a concentration of the at least one catalytic element in the gettering region is higher than the concentration of the at least one catalytic element in each of the channel forming region, the source region and the drain region, individually, and
    the at least one catalytic element is selected from the group consisting of Ni, Go, Sn, Pb, Pd, Fe and Cu.

15. The device of claim 14, wherein the gettering region is partially amorphous.

16. The device of claim 14, wherein the gettering region is substantially completely amorphous.

17. The device of claim 14, wherein the percentage of the gettering region that is amorphous is greater than the percentage of the channel forming region that is amorphous, the percentage of the source region that is amorphous and the percentage of the drain region that is amorphous.

18. The device of claim 14, wherein the semiconductor layer is made of Si, and
wherein the gettering region has a higher Pa/Pc ratio than the channel forming region, where the Pa/Pc ratio is a ratio of a TO phonon peak Pa of amorphous Si to a TO phonon peak Pc of crystalline Si in a Raman spectrum.

19. The device of claim 18, wherein the gettering region has a higher Pa/Pc ratio than the source region or the drain region.

20. The device of claim 14, wherein the ratio S/W of the area S of the gettering region in the n-channel thin-film transistor to the width W of the channel forming region thereof is approximately equal to the ratio S/W of the area S of the gettering region in the p-channel thin-film transistor to the width W of the channel forming region thereof.

21. The device of claim 14, wherein a distance L from a junction between the channel forming region and the source region or the drain region to the gettering region in the n-channel thin-film transistor is approximately equal to a distance L from a junction between the channel forming region and the source region or the drain region to the gettering region in the p-channel thin-film transistor.

22. The device of claim 1 or 14, wherein the gettering region includes an n-type dopant element belonging to Group Vb of the periodic table and a p-type dopant element belonging to Group IIIb of the periodic table.

23. The device of claim 22, wherein the gettering region includes the n-type dopant element at a concentration of about $1 \times 10^{19}/cm^3$ to about $1 \times 10^{21}/cm^3$ and the p-type dopant element at a concentration of about $1.5 \times 10^{19}/cm^3$ to about $3 \times 10^{21}/cm^3$.

24. The device of claim 22, wherein in the gettering region, the concentration of the p-type dopant element is about 1.5 to about 3.0 times as high as that of the n-type dopant element.

25. The device of claim 1 or 14, wherein the gettering region is doped with at least one rare-gas element that is selected from the group consisting of Ar, Kr and Xe.

26. The device of claim 25, wherein the gettering region is doped with the rare-gas element at a dose of about $1 \times 10^{19}/cm^3$ to about $3 \times 10^{21}/cm^3$.

27. The device of claim 1 or 14, wherein the gettering region includes the catalytic element at a dose of at least about $1 \times 10^{19}/cm^3$.

28. The device of claim 1 or 14, wherein the gate electrode is made of at least one material that is selected from the group consisting of W, Ta, Ti and Mo.

29. An electronic appliance comprising the semiconductor device of claim 1.

30. The electronic appliance of claim 29, further comprising a display section that conducts a display operation by using the semiconductor device.

* * * * *

UNITED STATES PATENT AND TRADEMARK OFFICE
CERTIFICATE OF CORRECTION

PATENT NO. : 7,612,375 B2  Page 1 of 1
APPLICATION NO. : 10/421841
DATED : November 3, 2009
INVENTOR(S) : Naoki Makita It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 151 days.

Signed and Sealed this

Nineteenth Day of October, 2010

David J. Kappos
*Director of the United States Patent and Trademark Office*